United States Patent [19]
Kaifu et al.

[11] Patent Number: 6,075,256
[45] Date of Patent: Jun. 13, 2000

[54] PHOTOELECTRIC CONVERTER, ITS DRIVING METHOD, AND SYSTEM INCLUDING THE PHOTOELECTRIC CONVERTER

[75] Inventors: Noriyuki Kaifu, Hachioji; Hidemasa Mizutani, Sagamihara; Shinichi Takeda; Isao Kobayashi, both of Atsugi; Satoshi Itabashi, Chigasaki, all of Japan

[73] Assignee: Canon Kabushiki Kaisha, Tokyo, Japan

[21] Appl. No.: 08/735,819

[22] Filed: Oct. 23, 1996

Related U.S. Application Data

[63] Continuation of application No. 08/362,985, Dec. 23, 1994, abandoned.

[30] Foreign Application Priority Data

| Dec. 16, 1993 | [JP] | Japan | 6-313392 |
|---|---|---|---|
| Dec. 27, 1993 | [JP] | Japan | 5-331690 |
| Aug. 22, 1994 | [JP] | Japan | 6-196640 |
| Aug. 22, 1994 | [JP] | Japan | 6-196641 |
| Aug. 22, 1994 | [JP] | Japan | 6-196642 |
| Aug. 22, 1994 | [JP] | Japan | 6-196643 |
| Aug. 22, 1994 | [JP] | Japan | 6-196644 |
| Aug. 22, 1994 | [JP] | Japan | 6-196645 |
| Aug. 22, 1994 | [JP] | Japan | 6-196648 |
| Aug. 22, 1994 | [JP] | Japan | 6-196670 |

[51] Int. Cl.$^7$ ............... H01L 27/146; H01L 31/119; G01J 1/46
[52] U.S. Cl. ............... 257/53; 257/54; 257/72; 257/449; 257/291; 250/370.09; 250/370.14; 349/41
[58] Field of Search ............... 257/53, 54, 72, 257/449, 430, 292, 291; 250/370.09, 370.14; 349/41

[56] References Cited

U.S. PATENT DOCUMENTS

| 3,598,997 | 8/1971 | Baertsch | 250/370.14 |
|---|---|---|---|
| 4,004,148 | 1/1977 | Howard et al. | 250/370.14 |
| 4,575,638 | 3/1986 | Okmura | 250/578 |
| 4,675,739 | 6/1987 | Catchpole | 250/370.09 |
| 4,835,507 | 5/1989 | Itabashi et al. | 338/17 |
| 4,908,718 | 3/1990 | Shimada | 257/291 |
| 4,922,117 | 5/1990 | Saika et al. | 250/578.1 |
| 4,939,592 | 7/1990 | Saika et al. | 358/482 |
| 4,940,901 | 7/1990 | Henry et al. | 250/370.09 |
| 5,043,785 | 8/1991 | Mitzutani et al. | 357/30 |
| 5,225,706 | 7/1993 | Berger et al. | 257/53 |
| 5,491,339 | 2/1996 | Mitsui et al. | 250/370.14 |
| 5,780,872 | 7/1998 | Misawa | 257/72 |

FOREIGN PATENT DOCUMENTS 0296603 12/1988 European Pat. Off. .

OTHER PUBLICATIONS

"Extended Abstracts of the 15th Conference on Solid State Devices and Materials", Tokyo, Japan, Aug. 30–Sep. 1, 1983, ISBN 4–930813–04–2, 1983, Tokyo, Japan, Japan Soc. Appl. Phys, Japan, pp. 201–204, XP002039214.

Patent Abstracts of Japan, vol. 013, No. 428 (P–936), Sep. 25, 1989 & JP 01 161251 A (Fujitsu Ltd), Jun. 23, 1989.

*Primary Examiner*—Jerome Jackson, Jr.
*Attorney, Agent, or Firm*—Fitzpatrick, Cella, Harper & Scinto

[57] ABSTRACT

A photoelectric converter of a high signal-to-noise ratio, low cost, high productivity and stable characteristics and a system including the above photoelectric converter. The photoelectric converter includes a photoelectric converting portion in which a first electrode layer, an insulating layer for inhibiting carriers from transferring, a photoelectric converting semiconductor layer of a non-single-crystal type, an injection blocking layer for inhibiting a first type of carriers from being injected into the semiconductor layer and a second electrode layer are laminated in this order on an insulating substrate.

29 Claims, 46 Drawing Sheets

$V_{rG} \geq V_D - V_{FB}$ $V_{rG} < V_D - V_{FB}$ $V_{rG} \geqq V_D - V_{FB}$ $$V_{rG} < V_D - V_{FB}$$

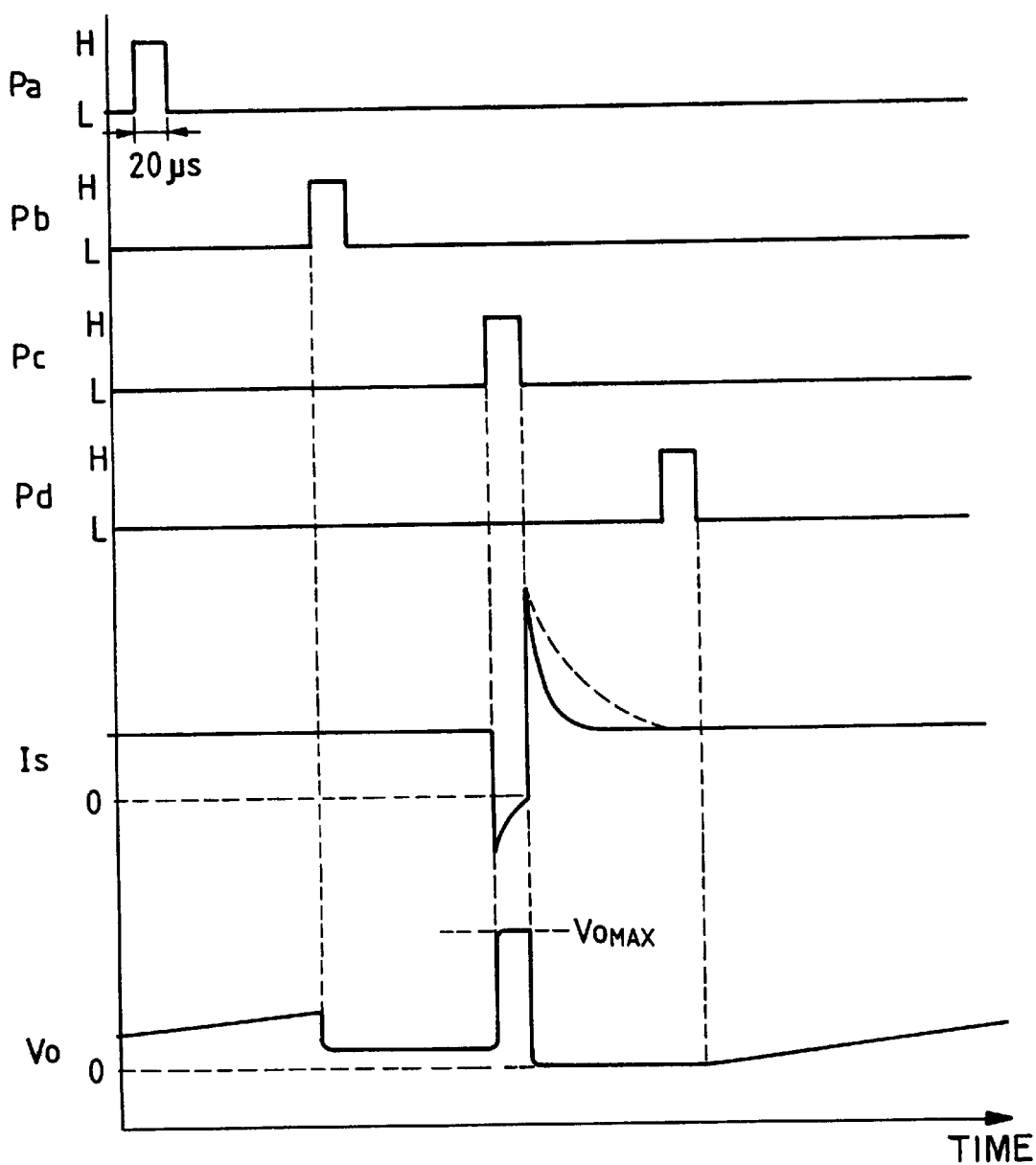

PHOTOELECTRIC CONVERTER, ITS DRIVING METHOD, AND SYSTEM INCLUDING THE PHOTOELECTRIC CONVERTER

This application is a continuation-in-part of application Ser. No. 08/362,985, filed Dec. 23, 1994, now abandoned.

BACKGROUND OF THE INVENTION

1. Field of the Invention

The present invention relates to a photoelectric converter, its driving method, and a system including the photoelectric converter. More particularly, the present invention relates to a one-dimensional or two-dimensional photoelectric converter, its driving method, and a system including the photoelectric converter which can read the same size of original documents such as those from, for example, a facsimile, a digital copying machine, or an X-ray camera.

2. Related Background Art

Conventionally, a read system having a condensed optical system and a CCD-type sensor has been used as a read system such as a facsimile, a digital copying machine, or an X-ray camera. In recent years, however, a development of photoelectric converting semiconductor materials represented by hydrogenated amorphous-silicon (hereinafter "a-Si") has contributed to an advancement of developing so-called a con act-type sensor in which a photoelectric converting element and a signal processor are formed on a large-sized substrate to read the same size of copies as for an information source by using a photoelectric system, and it has been or is being put to practical use. Particularly, a-Si can be used not only as photoelectric converting material, but also as semiconductor material for thin film electric field effect type transistor (hereinafter "TFT"), therefore, photoelectric converting semiconductor layer and a TFT semiconductor layer can be formed conveniently.

FIGS. 1A and 1B are typical sectional views each of which is used to show an example of a structure of a conventional optical sensor, in other words, an example of a layer structure of the optical sensor, and FIG. 1C is a schematic circuit diagram used to describe a driving method, which shows an example of a typical driving method available for both FIGS. 1A and 1B. Each of FIGS. 1A and 1B shows a photodiode type optical sensor; the structure in FIG. 1A is called a PIN type, and that in FIG. 1B is called a Schottky type. In FIGS. 1A and 1B, reference numerals 1, 2, 3, 4, and 5 indicate an insulating substrate, a lower electrode, a p type semiconductor layer (hereinafter "p-layer"), an intrinsic semiconductor (hereinafter "i-layer"), an n type semiconductor (hereinafter "n-layer"), and a transparent electrode, respectively. In the Schottky type structure in FIG. 1B, materials for the lower electrode 2 are appropriately selected to form a Schottky barrier layer so that unnecessary electrons will not be injected from the lower electrode 2 to the i-layer 4.

In FIG. 1C, reference numerals 10, 11, and 12 indicate the symbolized above optical sensor, a power supply, and a detector of a current amplifier or the like, respectively. In the optical sensor 10, a direction shown by C indicates a side of the transparent electrode 6 in FIGS. 1A and 1B, a direction shown by A indicates a side of the lower electrode 2, and the power supply 11 is set so that a positive voltage is applied to side C across side A. Now, the operation is roughly described below.

As shown in FIGS. 1A and 1B, light is incident from a direction shown by an arrow. When the light reaches the i-layer 4, it is absorbed and electrons and holes are generated. Since an electric field is applied to the i-layer 4 by the power supply 11, the electrons move to the side C, in other words, they move to the transparent electrode 6 after passing through the n-layer 5, and the holes move to the side A, in other words, to the lower electrode 2. Accordingly, optical current is fed to the optical sensor 10. If light is not incident on the layer, electrons and holes are not generated on the i-layer 4; for the holes in the transparent electrode 6, the n-layer 5 acts as a hole injection blocking layer, and for electrons in the lower electrode 2, the p-layer 3 in the PIN type structure in FIG. 1A or the Schottky barrier layer in the Schottky type structure in FIG. 1B acts as an electron injection blocking layer, therefore, both the electrons an d holes cannot move and no current is applied. As described above, the presence or absence of the incident light varies the current fed to a circuit. If the change is detected by the detector 12 in FIG. 1C, the layers act as an optical sensor.

For the above conventional optical sensor, however, it is difficult to produce a high signal-to-noise ratio and low cost photoelectric converter. The reasons are described below.

The first reason is that the injection blocking layer is required at two portions both in the PIN type structure in FIG. 1A and the Schottky type structure in FIG. 1B.

In the PIN type structure in FIG. 1A, the n-layer 5 which is an injection blocking layer requires not only introducing electrons to the transparent electrode 6 and but also inhibiting holes from being injected to the i-layer 4. If the layer loses one of those characteristics, the optical current may decrease or increase due to current generated without incident light (hereinafter "dark current"), which leads to lowering the signal-to-noise ratio. The dark current itself can be considered as a noise and also includes fluctuation called a shot noise, in other words, quantization noise, therefore, the quantization noise in the dark current cannot be reduced even if the dark current is removed by the detector 12.

Generally, to improve those characteristics, it is required to optimize conditions of creating films for the i-layer 4 and n-layer 5 and conditions of annealing after the creation. Also for the p-layer 3 which is another injection blocking layer, however, the equivalent characteristics are required even though electrons and holes are reversed, and the both conditions must be optimized in the same manner. In general, the optimizing conditions for the former n-layer are not the same as for the p-layer, and it is hard to satisfy both conditions simultaneously.

In other words, if the injection blocking layer is required at two portions in the same optical sensor, it is difficult to form an optical sensor having high signal-to-noise ratio.

This can also be said about the Schottky type structure shown in FIG. 1B. Additionally, in the Schottky type structure in FIG. 1B, a Schottky barrier layer is used for one injection blocking layer, in which a difference between work functions of the lower electrode 2 and the i-layer 4 is used, therefore, materials for the lower electrode 2 are restricted or the characteristics are largely affected by localized levels of an interface and it is even more difficult to satisfy the conditions.

It is also reported that approximately 100 Å of a thin silicon or a metal oxide or nitride film is formed between the lower electrode 2 and the i-layer 4 to further improve the characteristics of the Schottky barrier layer. In this method, however, holes are introduced to the lower electrode 2 by using a tunneling effect to enhance an effect of inhibiting electrons from being injected to the i-layer 4 and a difference between work functions is also used, therefore, materials for the lower electrode 2 must be restricted. In addition, since it uses contrary characteristics, i.e., blocking injection of the electrons and movement of the holes caused by the tunneling effect, the oxide or nitride film must be extremely thin, i.e., approximately 100 Å. The control of the thickness and layer features is difficult and reduces productivity.

Further, the requirement of two portions of the injection blocking layer not only reduces productivity, but also increases cost. This is because desired characteristics for an optical sensor cannot be obtained if a problem is caused by dust even at a single portion of the injection blocking layer, since the injection blocking layer is important as its characteristics.

By using FIG. 2, the second reason is described below. FIG. 2 shows a layer structure of an electric field effect type transistor (TFT) formed by thin semiconductor films. The TFT is sometimes used as a part of a control section to form a photoelectric converter. In this drawing, the same parts as for FIGS. 1A to 1C are designated by corresponding reference numerals. In FIG. 2, reference numerals 7 and 60 indicate a gate insulating film and an upper electrode, respectively. How to form them is described in order. A lower electrode 2 acting as a gate electrode (G), a gate insulating film 7, an i-layer 4, an n-layer 5, and upper electrodes 60 acting as source and drain electrodes (S, D) are laid on an insulating substrate 1 in this order, and an etching process is made for the upper electrodes 60 to form the source and drain electrodes, then for the n-layer 5 to form a channel section. The TFT has characteristics of being sensitive to a state of the interface of the gate insulating film 7 and the i-layer 4, and generally they are laid repeatedly in the same vacuum to inhibit them from being contaminated.

When the conventional optical sensor is formed on the same substrate as for the TFT, this layer structure has a problem, which may increase cost or reduce its characteristics. This is because the conventional optical sensor shown in FIGS. 1A to 1C has a structure of an electrode, a p-layer, an i-layer, an n-layer, and an electrode in the PIN type structure in FIG. 1A and an electrode, an i-layer, an n-layer, and an electrode in the Schottky type structure in FIG. 1B, while the TFT has a structure of an electrode, an insulating film, an i-layer, an n-layer, and an electrode. Therefore, their layer structures are not identical. It indicates that the optical sensor and the TFT cannot be formed by the same process at a time, and a complicated process may lower a yielding ratio or increase cost due to repetition of a photolitho process since a required layer is formed at a required place. In addition, to make the i-layer and the n-layer identical in both structures, an etching process for the gate insulating film 7 and the p-layer 3 is required, which may cause a problem that in the same vacuum it is impossible to accumulate the injection blocking layers, the p-layer 3 and the i-layer 4 which are important for the optical sensor as described in the above or that the interface of the important gate insulating film 7 and i-layer 4 of the TFT is contaminated by the etching process for the gate insulating film which may leads to deteriorating the characteristics or lowering signal-to-noise ratio.

Although the order of the layer structure is identical for the above sensor in which an oxide or nitride film is laid between the lower electrode 2 and the i-layer 4 to improve the characteristics of the Schottky type structure in FIG. 1B, the oxide film and the nitride film must have a thickness of approximately 100 Å as described above, and it is difficult that they are used with the gate insulating film. FIG. 3 shows a result of our experiment on the gate insulating film and the TFT yielding ratio. The yielding ratio is rapidly reduced in the range of 1,000 Å or less of the thickness of the gate insulating film; the yielding ratio is approximately 30% at 800 Å, approximately 0% at 500Å, and at 250 Å, the TFT operation could not be even confirmed. Accordingly, it is apparently difficult to use the oxide film or the nitride film of the optical sensor for which the tunneling effect is used and the gate insulating film of the TFT which requires insulation from electrons and holes together, as shown by this data.

Furthermore, it is difficult to create a capacitance element (hereinafter "capacitor"), which is an element (not shown) needed for obtaining integrated values of electric charge or current, having good characteristics of a small quantity of leakage in the same structure as for the conventional optical sensor. It is because the capacitor is used for accumulating electric charges between two electrodes, therefore, it always requires a layer for blocking movement of electrons and holes in the middle layer between electrodes, while in the conventional optical sensor only a semiconductor layer is used between the electrodes, therefore, it is hard to obtain a middle layer having good characteristics with a small quantity of thermal leak.

The poor matching between the TFT and the capacitor, which are important elements to form the photoelectric converter in processes or as characteristics, requires one-dimensional or two-dimensional arrangement of multiple optical sensors. This leads to increased and complicated processes in composing an entire system which detects its optical signals sequentially and therefore to extremely low yielding ratio. Accordingly, it may be a serious problem to create a high-performance and multifunctional device at low cost.

SUMMARY OF THE INVENTION

It is an object of the present invention to provide a photoelectric converter having a high signal-to-noise ratio and stable characteristics, its driving method, and a system including the photoelectric converter.

It is another object of the present invention to provide a photoelectric converter having a high yielding ratio and high productivity and a system including the converter.

It is another object of the present invention to provide a photoelectric converter which can be composed in the same process as for the TFT, will not complicate production processes, and can be produced at low cost, its driving method, and a system including the converter.

It is still another object of the present invention to provide a photoelectric converter having a photoelectric converting section including a first electrode layer, an insulating layer for inhibiting both types of carriers, a first type of carriers and a second type of carriers having positive or negative characteristics opposite to those of the first type of carriers, from passing through the layer, a photoelectric converting semiconductor layer, an injection blocking layer for inhibiting the first type of carriers from being injected to the semiconductor layer, and a second electrode layer on an insulating substrate.

It is another object of the present invention to provide a system having a plurality of photoelectric converting sections including a first electrode layer and a second electrode layer, an insulating layer set between the first and second electrodes for inhibiting a first type of carriers and a second type of carriers not identical with the carriers from passing through the layer, a semiconductor layer, and an injection blocking layer for inhibiting the first type of carriers from being injected to the semiconductor layer on a substrate, and a signal processing means for processing signals from the photoelectric converting sections.

It is another object of the present invention to provide a method for driving a photoelectric converting section having a first electrode layer, an insulating layer for inhibiting both types of carriers, a first type of carriers and a second type of carriers whose positive or negative characteristics are opposite to those of the first type of carriers, from passing through the layer, a semiconductor layer, a second electrode layer set through an injection blocking layer for inhibiting the first type of carriers from being injected into the semiconductor layer, the driving method having a refresh mode and a photoelectric conversion mode, wherein an electric field is applied so that the first type of carriers are introduced from the semiconductor layer to the second electrode layer in the refresh mode and an electric field is applied in a direction so that the second type of carriers are introduced to the second electrode layer due to light incident on the semiconductor in the photoelectric conversion mode.

BRIEF DESCRIPTION OF THE DRAWINGS

FIGS. 6, 18, 21, 25, 29, 34, 38, 40, and 43 are timing diagrams for describing sample operations of the photoelectric converter of the present invention;

DETAILED DESCRIPTION OF THE PREFERRED EMBODIMENTS

This invention will be described below, if necessary, by using the accompanying drawings.

[First embodiment]

Figure 4A:
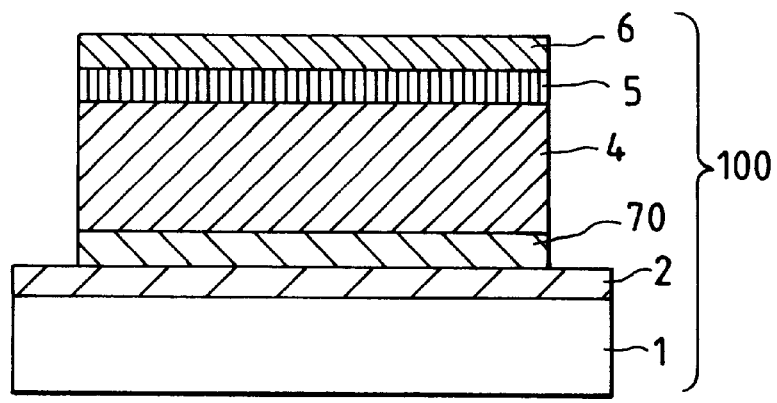
FIG. 4A is a typical sectional view for describing an example of a structure of a photoelectric converting section of the present invention.
Figure 4B:
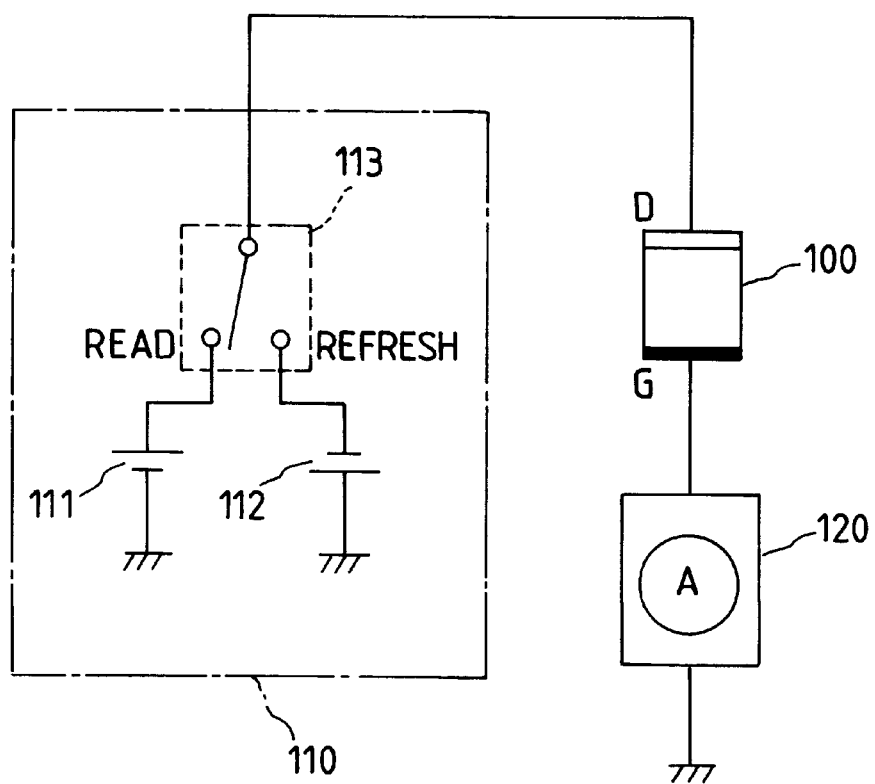
FIG. 4B is its schematic circuit diagram.

FIGS. 4A and 4B are a typical layer structure diagram for describing an optical converting section of a photoelectric converter of the first embodiment of the present invention and a schematic circuit diagram of the photoelectric converter, respectively.

Referring to FIG. 4A, an insulating substrate 1 is formed by glass or the like and a lower electrode 2 is formed by Al or Cr. An insulating layer 70 is formed by silicon nitride (SiN) for inhibiting both electrons and holes from passing through the layer, having a thickness of 500 Åor greater at which electrons and holes cannot passing through the layer due to a tunneling effect. A photoelectric converting semiconductor layer 4 is formed by an intrinsic semiconductor i-layer of hydrogenated amorphous-silicon (a-Si:H), an injection blocking layer 5 is formed by an n+ layer for inhibiting holes from a transparent electrode 6 side from being injected into the photoelectric converting semiconductor layer, and a transparent electrode 6 is composed of chemical compounds including indium or tin and oxide such as ITO.

Referring to FIG. 4B, there is indicated at 100 a symbolized photoelectric converting section shown in FIG. 4A, and D indicates an electrode on the transparent electrode 6 side and G indicates an electrode on a lower electrode 2 side. Numeral 120 is a detecting section and numeral 110 is a power supply section comprising a switch 113 for switching between a positive power supply 111 for applying a positive electric potential to the electrode D and a negative power supply 112 for applying negative electric potential. The switch 113 is controlled to be connected to a refresh side in a refresh mode and to a read side in a photoelectric conversion mode.

Figure 5A:
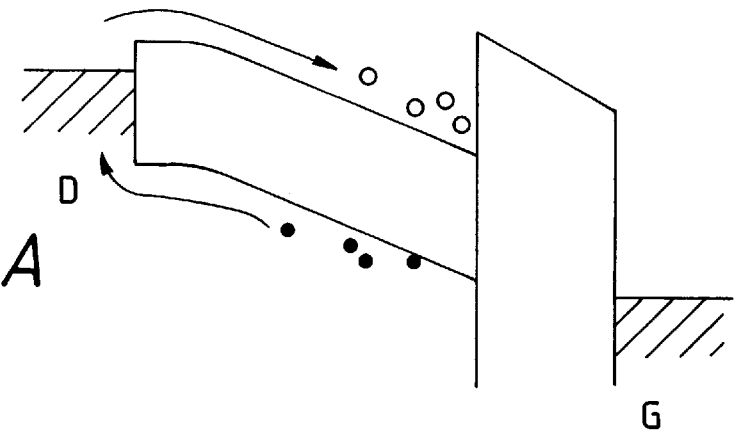
FIGS. 5A to 5C, 26A to 26C, 27A to 27C and 30A to 30C are energy band diagrams for describing energy states of the photoelectric converting section.
Figure 5B:
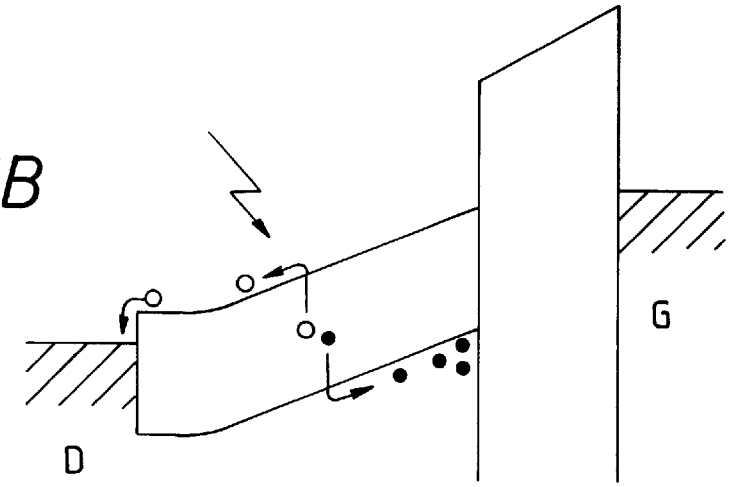

Turning now to an operation of the photoelectric converting section 100 used in this embodiment, FIGS. 5A and 5B illustrate energy band diagrams of the photoelectric converting section which show operations in the refresh mode and the photoelectric conversion mode of this embodiment, expressing states of layers of the photoelectric converting section in the thickness direction.

In the refresh mode (a), the electrode D has a potential negative to the electrode G, therefore, holes represented by black dots in an i-layer 4 are introduced to the electrode D by an electric field, while electrons represented by circles are injected into the i-layer 4. At this instant, a part of holes and electrons are recombined in an n-layer 5 and the i-layer 4, then disappear. If this state continues for a extremely long time, the holes in the i-layer 4 are ejected from the layer (FIG. 5A).

If the photoelectric conversion mode (b) is started in this state, the electrode D has a potential positive to the electrode G, therefore, electrons in the i-layer 4 are introduced to the electrode D momentarily. The holes, however, are not introduced to the i-layer 4 since the n-layer 5 acts as an injection blocking layer. If light impinges on the i-layer 4 in this state, the light is absorbed and electron-hole pairs are generated. The electrons are introduced to the electrode D by the electric field, and the holes move in the i-layer 4 to reach an interface of the insulating layer 70. The holes, however, cannot move to inside of the insulating layer 70, and remain in the i-layer 4. At this time, the electrons moves to the electrode D and the holes to the interface of the insulating layer 70 in the i-layer 4, therefore, current flows from the electrode G to the detecting section 120 to keep electric neutral in the elements. Since the current corresponds to the electron-hole pairs generated by the light, it is proportional to the incident light (FIG. 5B).

If the refresh mode (a) is started again after a certain period of time for the photoelectric conversion mode (b), the holes remaining in the i-layer 4 are introduced to the electrode D as mentioned above, and electric charges corresponding to the holes flow to the detecting section 120. The quantity of the holes corresponds to a total quantity of light incident during the photoelectric conversion mode, and the quantity of the charges flowing to the detecting section 120 corresponds to the total quantity of the light. Although charges corresponding to a quantity of electrons injected into the i-layer 4 also flow at this time, the quantity is approximately fixed and the required charges can be detected by subtracting the quantity from the total quantity of the charges.

In other words, the photoelectric converting section 100 of this embodiment can output a quantity of real time incident light and also a total quantity of light impinging during a certain period. It is an important feature of this embodiment. The detecting section 120 can detect either or both of them depending on its purposes.

Now, referring to FIG. 6, operations of this embodiment are described below.

Figure 6:
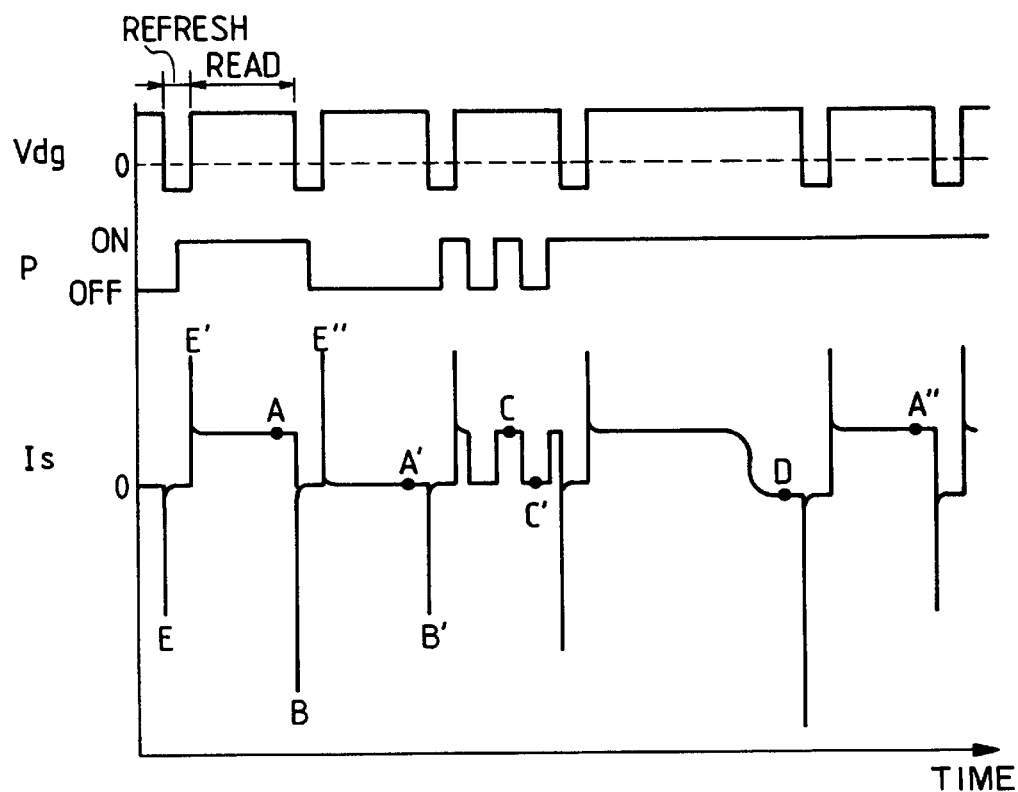

FIG. 6 is a timing diagram of operations of the photoelectric converter shown in FIGS. 4A and 4B. In this drawing, $V_{dg}$ is an electric potential of the electrode D to the electrode G of the photoelectric converting section 100, and P is a light incoming state, where ON indicates a state that light is incident and OFF indicates a state that no light is incident, in other words, a dark state. $I_s$ indicates a current flowing into the detecting section 120, and the horizontal direction represents an elapse of time.

First, when the switch 113 is connected in the refresh direction, the refresh mode is started, $V_{dg}$ becomes a negative voltage, holes are ejected as shown in FIG. 5A, and negative inrush current E denoted by E in FIG. 6 flows into the detecting section 120 while electrons are injected into the i-layer 4. Afterward, when the refresh mode is completed and the switch 113 is connected in the read direction, electrons in the i layer 4 are ejected and positive inrush current E' flows to start the photoelectric conversion mode. If light is incident at this moment, optical current A denoted by A flows. For a dark state in the same operation, the current does not flow as shown by A'. Accordingly, if the optical current A is integrated directly or for a certain period, the light incidence can be detected.

When the switch 113 is connected in the refresh direction from the A state, inrush current B flows. The quantity of the current is reflected by a total quantity of incident light during the previous photoelectric conversion mode period, and it can be detected by integrating the inrush current B or by obtaining its equivalent value. If light is not incident in the previous photoelectric conversion mode, the inrush current becomes lower as shown by B', and the light incidence can be detected by detecting its difference. Otherwise, since the above mentioned inrush current E' or E'' is approximately equal to the inrush current B', they can be subtracted from the inrush current B.

If the light incident state is changed, $I_s$ changes as shown by C and C' even during the same photoelectric conversion mode period. The light incident state can be also detected by detecting the change. In other words, it means that it does not need to set the refresh mode at every detecting time.

However, if the photoelectric conversion mode period is extended or the illumination of incident light is intensive for some reason, current sometimes does not flow even if light is incident as shown by D. This is because a lot of holes remain in the i-layer 4, the electric field in the i-layer 4 becomes smaller due to these holes, and generated electrons are not introduced to the electrode D and then the electrons are recombined with the holes in the i-layer 4. Although current may flow unstably if the light incident state changes in this state, a restart of the refresh mode ejects the holes in the i-layer 4 and current equal to A can be obtained as shown by A" in the subsequent photoelectric conversion mode.

Although the incident light is assumed to be fixed in the above explanation, it should be understood that the current indicated by A, B, and C changes continuously depending on intensity of incident light and that the intensity can also be detected quantitatively as well as the absence or presence of the incident light.

Figure 5C:
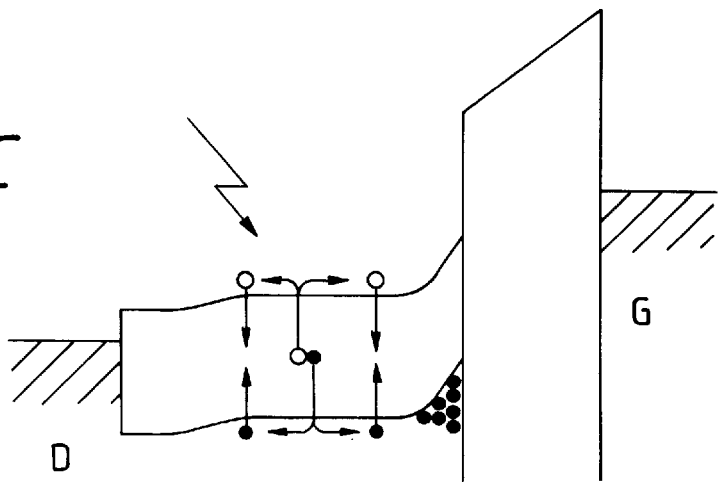

In the above description, although it is desirable to eject all of the holes when the holes in the i-layer 4 are ejected in the refresh mode, there is no problem because ejecting a part of the holes is also effective and the same value can be obtained as for ejecting all the holes at the optical current A or C. If holes are ejected so that a fixed quantity of holes always remain, a quantity of light can be also quantitatively detected by the current B. In other words, it should be avoided only to be a state indicated by the current value D at detection in the subsequent photoelectric conversion mode, that is, a state illustrated by FIG. 5C, and it is required only to determine characteristics of a $V_{dg}$ voltage in the refresh mode, a period of the refresh mode, and the injection blocking layer of the n-layer 5.

Further in the refresh mode, the injection of electrons into the i-layer 4 is not a requirement and the $V_{dg}$ voltage is not limited to negative. It is only required that a part of the holes are ejected from the i-layer 4. It is because the electric field in the i-layer 4 is applied in a direction that holes are introduced to the electrode D even if the $V_{dg}$ voltage is positive when a lot of holes remain in the i-layer 4, Also for characteristics of the injection blocking layer of the n-layer 5, it is not a requirement that electrons can be injected into the i-layer 4.

Referring to FIGS. 7A, 7B, 7C, and 7D, there are shown examples of a configuration of the detecting section. Reference numerals 121, 122, 123, 124, 125, and 126 indicate a current meter represented by current Amp, a voltmeter, a resistor, a capacitor, a switching element, and an operational amplifier, respectively.

Figure 7A:
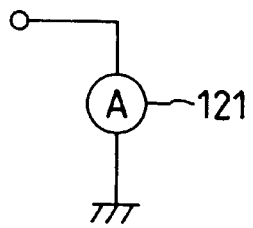
FIGS. 7A to 7D are schematic circuit diagrams for describing sample structures of a detecting section.
Figure 7B:
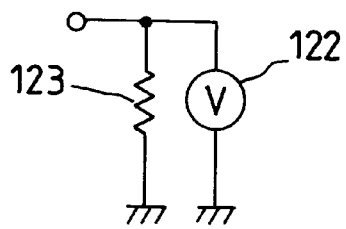
Figure 7C:
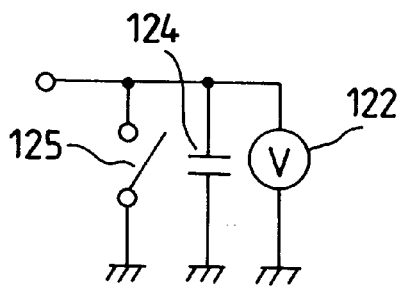
Figure 7D:
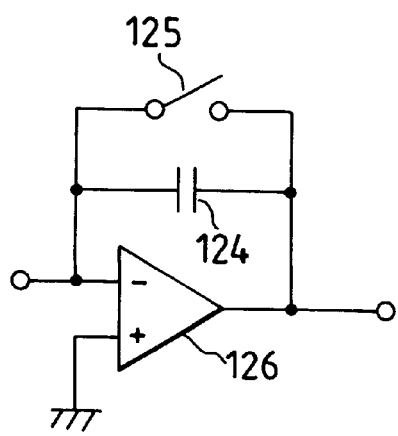

FIG. 7A illustrates a configuration for detecting current directly, and output from the current meter 121 is voltage or amplified current. In FIG. 7B, current is carried to the resistor 123 and the voltage is detect by the voltmeter 122. In FIG. 7C, electric charge is stored in the capacitor 124 and the voltage is detected by the voltmeter 122. In FIG. 7D, an integrated value of current is detected as voltage by the operational amplifier 126. In FIGS. 7C and 7D, the switching element 125 has a function of giving an initial value at every detection and it can be replaced by a resistor of high resistance according to a detecting method.

The current meter or the voltmeter comprises a transistor, an operational amplifier composed of transistors, a resistor, and a capacitor, and it is possible to use them operating at a high speed. The detecting section is not limited to these four types, and it is only required that it can detect current or electric charges directly or their integrated values. It is also possible to have a configuration so that a plurality of photoelectric converting sections output values simultaneously or sequentially by combining a detector for detecting current or voltage values, a resistor, a capacitor, and a switching element.

If a line sensor or an area sensor is formed, they control and detect potential of the photoelectric converting section at 1,000 or more points in a matrix, being combined with lines in the power supply section or switching elements. If so, it is advantageous in aspects of a signal-to-noise ratio and cost to form the switching elements, a capacitor, and a part of resistors on the same substrate as for the photoelectric converting section. At this point, the photoelectric converting section of this embodiment has the same layer structure as for a TFT which is a typical switching element, therefore, they can be formed in an identical process at a time, and it is possible to provide a low cost and high signal-to-noise ratio photoelectric converter.

[Second embodiment]

Figure 1A:
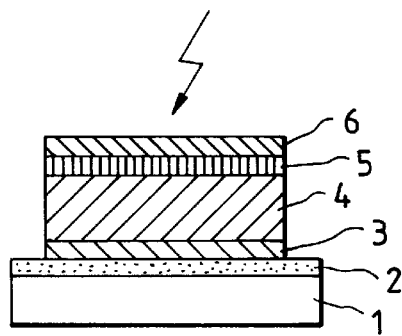
FIGS. 1A to 1C are typical sectional views for describing examples a structure of an optical sensor.
Figure 1B:
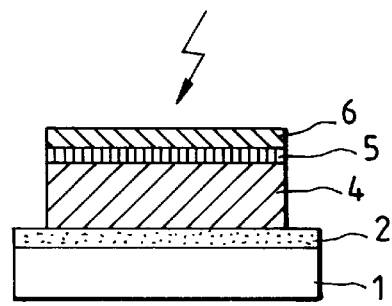
Figure 1C:
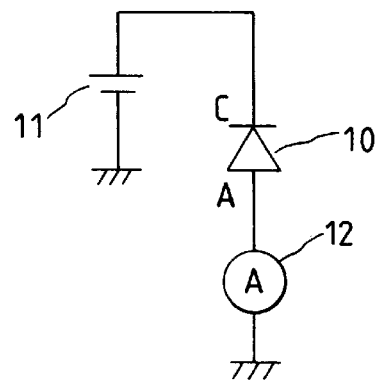
Figure 2:
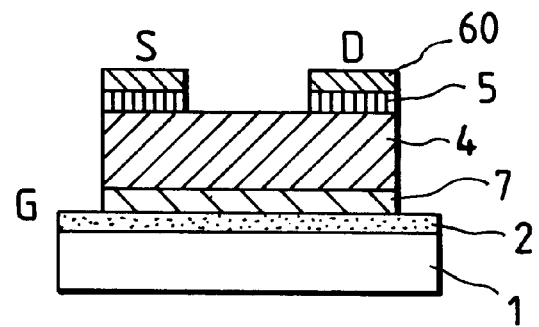
FIG. 2 is a typical sectional view for describing an example of a TFT structure.
Figure 3:
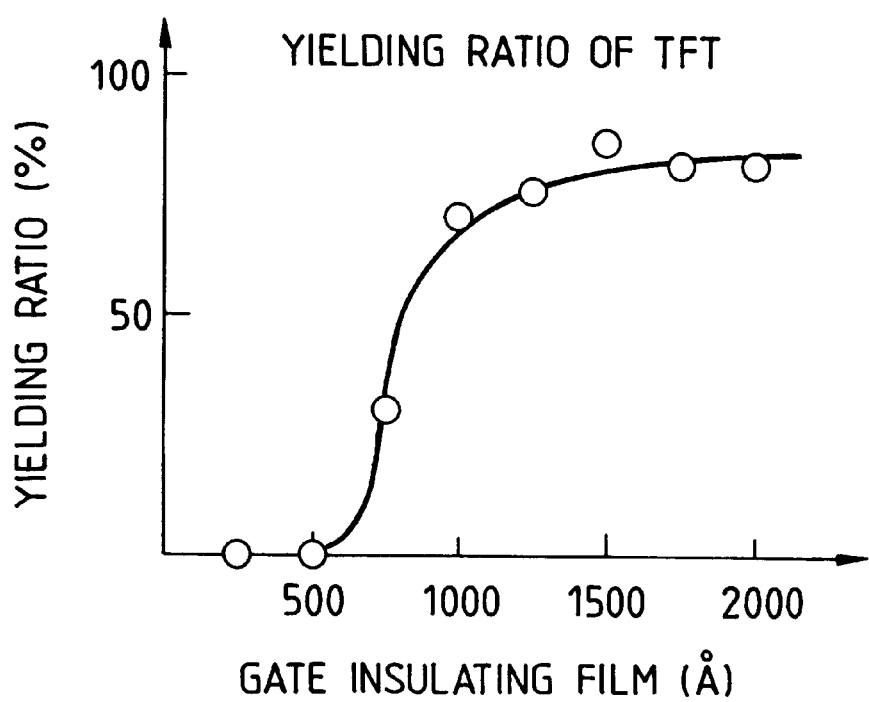
FIG. 3 is a drawing for describing an example of a relationship between the thickness of a gate insulating film and a yielding ratio of the TFT.
Figure 8:
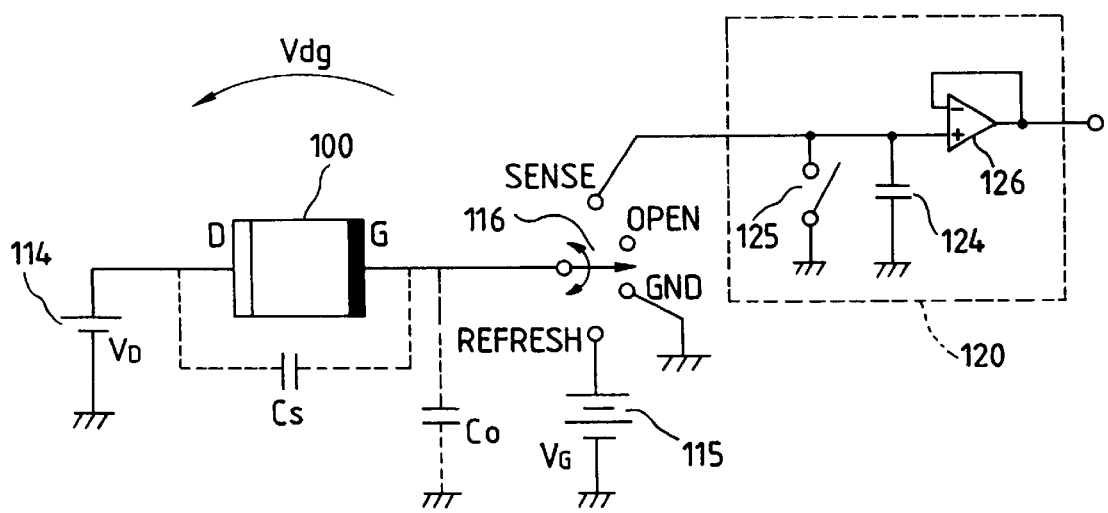
FIGS. 8, 12, 14, 16, 19, 24, 28, 31, 33, 35, 39, 41, 42, 44, 47, and 50 are schematic circuit diagrams for describing the photoelectric converter of the invention.

FIG. 8 is a circuit diagram illustrating a second embodiment of the photoelectric converter of this invention. The same reference numerals designate the same parts as for the drawings mentioned above. The layer structure of the photoelectric converting section 100 is the same as for FIG. 3A. A power supply 114 applies positive potential to an electrode D, a power supply 115 applies positive potential to an electrode G in the refresh mode of the photoelectric converting section, and a switching element 116 performs a switching operation between modes. The power supply 115 is set to a voltage equivalent to that of the power supply 114 or a higher voltage.

In this embodiment, there are provided four modes; (1) a photoelectric converting section refresh mode, (2) a G electrode initialization mode, (3) a storage mode, and (4) a detection mode. An electric field in the photoelectric converting section refresh mode (1) is applied on each layer of the photoelectric converting section 100 in the same direction as for the refresh mode of the above embodiment, and a field each in the G electrode initialization mode (2), the storage mode (3), and the detection mode (4) is applied in the same direction as for the photoelectric conversion mode of the above embodiment, therefore, the operation of the photoelectric converting section 100 is primarily identical. These modes are sequentially described below.

In the photoelectric converting section refresh mode (1), the switching mode 116 is connected to a position denoted by "refresh" in this drawing and positive potential is applied to the electrode G by the power supply 115. Positive potential is applied to the electrode D by the power supply 114, in other words, an approximate zero or negative voltage is applied to potential $V_{dg}$ of the electrode D corresponding to the potential of the electrode G. Then, the holes in the photoelectric converting section 100 are ejected for refreshment.

After that, the switching element 116 is connected to a position denoted by "GND" to shift to the G electrode initialization mode (2) and the GND potential is applied to the electrode G. At this instant, the $V_{dg}$ has a positive voltage, and inrush current flows into the photoelectric converting section 100 before it enters the photoelectric conversion mode.

Next, the switching element 116 is connected to a position denoted by "open" to shift to the storage mode (3) and the electrode G is opened for direct current. Practically, however, the potential is kept by equivalent capacitive component $C_s$ or stray capacitance $C_o$ of the photoelectric converting section 100 indicated by dashed lines. If light is incident on the photoelectric converting section 100, the corresponding current flows out from the electrode G and the potential of the electrode G increases. In other words, the light incident information is stored in the $C_s$ and $C_0$ as electric charges. When the switching element 116 is connected to a position denoted by "sense" after a certain period of time for the storage, it shifts to the detection mode (4) and the potential of the electrode G is returned to the GND potential. Simultaneously, the electric charges stored in the $C_s$ and $C_o$ flow to the detecting section 120, and the quantity of them is equal to an integrated value of current flowing from the photoelectric converting section 100 in the storage mode, that is, it is detected as a total quantity of incident light.

Further, the switching element 116 is connected to a position denoted by "refresh" again to repeat the operations.

As mentioned above, this embodiment has characteristics that an integrated value of current flowing during a certain long period of time for storage can be obtained in a short time in the detection mode by using a combination of simple elements, and it means that this embodiment is effective to produce a high signal-to-noise ratio photoelectric converter including a plurality of photoelectric converting sections at low cost.

The operation of the photoelectric converting sections of this embodiment is primarily the same as for that of the first embodiment, except that the potential of the electrode G goes up in the photoelectric conversion mode and $V_{dg}$ is lowered. It indicates that the state in FIG. 5C can be easily made by a small quantity of incident light, which may lead to a restriction on incident light volume in a normal operation. This, however, can be easily solved by inserting a large capacitor for storage in parallel to the stray capacitance $C_o$ consciously.

The detecting section 120, which comprises a capacitor 124, a switching element 125, and an operational amplifier 126, accumulates electric charges injected into the detection mode in the capacitor 124, converts them to voltage, and outputs it through a buffer amplifier. Accordingly, the electrode G does not have a complete GND potential in the detection mode, but it does not affect the basic operations. The capacitor 124 is initialized by the switching element 125 in other modes. The switching element 116 need not be multipolar, for example, it can be composed of three switching elements such as TFTs.

[Third embodiment]

Figure 9A:
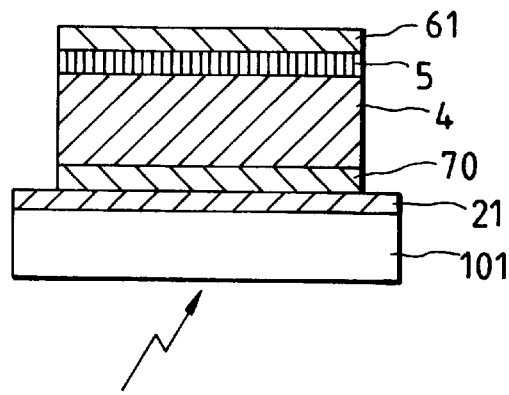
FIGS. 9A to 9C are typical sectional views for describing sample photoelectric converting sections of the present invention.
Figure 9B:
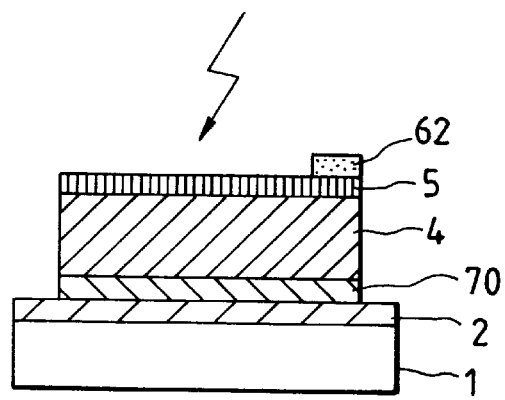
Figure 9C:
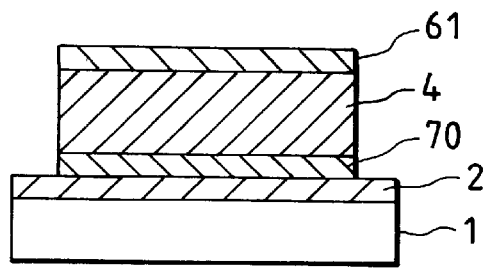

FIGS. 9A, 9B, and 9C are layer structure diagrams illustrating another embodiment of the photoelectric converting section 100. The same reference numerals designate the same parts as for the drawings mentioned above.

Referring to FIG. 9A, reference numerals 101 and 21 indicate a transparent insulating substrate and a lower transparent electrode comprising transparent conducting layers, respectively. An upper electrode 61 need not be transparent necessarily and it can be a metal such as Al or the like. Incident light passes through the transparent insulating substrate 101, the transparent electrode 21, and an insulating layer 70 to impinge on an i-layer 4.

Referring to FIG. 9B, an upper electrode 62 does not cover an n-layer 5 completely. Therefore, light can be incident on the i-layer 4 after passing through the n-layer. In other words, the electrode 62 can be a metal such as Al or the like and need not be transparent. Carriers output to the outside passing through the upper electrode.

In FIG. 9C, the electrode 61 is directly laid on the i-layer 4. In this structure, holes are inhibited from being injected from the electrode 61 to the i-layer 4 by a Schottky barrier layer made by a difference between work functions of the electrode 61 and the i-layer 4. Accordingly, the n-layer 5 in the above need not be laid, and a further low cost photoelectric converter can be produced.

As apparent from the above description, the photoelectric converting sections are not limited to those shown by the embodiment. More specifically, it is only required that there are a first electrode layer, an insulating layer inhibiting holes and electrons from moving, a photoelectric converting semiconductor layer, and a second electrode layer, in addition to an injection blocking layer for inhibiting holes from being injected into the photoelectric converting semiconductor layer between the second electrode layer and the photoelectric converting semiconductor layer.

In addition, it is also possible to make a configuration having a reverse relationship between carrier holes and electrons in the above description. For example, the injection blocking layer can be a player. If it is so, the same operation can be obtained by reversing the application of the voltage and electric field to make other configurations in the above description.

Further, the photoelectric converting semiconductor is not limited to the i-layer. It is only required that it has a photoelectric converting function for generation of electron-hole pairs caused by incident light. For the layer structure, it is possible to use not only a single layer but also multiple layer, and its characteristics can be changed by changing the composition in the layer thickness direction repetitively.

The insulating substrate need not be always insulators, and it can be a conductor or a semiconductor on which an insulator is laid. The accumulation order of the layers on the insulating substrate is not limited to the order of the first electrode, the insulating layer, the photoelectric converting semiconductor layer, and the second electrode layer, but it can be an order of the second electrode, the injection blocking layer, the photoelectric converting semiconductor layer, and the first electrode layer, i.e., the reverse order.

It should also be understood that the foregoing driving method can be applied to a photoelectric converter including photoelectric converting sections having a configuration described in FIGS. 9A, 9B, and 9C.

[Fourth embodiment]

Figure 10A:
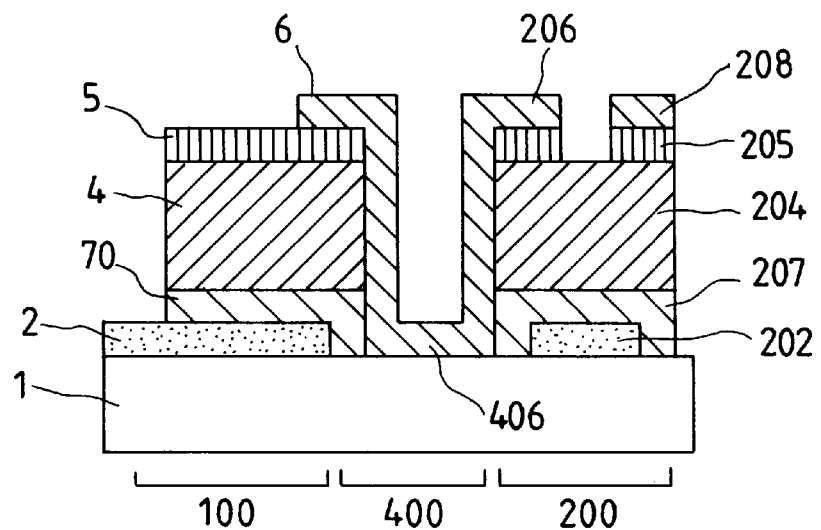
FIGS. 10A and 11A are typical sectional views for describing sample structures of the photoelectric converter including the photoelectric converting sections of the present invention.
Figure 10B:
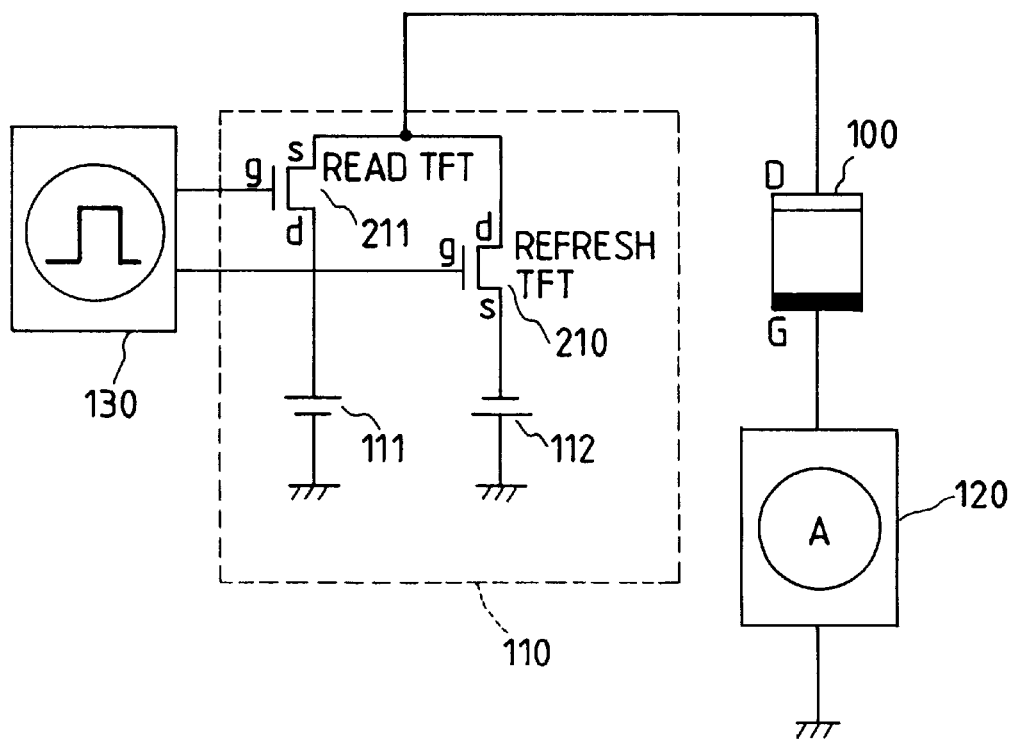
FIGS. 10B and 11B are their schematic circuit diagrams.

FIG. 10A illustrates a typical layer structure diagram of a photoelectric converting element 100, a switching element TFT 200, and a wiring layer 400 in the photoelectric converter of this embodiment, and FIG. 10B is a schematic circuit diagram of the photoelectric converter. In FIG. 10A, the same reference numerals as for FIG. 3 designate the corresponding parts.

In this embodiment, a lower electrode 2 and an upper electrode 6 are formed by opaque electrodes, and light can be incident through an injection blocking layer 5 from the upper side due to a structure in which the upper electrode 6 does not cover the injection blocking layer 5. However, if the upper or lower electrodes is formed by a transparent electrode such as an indium tin oxide electrode (ITO), for example, light can be incident in a structure that the upper electrode 6 covers the injection blocking layer 5 completely.

A gate electrode 202 is formed by Al or Cr, a gate insulating layer 207 is formed by silicon nitride SiN, a semiconductor layer 204 is formed by an intrinsic semiconductor i-layer of hydrogenated amorphous-silicon a-Si, an ohmic contact layer 205 is formed by the semiconductor layer 204 and an n-layer of a-Si for moving electrons between a source electrode 206 and a drain electrode 208.

The source electrode 206 and the drain electrode 208 are formed by metal or polysilicon such as Al or Cr. The upper electrode 106 of the photoelectric converting element 100 is connected with the source electrode 206 of the TFT 200 through a line 406 of Al or Cr.

As apparent from the drawings, the layer structure of the photoelectric converting section is the same as for the TFT, therefore, the same materials can be used for accumulating the layers on the same insulating substrate 1 at a time, and the wiring layer can also be formed simultaneously with the electrodes of the photoelectric converting section and the TFT, which indicates that the photoelectric converter can be formed in a simple process by using the same kinds of the layers for the composition.

Although a single TFT 200 is connected as a switching element in FIG. 10A in this example, it should be understood that it is not limited to a single TFT.

Referring to FIG. 10B, reference numeral 100 is a symbolized photoelectric converting element shown in FIG. 10A; D indicates an electrode in an upper electrode 6 side and G indicates an electrode in a lower electrode 2 side. Reference numeral 120 is a detecting section, 110 is a power supply section composed of a positive power supply 111 for applying positive potential and a negative power supply 112 for applying negative potential to the electrode D. Reference numerals 210 and 211 in the drawing are symbolized TFTs shown in FIG. 10A, and g, s, and d indicate the gate electrode 202, the source electrode 206, and the drain electrode 208, respectively. Although a single TFT 200 is shown in FIG. 10A as mentioned above, practically both the TFTs 210 and 211 are formed on the same insulating substrate as shown in FIG. 10B. The gate electrodes are connected to a control section 130, which controls an operation to turn a refresh-TFT 210 on in the refresh mode and a read-TFT 211 on in the photoelectric conversion mode.

In this embodiment, the switch 113 described in the first embodiment is shown concretely by the read-TFT 211 and the refresh-TFT 210 and FIG. 10B shows apparently that the selection between read and refresh in the first embodiment is performed by a signal from the control section 130, but the description of the first embodiment can be applied to a driving method of the photoelectric converting section.

According to this embodiment, the photoelectric converting section and a typical switching element, the TFT can be formed in at least partially the same layer structure, therefore required layers can be laid and patterned at a time in the same process, which makes it possible to provide a excellent photoelectric converter of a high yielding ratio, low cost, and high signal-to-noise ratio.

[Fifth embodiment]

Figure 11A:
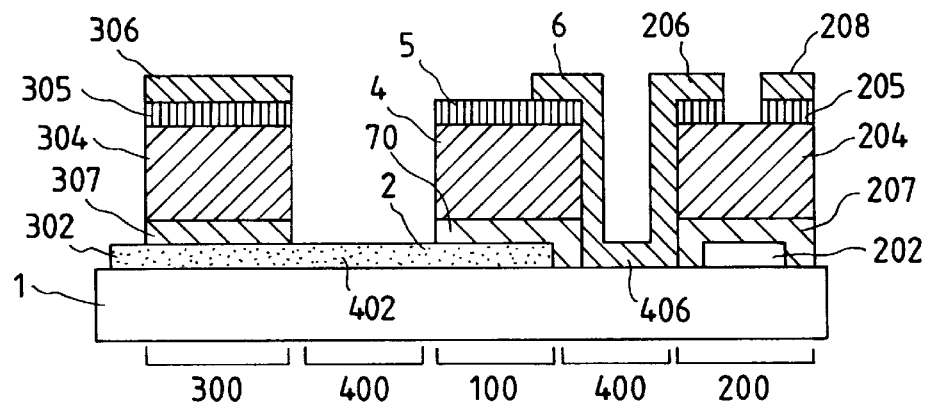
Figure 11B:
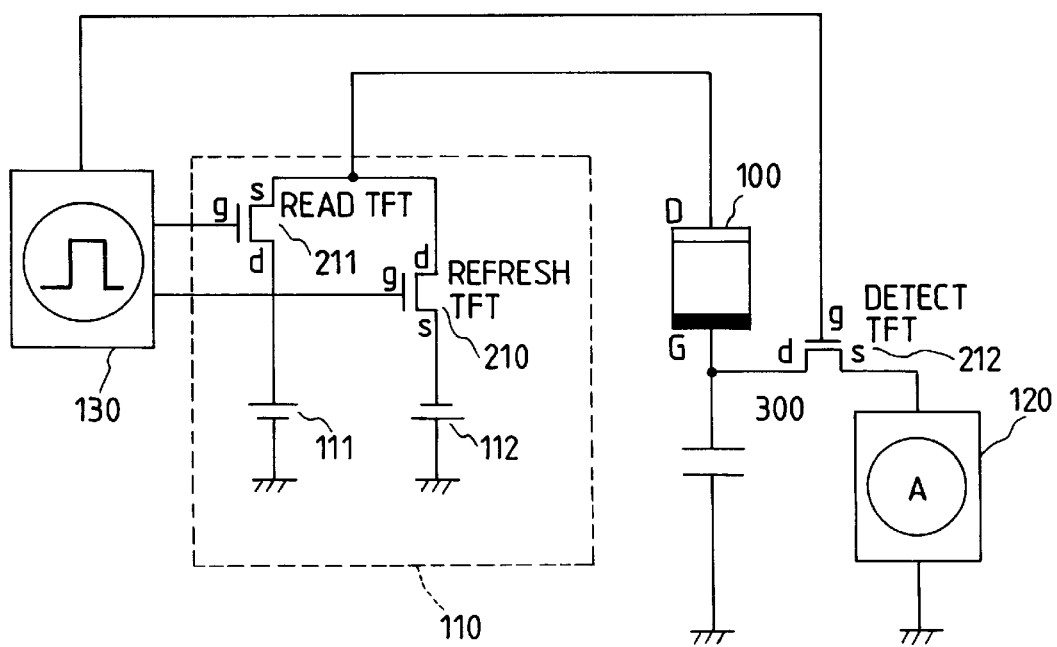

FIG. 11A illustrates a typical layer structure diagram of a photoelectric converting section 100, a switching element TFT 200, a capacitor 300 which is a capacitive element, and a wiring layer 400 in the photoelectric converter of the fifth embodiment of the present invention, and FIG. 11B is a schematic circuit diagram of the photoelectric converter applicable to FIG. 11A. In FIGS. 11A and 11B, the same reference numerals as for FIGS. 10A and 10B designate the corresponding members, and their description is omitted here.

Referring to FIG. 11A, a lower electrode of the capacitor 302 is formed by Al or Cr, an insulating layer 307 is formed by silicon nitride SiN, a semiconductor layer 304 is formed by an intrinsic semiconductor i-layer of hydrogenated amorphous-silicon a-Si, and an ohmic contact layer 305 is formed by an n-layer of a-Si for moving electrons between the semiconductor layer 304 and a capacitor upper electrode 306. The capacitor upper electrode 306 is formed by Al or Cr. An insulating layer 307, the semiconductor layer 304, and the ohmic contact layer 305 serve as middle layers for the capacitor 300, which is effective to achieve a good capacitor which is not leaky due to the insulating layer 307. A lower electrode 102 of the photoelectric converting element 100 is connected to the lower electrode 302 of the capacitor through line 402 of Al or Cr.

As apparent from the drawings, the layer structure of each element is identical, therefore, the same materials can be used for accumulating the layers on the same insulating substrate 1 at a time, and the wiring layer can also be formed simultaneously with the electrodes of the elements, which indicates that the photoelectric converter can be formed in a simple process by using the same kinds of the layers for the composition.

FIG. 11B is different from FIG. 11B in a detect-TFT (TFT for detection) 212 driven by a signal from the control section 130 inserted between the photoelectric converting section 100 and a detecting section 120 and in one electrode of the photoelectric converting section 100 grounded via the capacitor 300.

Although this embodiment has been described in its preferred form with a single TFT in FIG. 11A, it is understood that a typical example is shown in the same manner as for the fourth embodiment and the present disclosure of the preferred form can be changed to a configuration that a read TFT 211, a refresh-TFT 210, and the detect-TFT 212 can be formed on the same substrate.

As shown in FIG. 11B, the TFTs 210, 211, and 212 are formed on the same insulating substrate. The gate electrodes are connected to a control section 130, which controls an operation to turn a refresh-TFT 210 on in the refresh mode and a read-TFT 211 on in the photoelectric conversion mode. A detect-TFT 212 is controlled to be turned on or off appropriately at a timing of detecting an integrated value of an output from the photoelectric element laid in the capacitor 300.

The driving method described in the first embodiment can be applied to a driving for the photoelectric converter of this embodiment in the same manner as for the fourth embodiment. However, it is described again referring to FIGS. 5A to 5C and FIG. 6 since electric charges are stored in the capacitor 300 in this embodiment.

The following description is made on condition that the potential at the electrode D is always equal to the potential at the n-layer since electrons freely move between the electrode D and the n-layer though the electrode D does not cover the n-layer completely in this embodiment. The GND potential is applied to the electrode G via the detecting section during a detecting period, and the potential of the electrode G is kept to about the same level also during a storage period by the capacitor 300.

In FIG. 5A in the refresh mode, the electrode D has a potential negative to the electrode G, therefore, holes represented by black dots in the i-layer 4 are introduced to the electrode D by the electric field, while electrons represented by circles are injected into the i-layer 4. At this instant, a part of holes and electrons are recombined in the n-layer 5 and the i-layer 4, then disappear. If this state continues for a long time enough, the holes in the i-layer 4 are ejected from the i-layer.

If the photoelectric conversion mode in FIG. 5B is started in this state, the electrode D has a potential positive to the electrode G, therefore, electrons in the i-layer 4 are introduced to the electrode D momentarily. The holes, however, are not introduced to the i-layer 4 since the n-layer 5 acts as an injection blocking layer. If light impinges on the i-layer 4 in this state, the light is absorbed and electron-hole pairs are generated. The electrons are introduced to the electrode D by the electric field, and the holes move in the i-layer 4 to reach an interface between the i-layer 4 and the insulating layer 70. The holes, however, cannot move to inside of the insulating layer 70, and remain in the i-layer 4. At this time, the electrons moves to the electrode D and the holes to the interface of the insulating layer 70 in the i-layer 4, therefore, current flows from the electrode G to the capacitor 300 to keep electric neutral in the elements. Since the current corresponds to the electron-hole pairs generated by the light, it is proportional to the incident light. If the refresh mode in FIG. 5A is started again after a certain period of the photoelectric conversion mode in FIG. 5B, the holes remaining in the i-layer 4 are introduced to the electrode D as mentioned above, and current corresponding to the holes flows to the capacitor 300. The quantity of the holes corresponds to a total quantity of light incident during the photoelectric conversion mode, and the quantity of the current flowing to the capacitor 300 corresponds to the total quantity of the light. Although current corresponding to a quantity of electrons injected into the i-layer 4 also flows at this time, the quantity is approximately fixed and the required current can be detected by subtracting the quantity from the total quantity of the current. In other words, the photoelectric converting section 100 of this embodiment can output a quantity of real time incident light and also a total quantity of light impinging during a certain period. It is an important feature of this embodiment. The capacitor 300 can accumulate an object output from these outputs to detect its integrated value through the detecting section 120 by turning the detect-TFT on.

Next, the operations of this embodiment are described below. FIG. 6 is a timing diagram of the operations of the photoelectric converter shown in FIG. 11A. In this drawing, $V_{dg}$ is an electric potential of the electrode D to the electrode G of the photoelectric converting element 100, and P is a light incoming state, where ON indicates a state that light is incident and OFF indicates a state that no light is incident, i.e., a dark state. $I_s$ indicates a current flowing into the capacitor 300, and the horizontal direction represents an elapse of time. First, when the refresh-TFT 210 is turned on by the control section 130, the refresh mode is started, $V_{dg}$ becomes a negative voltage, holes are ejected as shown in FIG. 5A, and negative inrush current E denoted by E in FIG. 6 flows into the capacitor 300 while electrons are injected into the i-layer 4. Afterward, when the refresh mode is completed and the refresh-TFT 210 is turned off and the read-TFT 211 is turned on, $V_{dg}$ becomes a positive voltage, electrons in the i-layer 4 are ejected, and positive inrush current E' flows to start the photoelectric conversion mode. If light is incident at this moment, optical current A denoted by A flows. For a dark state in the same operation, the current does not flow as shown by A'. Accordingly, if the optical current A is integrated for a certain period, the light incidence can be detected. When the refresh-TFT 210 is turned on from the A state, inrush current B flows. The quantity of the current is reflected by a total quantity of incident light during the previous photoelectric conversion mode period, and it can be detected by integrating the inrush current B. If light is not incident in the previous photoelectric conversion mode, the inrush current becomes smaller as shown by B', and the light incidence can be detected by detecting the difference. Otherwise, since the above mentioned inrush current E' or E" is approximately equal to the inrush current B', it can be subtracted from the inrush current B to obtain the value. In other words, an integrated value should be obtained through the capacitor 300 from the point just before the inrush current B to the point just after the inrush current E". It is a feature of this embodiment and the following value can be obtained without any special calculator for subtraction:

(Inrush current B—Inrush current E")

If the light incident state is changed, $I_s$ changes as shown by C and C' even during the same photoelectric conversion mode period. The light incident state can also be detected by integrating the change value. In other words, it means that it does not need to set the refresh mode at every detecting time.

However, if the photoelectric conversion mode period is extended or the illumination of incident light is intensive for some reason, current sometimes does not flow even if light is incident as shown by D. This is because a lot of holes remain in the i-layer 4, the electric field in the i-layer 4 becomes smaller due to the holes, and generated electrons are not introduced to the electrode D and then the electrons are recombined with the holes in the i-layer 4. Although current may flow unstably if the light incident state changes in this state, a restart of the refresh mode ejects the holes in the i-layer 4 and current equal to A can be obtained as shown by A" in the subsequent photoelectric conversion mode.

Now, how an integrated value is obtained through the capacitor 300 is described below. First, the detect-TFT 212 is turned on by the control section 130, and the GND potential is applied to the capacitor 300 via the detecting section. At this point, the detecting section 120 need not detect electric charges flowing. Next, the detect-TFT 212 is turned off to start the integration. During the integration period, the current flowing into the capacitor 300 is stored in the capacitor 300 as electric charges. The potential of the capacitor 300 slightly goes up at this instant, but it does not affect operations of the photoelectric converting element 100 almost at all. When the detect-TFT 212 is turned on after an integration for a certain period, the electric charges stored in the capacitor 300 flow into the detecting section 120 through the detect-TFT 212. This current corresponds to an integrated value obtained by the integration for a certain period, and it can be detected through the detecting section 120.

Although the incident light is assumed to be fixed in the above explanation, it should be understood that the current indicated by A, B, and C changes continuously depending on intensity of incident light and that the intensity can also be detected quantitatively as well as the absence or presence of the incident light.

In the above description, although it is desirable to eject all of the holes when the holes in the i-layer 4 are ejected in the refresh mode, there is no problem because ejecting a part of the holes is also effective and the same value can be obtained as for ejecting all the holes at the optical current A or C. If holes are ejected so that a fixed quantity of holes always remain, a quantity of light can also be quantitatively detected by the current B. In other words, it should be avoided only to be a state indicated by the current value D at detection in the subsequent photoelectric conversion mode, that is, a state illustrated by FIG. 5C, and it is required only to determine characteristics of a $V_{dg}$ voltage in the refresh mode, a period of the refresh mode, and the injection blocking layer of the n-layer 5. Further in the refresh mode, the injection of electrons into the i-layer 4 is not a requirement and the $V_{dg}$ voltage is not limited to negative. It is because the electric field in the i-layer 4 is applied in a direction that holes are introduced to the electrode D even if the $V_{dg}$ voltage is positive when a lot of holes remain in the i-layer 4. Also for characteristics of the injection blocking layer of the n-layer 5, it is not a requirement that electrons can be injected into the i-layer 4.

A lot of types of detecting sections described in FIGS. 7A to 7C with examples can be applied to this detecting section.

As the photoelectric converter includes the capacitor 300 of this embodiment, photoelectrically converted signals for a desired period can be stored and the characteristics of high sensitivity and high signal-to-noise ratio can be further enhanced.

[Sixth embodiment]

Figure 12:
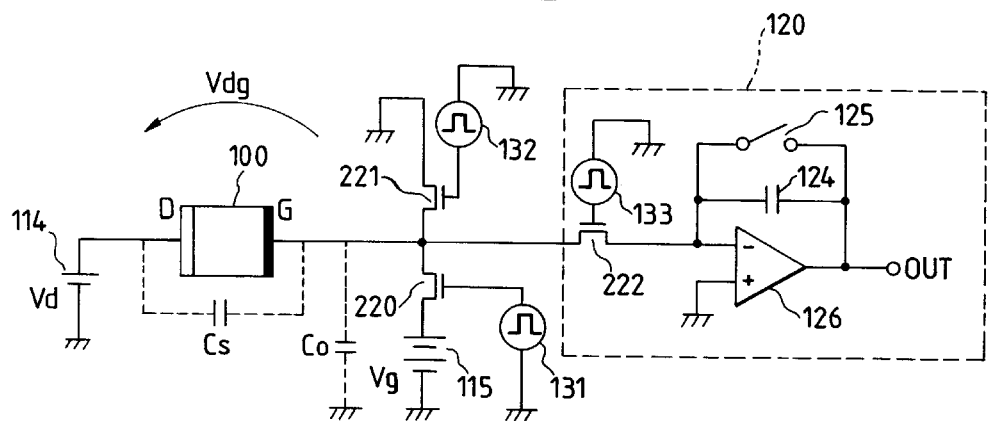

FIG. 12 is a circuit diagram illustrating a sixth embodiment of the photoelectric converter of this invention. The same reference numerals designate the same parts as for the drawings mentioned above. The layer structure of the photoelectric converting section 100 and the TFT 200 in FIG. 10A can be applied to the structure for a photoelectric converting element 100 and TFTs 220 to 222 which are switching elements. Reference numeral 114 is a power supply $V_d$ which gives positive potential to an electrode D and reference numeral 115 is a power supply $V_g$ which gives positive potential to an electrode G in a refresh mode of a photoelectric converting element. The power supply 115 is set to a voltage equivalent to that of the power supply 114 or a higher voltage. The gate electrodes of the TFTs 220, 221, and 222 are controlled to be turned on or off by control sections 131, 132, and 133, respectively. Section 120 enclosed by a dashed line is a detecting section, which detects light incident on the photoelectric converting section 100 as mentioned below.

In this embodiment, there are provided four modes; (1) a photoelectric converting element refresh mode, (2) a G electrode initialization mode, (3) a storage mode, and (4) a detection mode. The photoelectric converting element refresh mode (1) corresponds to the refresh mode of the above embodiment, the G electrode initialization mode (2), the storage mode (3), and the detection mode (4) correspond to the photoelectric conversion mode of the above embodiment, and an electric field is applied to each layer of the photoelectric converting element 100 in the same direction, therefore the operation of the photoelectric converting section 100 is primarily identical. These modes are sequentially described below. After the TFTs 220, 221, and 222 are turned off, the TFT 220 is turned on by the control section 131 in the photoelectric converting element refresh mode, and positive potential $V_g$ is applied to the electrode G by the power supply 115. Positive potential $V_d$ is applied to the electrode D by the power supply 114, that is, $(V_d-V_g)$ is applied to potential $V_{dg}$ of the electrode D against the potential of the electrode G. Then, holes in the photoelectric converting element 100 are ejected for refreshment. Next, after the TFT 220 is turned off, the TFT 221 is turned on by the control section 132 to shift to the G electrode initialization mode (2), and GND potential is applied to the electrode G. At this instant, the $V_{dg}$ has a positive voltage and the photoelectric converting element 100 enters the photoelectric conversion mode after inrush current flows. Then, the TFT 221 is turned off and the electrode G is opened for direct current. Practically, however, the potential is kept by equivalent capacitive component $C_s$ or stray capacitance $C_o$ of the photoelectric converting section 100 indicated by dashed lines. If light is incident on the photoelectric converting section 100, the corresponding current flows out from the electrode G and the potential of the electrode G increases. In other words, the light incident information is stored in the $C_s$ and $C_o$ as electric charges. After a certain period of time for the storage, the TFT 222 is turned on by the control section 133 to shift to the detection mode (4). At this instant, the electric charges stored in the $C_s$ and $C_o$ flow to the operational amplifier 126 side through the TFT 222, and the quantity of the charges is equal to an integrated value of current flowing out of the photoelectric converting section 100 in the storage mode, that is, it is detected as a total quantity of incident light by an integrator comprising the operational amplifier, a capacitor 124, and a switching element 125. This integrator should be initialized before a shift to the detection mode (4) by turning on the switching element 125 through a control section which is not shown so that the capacitor 124 is discharged. Further, after the TFT 222 is turned off, the TFT 220 is turned on again by the control section 131 to repeat the operation.

As mentioned above, this embodiment has characteristics that an integrated value of current flowing during a certain long period of time for storage can be obtained in a short time in the detection mode by using a combination of elements, and it indicates that this embodiment is effective to produce a high signal-to-noise ratio photoelectric converter with a light load operational amplifier whose cost is high, including a plurality of photoelectric converting elements at low cost. The operation of the photoelectric converting elements of this embodiment is primarily the same as for that of the first embodiment, except that the potential of the electrode G goes up in the photoelectric conversion mode and $V_{dg}$ is lowered. It means that the state in FIG. 5C can be easily made by a small quantity of incident light, which may lead to a restriction on incident light volume in a normal operation. This, however, can be easily solved by inserting a large capacitor for storage in parallel to the stray capacitance Co consciously.

Figure 13A:
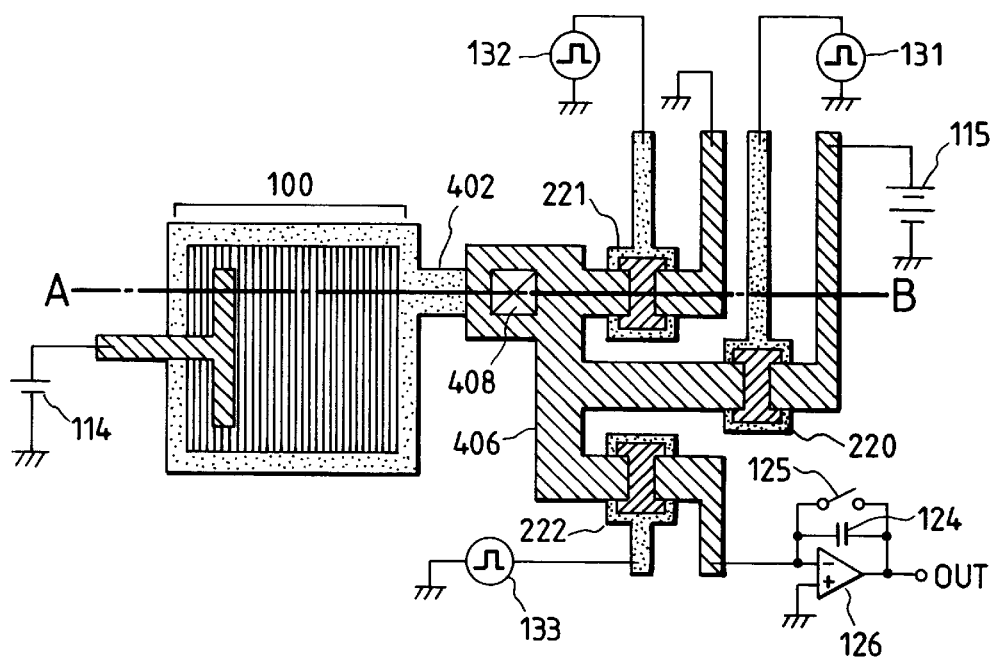
FIGS. 13A, 15A, 17A, 20A, 32, 36, 45, and 48 are typical top plan views for describing examples of the photoelectric converter of the present invention.
Figure 13B:
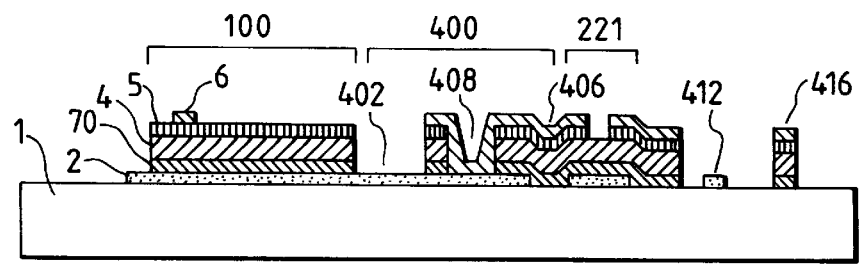
FIGS. 13B, 15B, 17B, 20B, 37, 46, and 49 are their typical sectional views.

FIG. 13A illustrates a typical plan view of the photoelectric converter shown in FIG. 12 and FIG. 13B is a sectional view along line A-B in FIG. 13A. The parts which cannot be shown in detail in FIG. 13A are denoted by the same symbols as for FIG. 12. The photoelectric converting element 100 and the TFTs 220 through 222 are connected by lines 402 and 406 for connecting these elements electrically via a contact hole 408. In FIG. 13B, lines 412 and 416 are used for connection with other components. Now, referring to FIGS. 13A and 13B, how the elements are formed is described below.

First of all, Cr is laid by approx. 500 Å as a lower metal layer 2 on a glass substrate 1 which is an insulating material by sputtering or the like, then patterning is made in photolithography and unnecessary areas are processed with etching. It forms a lower electrode of the photoelectric converting element 100, gate electrodes of the TFT 220 through 222, and the lower lines 402 and 412.

Next, an SiN-layer 70, an i-layer 4, and an n-layer 5 are laid by approx. 2,000 Å, 5,000 Å, and 500 Å, respectively in an identical vacuum with the chemical vapor deposition (CVD) technique. The layers become an insulating layer, a photoelectric converting semiconductor layer, and a hole injection blocking layer of the photoelectric converting element 100 and a gate insulating film, a semiconductor layer, and an ohmic contact layer of the TFTs 220 through 222. They are also used as cross section insulating layers for upper and lower lines. Although the thickness of each layer is not limited to the above, but can be designed to be optimized according to a voltage, current, charges, incident light volume, or other conditions used for the photoelectric converter, it is desirable that at least SiN has a thickness of 500 Å or greater which inhibits electrons and holes from passing through the layer and permits it to serve as a gate insulating film of the TFTs.

After the accumulation of the layers, an area to be the contact hole 408 is processed with etching, then Al is laid by approx. 10,000 Å as an upper metal layer 6 by means of spatter or the like. Further, patterning is made in photolithography unnecessary areas are processed with etching to form an upper electrode of the photoelectric converting element 100, a source electrode and a drain electrode, i.e., main electrodes of the TFTs 220 to 222, and upper lines 406 and 416. In the contact hole 408, the lower circuit 402 and the upper circuit 406 are connected.

Additionally, the n-layer is processed with reactive ion etching (RIE) only for a channel sections of the TFTs 220 to 222, then unnecessary parts of the SiN-layer 70, the i-layer 4, and the n-layer 5 are processed with etching to separate the elements each other. This completes the photoelectric converting element 100, the TFTs 220 to 222, the lower lines 402 and 412, the upper lines 406 and 416, and the contact hole 408. Normally, the top of each element is covered with a passivation film (not shown) of SiN or the like to enhance their endurance.

In this embodiment as mentioned above, the photoelectric converter can be formed only by the lower metal layer 2 on which the photoelectric converting element 100, the TFTs 220 to 222, and a line section 300 are laid simultaneously, the SiN-layer 70, the i-layer 4, the n-layer 5, the upper metal layer 6, and etching-processed parts of these layers, there is only a single portion of the injection blocking layer in the photoelectric converting element 100 and it can be formed in an identical vacuum, and further, the gate insulating film or an i-layer interface which is important as TFT characteristics can be formed in an identical vacuum, which makes it possible to produce a low cost and high performance photoelectric converter having a generally high yielding ratio.

[Seventh embodiment]

Figure 14:
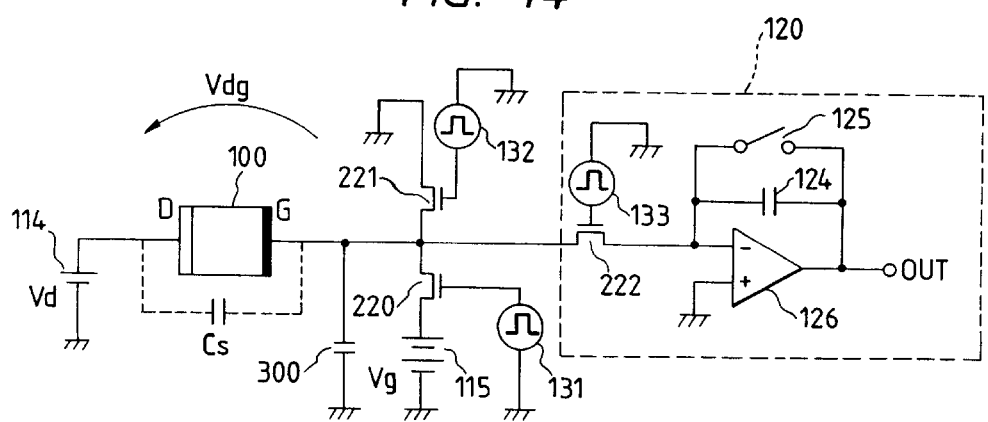

FIG. 14 is a circuit diagram illustrating a seventh embodiment of the photoelectric converter of this invention. The same reference numerals designate the same features as for the drawings mentioned above. The layer structure of the photoelectric converting section 100 and the TFT 200 in FIG. 11A can be applied to the structures for a photoelectric converting element 100, TFTs 220 to 222, and a capacitor 300. Reference numeral 114 is a power supply $V_d$ which gives positive potential to an electrode D and reference numeral 115 is a power supply $V_g$ which applies positive potential to an electrode G in a refresh mode of a photoelectric converting element. The power supply 115 is set to a voltage equivalent to that of the power supply 114 or a higher voltage. The gate electrodes of the TFTs 220, 221, and 222 are controlled to be turned on or off by control sections 131, 132, and 133, respectively. Section 120 enclosed by a dashed line is a detecting section, which detects light incident on the photoelectric converting section 100 as mentioned below.

In this embodiment, there are provided four modes; (1) a photoelectric converting element refresh mode, (2) a G electrode initialization mode, (3) a storage mode, and (4) a detection mode. The photoelectric converting element refresh mode (1) corresponds to the refresh mode of the above embodiment, the G electrode initialization mode (2), the storage mode (3), and the detection mode (4) correspond to the photoelectric conversion mode of the above embodiment, and an electric field is applied to each layer of the photoelectric converting element 100 in the same direction, therefore the operation of the photoelectric converting section 100 is primarily identical. These modes are sequentially described below. After the TFTs 220, 221, and 222 are turned off, the TFT 220 is turned on by the control section 131 in the photoelectric converting element refresh mode, and positive potential $V_g$ is applied to the electrode G by the power supply 115. Positive potential $V_d$ is applied to the electrode D by the power supply 114, that is, $(V_d - V_g)$ is applied to potential $V_{dg}$ of the electrode D against the potential of the electrode G. Then, holes in the photoelectric converting element 100 are ejected for refreshment. Next, after the TFT 220 is turned off, the TFT 221 is turned on by the control section 132 to shift to the G electrode initialization mode (2), and GND potential is applied to the electrode G. At this instant, the $V_{dg}$ has a positive voltage and the photoelectric converting element 100 enters the photoelectric conversion mode after inrush current flows. Then, the TFT 221 is turned off and the electrode G is opened for direct current. The potential, however, is kept by a capacitor 300. If light is incident on the photoelectric converting section 100, the corresponding current flows out from the electrode G and the potential of the electrode G increases. In other words, the light incident information is stored in the capacitor 300 as electric charges. After a certain period of time for the storage, the TFT 222 is turned on by the control section 133 to shift to the detection mode (4). At this instant, the electric charges stored in the capacitor 300 flow to the operational amplifier 126 side through the TFT 222, and the quantity of the charges is equal to an integrated value of current flowing out of the photoelectric converting section 100 in the storage mode, that is, it is detected as a total quantity of incident light by an integrator comprising the operational amplifier, a capacitor 124, and a switching element 125. This integrator should be initialized before a shift to the detection mode (4) by turning on the switching element 125 through a control section which is not shown so that the capacitor 124 is discharged. Further, after the TFT 222 is turned off, the TFT 220 is turned on again by the control section 131 to repeat the operation.

As mentioned above, this embodiment has characteristics that an integrated value of current flowing during a certain long period of time for storage can be obtained in a short time in the detection mode by using a simple combination of elements, and it indicates that this embodiment is effective to produce a high signal-to-noise ratio photoelectric converter with a light load operational amplifier whose cost is high, including a plurality of photoelectric converting elements at low cost. In the operation of the photoelectric converter of this embodiment, the potential of the electrode G goes up in the photoelectric conversion mode and $V_{dg}$ is lowered in the same manner as for the first embodiment. It means that the state in FIG. 5C can be easily made by a small quantity of incident light, which may lead to a restriction on incident light volume in a normal operation. This, however, can be easily improved by inserting the capacitor 300 which is large enough. If a small quantity of light is detected on the contrary, a stray capacitance Cs in the photoelectric element 100 indicated by a dashed line serves as a capacitive element so that the converter can operate without inserting the capacitor 300 as a required element. The stray capacitance $C_s$ can be adjusted by an area of an upper electrode 106 of the photoelectric converting element 100.

Figure 15A:
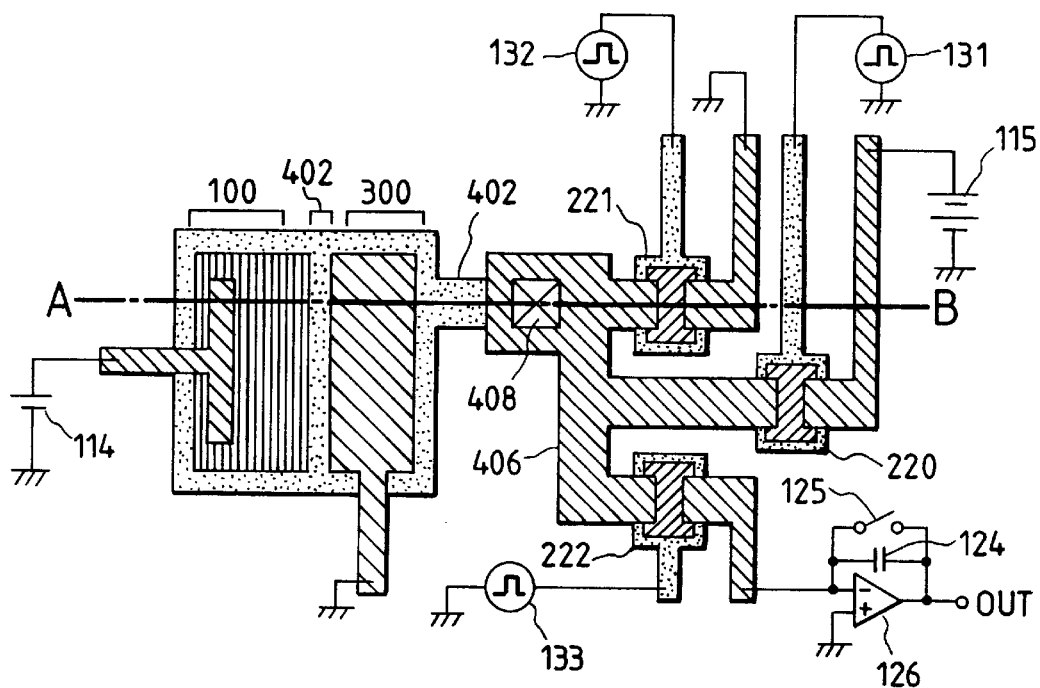
Figure 15B:
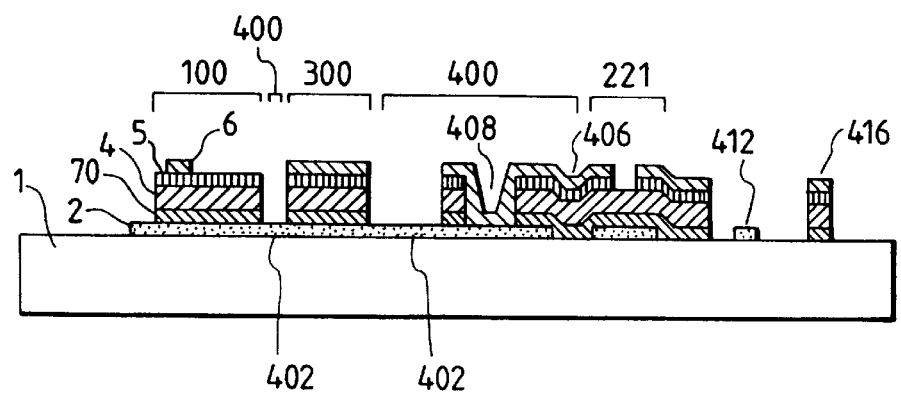

FIG. 15A illustrates a plan view of the photoelectric converter shown in FIG. 14 and FIG. 15B is a sectional view along line A-B in FIG. 15A. The parts which cannot be shown in detail in FIG. 15A are denoted by the same symbols as for FIG. 14. The photoelectric converting element 100, the capacitor 300, and the TFTs 220 through 222 are connected by lines 402 and 406 for connecting these elements electrically via a contact hole 408. In FIG. 15B, lines 412 and 416 are used for connection with other components. Now, referring to FIGS. 15A and 15B, how the elements are formed is described below.

First of all, Cr is laid by approx. 500 Å as a lower metal layer 2 on a glass substrate 1 which is an insulating material by sputtering, then patterning is made in photolithography and unnecessary areas are processed with etching. It forms a lower electrode for the photoelectric converting element 100, gate electrodes of the TFTs 220 through 222, a lower electrode for the capacitor 300, and the lower lines 402 and 412.

Next, an SiN-layer 70, an i-layer 4, and an n-layer 5 are laid by approx. 2,000 Å, 5,000 Å, and 500 Å, respectively in an identical vacuum with the chemical vapor deposition (CVD) technique. The layers become an insulating layer, a photoelectric converting semiconductor layer, and a hole injection blocking layer of the photoelectric converting element 100 and a gate insulating film, a semiconductor layer, an ohmic contact layer of the TFTs 220 through 222, and a middle layer of the capacitor 300. They are also used as cross section insulating layers for upper and lower lines. Although the thickness of each layer is not limited to the above, but can be designed to be optimized according to a voltage, current, charges, incident light volume, or other conditions used for the photoelectric converter, it is desirable that at least SiN has a thickness of 500 Å or greater which inhibits electrons and holes from passing through the layer and permits it to serve as a gate insulating film of the TFTs.

After the accumulation of the layers, an area to be the contact hole 408 is processed with etching, then Al is laid by approx. 10,000 Å as an upper metal layer 6 by means of spatter or the like. Further, patterning is made in photolithography unnecessary areas are processed with etching to form an upper electrode for the photoelectric converting element 100, a source electrode and a drain electrode, i.e., main electrodes of the TFTs 220 to 222, an upper electrode for the capacitor 300, and upper lines 406 and 416. In the contact hole 408, the lower circuit 402 and the upper circuit 406 are connected.

Additionally, the n-layer is processed with reactive ion etching (RIE) only for a channel sections of the TFTs 220 to 222, then unnecessary parts of the SiN-layer 70, the i-layer 4, and the n-layer 5 are processed with etching to separate the elements each other. This completes the photoelectric converting element 100, the TFTs 220 to 222, the lower lines 402 and 412, the upper lines 406 and 416, and the contact hole 408.

Normally, the top of each element is covered with a passivation film (not shown) of SiN or the like to enhance their endurance.

In this embodiment as mentioned above, the photoelectric converter can be formed only by the lower metal layer 2 on which the photoelectric converting element 100, the TFTs 220 to 222, the capacitor 300, and a line section 400 are laid simultaneously, the SiN-layer 70, the i-layer 4, the n-layer 5, the upper metal layer 6, and etching-processed parts of these layers, there is only a single portion of the injection blocking layer in the photoelectric converting element 100 and it can be formed in an identical vacuum, and further, the gate insulating film or an i-layer interface which is important as TFT characteristics can be formed in an identical vacuum. In addition, the middle layer of the capacitor 300 includes an insulating layer which is not so much leaky under the heat which is helpful to form a capacitor having good characteristics. Accordingly, this embodiment makes it possible to produce a low cost and high performance photoelectric converter.

[Eighth embodiment]

Figure 16:
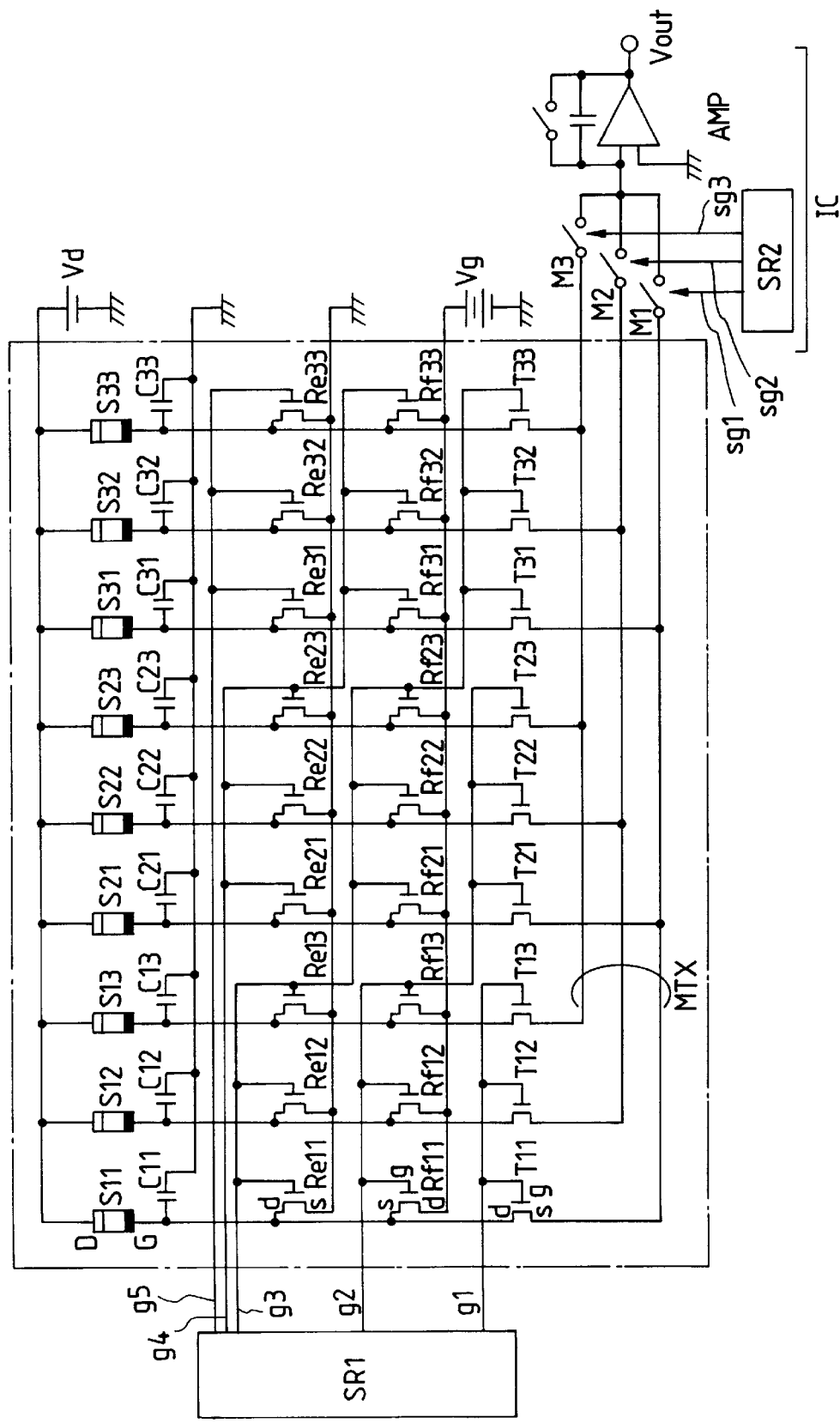
Figure 17A:
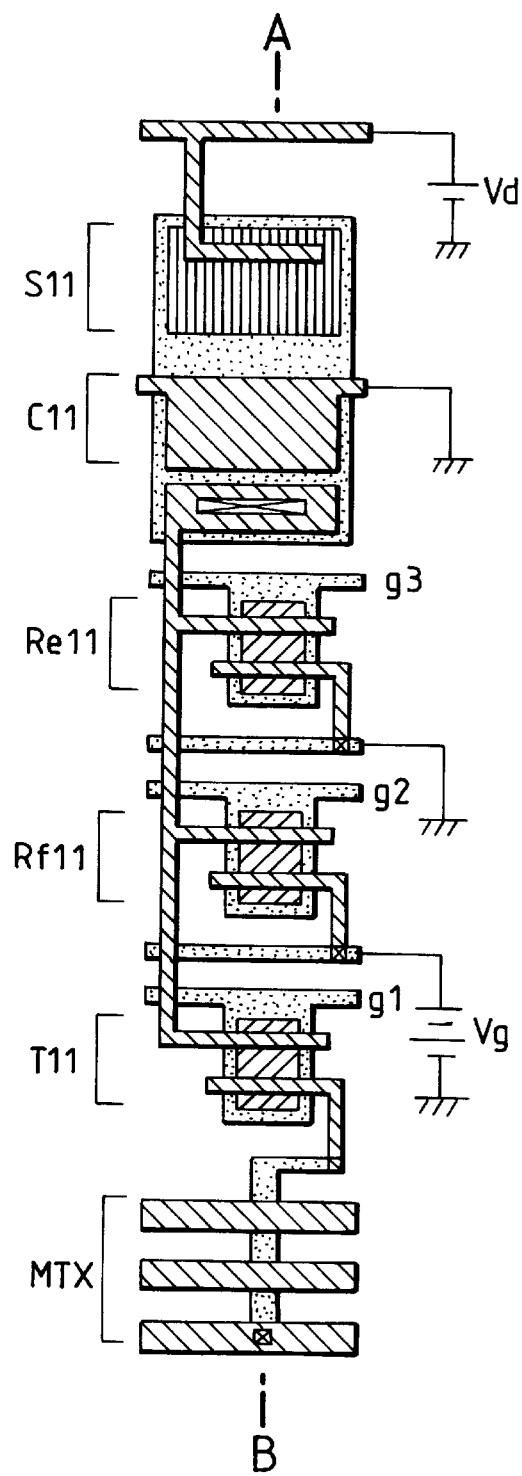
Figure 17B:
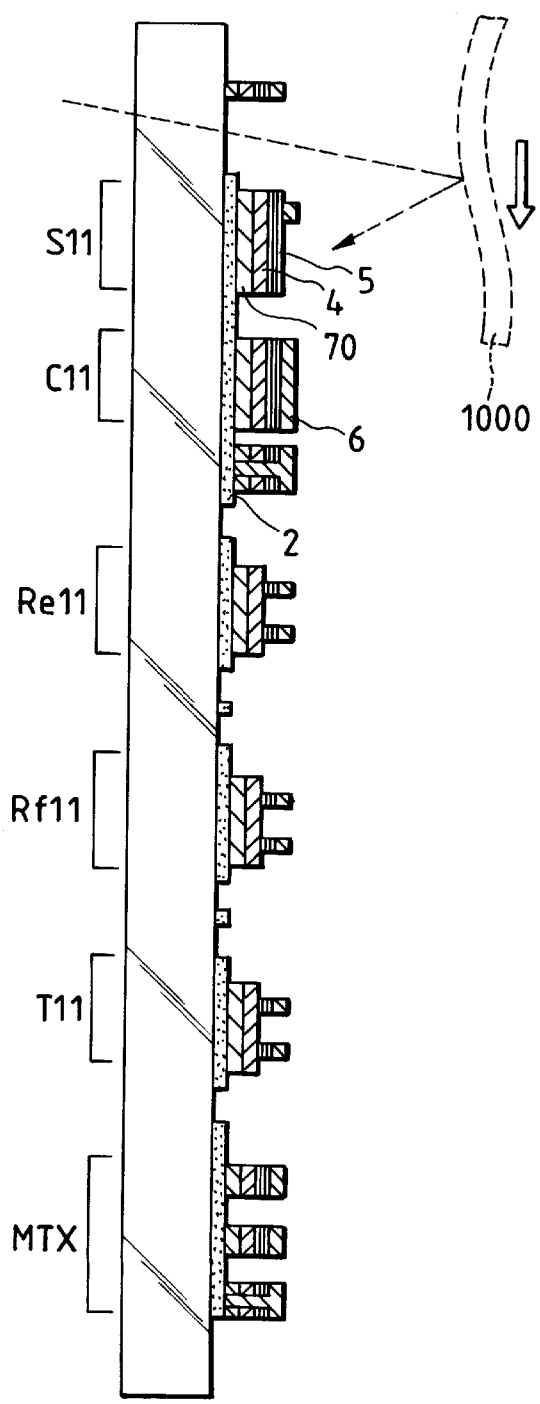

FIG. 16 is a schematic general circuit diagram of a photoelectric converter of the eighth embodiment of the present invention, FIG. 17A is a typical plan view of each component equivalent to a first pixel in this embodiment, FIG. 17B is a sectional view along line A-B in FIG. 17A. In FIG. 16, S11 to S33, G, and D indicate photoelectric converting elements, a lower electrode side, and an upper electrode side, respectively.

These nine photoelectric converting elements S11 to S33 are arranged one-dimensionally, i.e., in a line on a glass substrate which is an identical insulating substrate to serve as a sensor section as a line sensor. C11 to C33 are capacitive elements, storage capacitors, Re11 to Re33 are initialize-TFTs, Rf11 to Rf33 are refresh-TFTs, and T11 to T33 are transfer-TFTs. Characters g, d, and s for a transfer-TFT T11 represent a gate electrode, a drain electrode, and a source electrode. If a low voltage (hereinafter "Lo") is applied to the potential of the gate electrode, a nonconducting (off) state is made between the drain electrode and the source electrode. If a high voltage (hereinafter "Hi") is applied to it, a conducting (on) state is made between them. Accordingly, the electrode serves as a switching element. It can be said for other TFTs in these drawings, too.

g1 to g5 indicate lines for controlling the TFTs, which are controlled by control pulses Hi/Lo generated in a shift register SR1. A read power supply $V_d$ is connected on a common basis to an electrode D for the photoelectric converting elements S11 to S33 and a refresh power supply is connected on a common basis to a drain electrode for the refresh-TFTs Rf11 to Rf33. A single pixel comprises a photoelectric converting element, a capacitor, and three TFTs, and its signal output is connected to a detection integrated circuit IC via a matrix signal line MTX. In the photoelectric converter of this embodiment, the total nine pixels are classified into three blocks, their outputs (three pixels per block) are simultaneously transferred, and they are sequentially converted to outputs by the detection integrated circuit IC via the matrix signal line MTX to be output. Readout switches M1 to M3 in the detection integrated circuit IC are controlled by control pulses Hi/Lo generated in a shift register SR2 via control lines sg1 to sg3, and their outputs are connected to an integrating detector Amp. The integrating detector Amp integrates injected charges via the read switches M1 to M3 and outputs them as Vout.

The part enclosed by a dashed line is formed on an identical large-sized glass substrate. FIG. 17A shows a top plan view of a part corresponding to a first pixel in the enclosed part. FIG. 17B shows a sectional view of a part indicated by a dashed line between A and B in FIG. 17A. The same symbols designate the same parts as for FIG. 16.

In FIGS. 17A and 17B, S11 indicates a photoelectric converting element, Re11, Rf11, and T11 are TFTs, and C11 and MTX indicate a capacitor and a matrix signal line, respectively. Now, referring to FIGS. 17A and 17B, how the elements are formed is sequentially described.

First of all, Cr is laid by approx. 500 Å as a lower metal layer 2 on a glass substrate 1 which is an insulating material by sputtering, then patterning is made in photolithography and unnecessary areas are processed with etching. It forms a lower electrode for the photoelectric converting element S11, gate electrodes of the TFTs Re11, Rf11, and T11, a lower electrode for the capacitor C11, and lower lines of the matrix signal line MTX.

Next, an SiN-layer 70, an i-layer 4, and an n-layer 5 are laid by approx. 2,000 Å, 5,000 Å, and 500 Å, respectively in an identical vacuum with the chemical vapor deposition (CVD) technique. The layers become an insulating layer, a photoelectric converting semiconductor layer, and a hole injection blocking layer of the photoelectric converting element S11 and a gate insulating film, a semiconductor layer, an ohmic contact layer of the TFTs Re11, Rf11, and T11, and a middle layer of the capacitor C11. They are also used as cross section insulating layers for the matrix signal line MTX. Although the thickness of each layer is not limited to the above, but can be designed to be optimized according to a voltage, current, charges, incident light volume, or other conditions used for the photoelectric converter, it is desirable that at least SiN has a thickness of 500 Å or greater which inhibits electrons and holes from passing through the layer and permits it to serve as a gate insulating film of the TFTs.

After the accumulation of the layers, an area to be the contact hole is processed with etching, then Al is laid by approx. 10,000 Å as an upper metal layer 6 by means of spatter or the like. Further, patterning is made in photolithography unnecessary areas are processed with etching to form an upper electrode for the photoelectric converting element S11, a source electrode and a drain electrode, i.e., main electrodes of the TFTs Re11, Rf11, and T11, an upper electrode for the capacitor C11, and upper lines of the matrix signal line MTX. In the contact hole, the lower lines is connected with the upper circuit.

Additionally, the n-layer is processed with reactive ion etching (RIE) only for a channel sections of the TFTs Re11, Rf11, and T11, then unnecessary parts of the SiN-layer 70, the i-layer 4, and the n-layer 5 are processed with etching to separate the elements each other. This completes the photoelectric converting element S11, the TFTs Re11, Rf11, and T11, the matrix signal line MTX, and the contact hole. Although the first pixel is described above, it should also be understood that other pixels are formed simultaneously.

Normally, the top of each element is covered with a passivation film (not shown) of SiN or the like to enhance their endurance, and further approx. 50 $\mu$ of a thin glass sheet is adhesive bonded to it.

In this embodiment as mentioned above, the photoelectric converter can be formed only by the lower metal layer 2 on which the photoelectric converting element, the TFTs, the capacitor, and the matrix signal line are laid simultaneously, the SiN-layer 70, the i layer 4, the n-layer 5, the upper metal layer 6, and etching-processed parts of these layers, there is only a single portion of the injection blocking layer in the photoelectric converting element and it can be formed in an identical vacuum, and further, the gate insulating film or an i-layer interface which is important as TFT characteristics can be formed in an identical vacuum. In addition, the middle layer of the capacitor includes an insulating layer which is not so much leaky under the heat which is helpful to form a capacitor having good characteristics.

Figure 18:
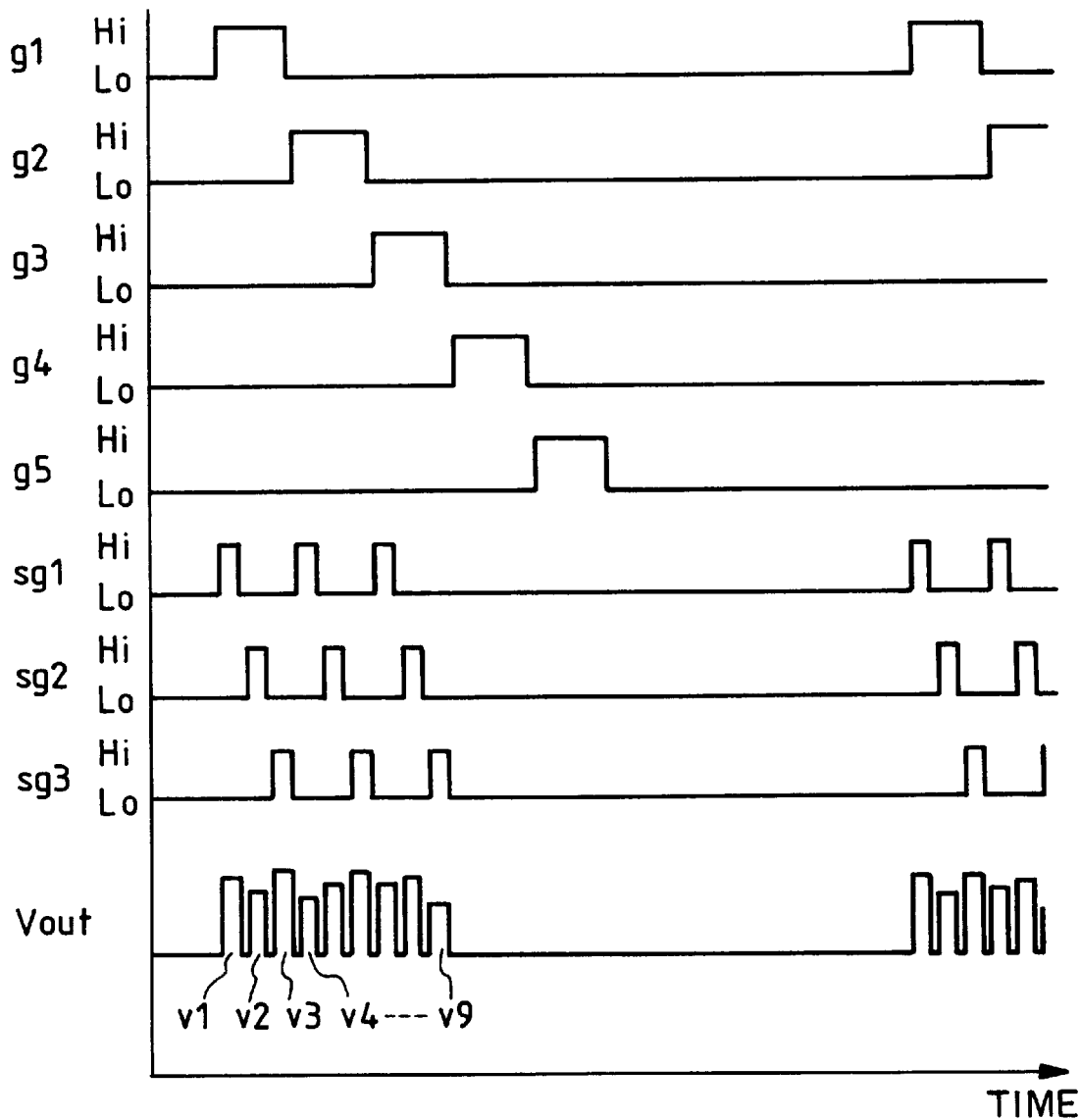

Next, referring to FIGS. 16 and 18, the operation of the photoelectric converter of this embodiment is described below. FIG. 18 is a timing diagram illustrating the operation of this embodiment. As mentioned above, the photoelectric converting elements of this embodiment serve as a photosensor which outputs optical current proportional to incident light in the photoelectric conversion mode if it is regularly refreshed. Now, the description is started from an operation of the pixels in the first block in the photoelectric converter.

Assuming that a certain period of time for storage has been elapsed since the photoelectric converting elements S11 to S13 in FIG. 16 were refreshed, the capacitors C11 to C13 have stored electric charges whose quantity is proportional to an integrated value of the information of light incident during this period. As shown by a circuit g1 in FIG. 18, an Hi control pulse is applied by a shift register SR1 at this instant. Then, the transfer-TFTs T11 to T13 are turned on to be put into conduction. If control pulses are sequentially applied to the control lines s1 to s3 by the shift register SR2 at this time, the charges in the capacitors C11 to C13 are transferred to the integrating detector Amp via the transfer-TFTs T11 to T13, the matrix signal line MTX, and the read switches M1 to M3 and sequentially output to v1 to v3 of the Vout (The integrating detector Amp not shown is initialized prior to the transfer of the charges). This output is proportional to an integrated value of the information of light incident on the photoelectric converting elements S11 to S13 during a certain period of time for storage. As shown in FIG. 18, when a control pulse is applied to a circuit g2, the refresh-TFTs Rf11 to Rf13 are put into conduction and the electrode G for the photoelectric converting elements S11 to S13 goes up by the refresh power supply Vg. Then, holes in the photoelectric converting elements are ejected for refreshment. If a control pulse is applied to a circuit g3 after that, the initialize-TFTs Re11 to Re13 conduct to terminate the refreshment of the photoelectric converting elements S11 to S13 and to initialize the capacitors C11 to C13. When the circuit g3 is put into Lo, the electrode G for the photoelectric converting elements S11 to S13 is opened for direct current, but the potential is kept by the capacitors C11 to C13. After this, the storage period for the subsequent cycle is started to store the information of light incident on the photoelectric converting elements S11 to S13 in the capacitors C11 to C13 until a control pulse is applied to the circuit g1, and the operation is repeated.

The operation of the first block is as mentioned above. The second block, however, has control lines g2 to g4 and the third block has control lines g3 to g5, therefore, control pulses are applied as shown in FIG. 18, and they move simultaneously with a time shift. Since the operation has a time shift for each pulse, signals of multiple blocks do not flow into the matrix signal line MTX at a time and the information of light incident on the photoelectric converting elements S11 to S33 is output to the Vout as optical signals v1 to v9 as shown in the drawing.

In FIG. 17B, the parts indicated by dashed lines represent a light path (indicated by an arrow) and an original copy 1000 for reading the copy using the photoelectric converter of this embodiment. The copy is illuminated through a window by the side of the photoelectric converting elements from the back of the glass substrate 1 by means of LEDs or the like. A reflected beam including information about characters or pictures on the original copy 1000 impinges on the photoelectric converting elements S11 to S33 in a line and the photoelectric converter sequentially output signals. After an output for a single line, the photoelectric converter shifts the original copy by an appropriate amount to read another line. By repeating this operation, it can convert the whole image information into electric signals. Although a single line consists of nine pixels in this embodiment, the number of the pixels is not limited to this, for example, eight pixels per millimeter can be used to arrange 1,728 pixels in a line and then to divide it into 36 blocks so that it can be processed in units of 48 pixels, which leads to composing a photoelectric converter for an A4-size facsimile.

Accordingly, the photoelectric converter of this embodiment makes it possible to output optical signals with a small amount of control lines and detecting circuits by classifying a plurality of photoelectric converting elements into n blocks and controlling m TFTs for each block using a single control line simultaneously to output the optical signals from the (n×m) photoelectric converting elements to the matrix signal line. In addition, a configuration further decreasing the number of the control lines can be achieved by controlling the gates for m TFTs in a block by means of a single control line simultaneously with controlling the gates for m TFTs of other functions in other blocks.

In this embodiment as mentioned above, the photoelectric converter can be formed only by the lower metal layer 2 on which the photoelectric converting element, the TFTs, the capacitors, and the matrix signal line are laid simultaneously, the SiN-layer 70, the i-layer 4, the n-layer 5, the upper metal layer 6, and etching-processed parts of these layers. The decrease of the layer forming processes like this leads to a decrease of defective parts in the processes, and particularly in producing a photoelectric converter having a large number of pixels as mentioned above, it makes it possible to improve an yielding ratio. Accordingly, this embodiment permits a large area and high performance photoelectric converter to be produced at low cost.

[Ninth embodiment]

Figure 19:
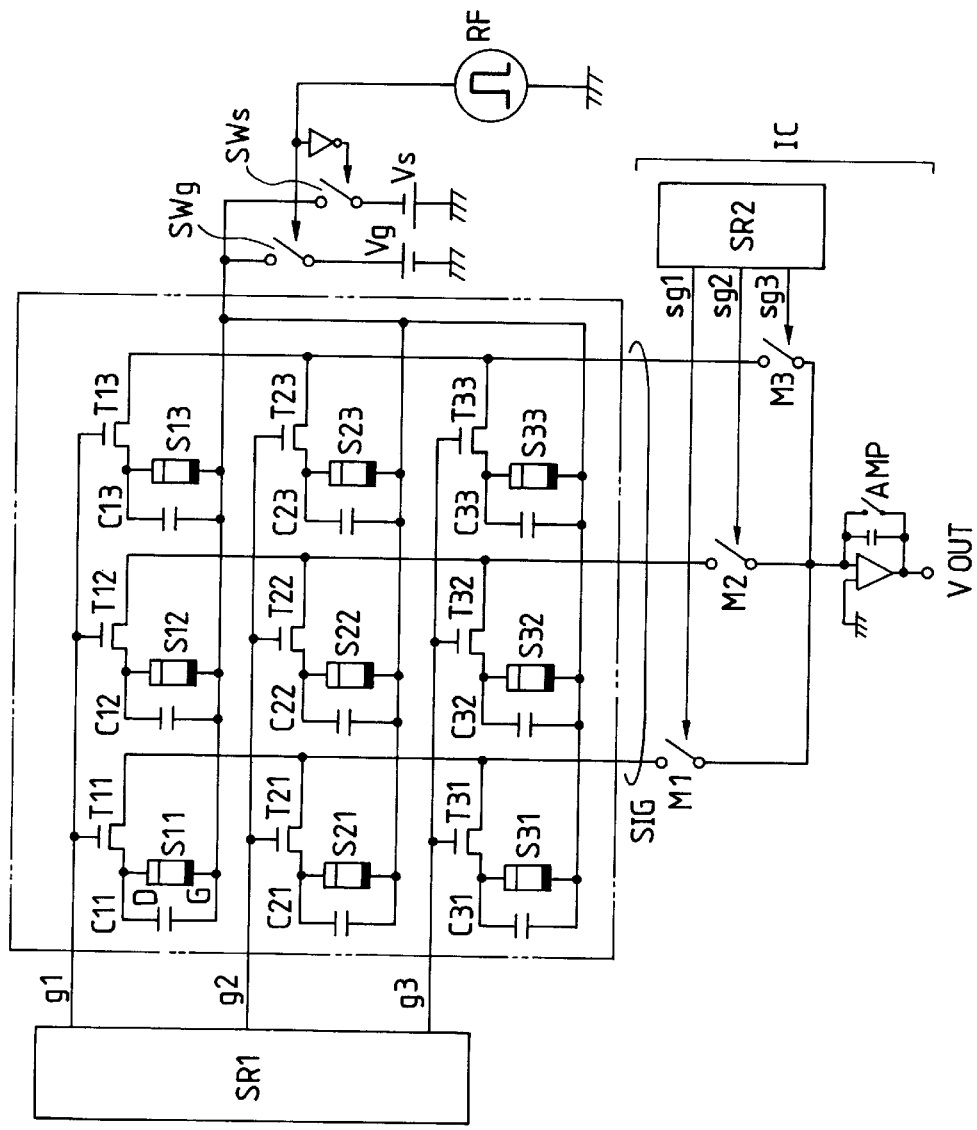
Figure 20A:
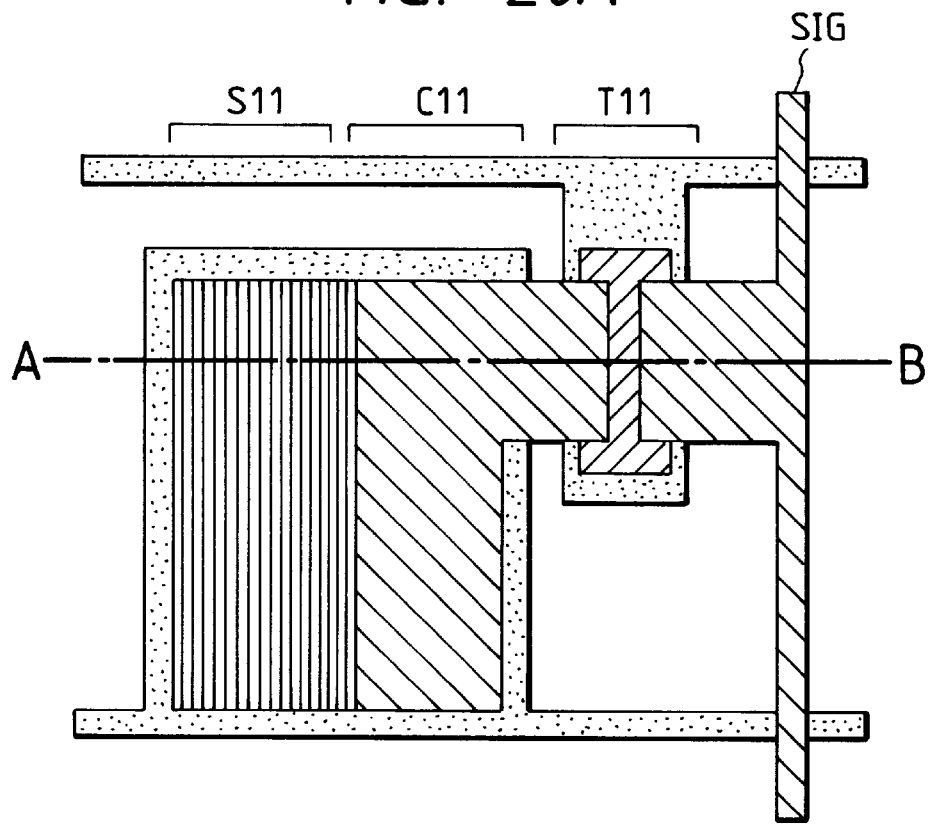
Figure 20B:
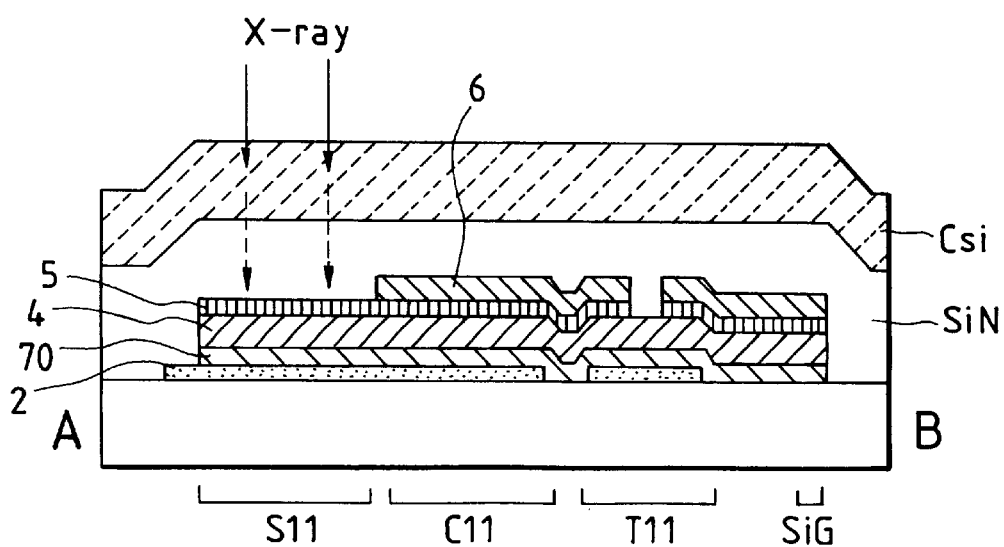

FIG. 19 is a general circuit diagram illustrating a ninth embodiment of the photoelectric converter of this invention, FIG. 20A is a top plan view of each component corresponding to a pixel in this embodiment, and FIG. 20B is a sectional view along line A-B in FIG. 20A. The same reference numerals in these drawings designate the same corresponding parts as for FIGS. 16 to 17B. Referring to FIG. 19, S11 to S33 indicate photoelectric converting elements; G is a lower electrode side and D is an upper electrode side. C11 to C33 are storage capacitors and T11 to T33 are transfer-TFTs. Vs is a read power supply and Vg is a refresh power supply, which are connected to the electrode G for the all photoelectric converting elements S11 to S33 via switches SWs and SWg, respectively. The switches SWs and SWg are connected to a refresh control circuit RF, via an inverter and directly, respectively, to be controlled so that the SWg is on during a refreshment period and SWs is on during other periods. A pixel comprises a photoelectric converting element, a capacitor, and TFTs, and its signal output is connected to a detection integrated circuit IC via a signal line SIG. In the photoelectric converter of this embodiment, the total nine pixels are classified into three blocks, their outputs (three pixels per block) are simultaneously transferred, and they are sequentially converted to outputs by the detection integrated circuit IC via the signal line SIG to be output (Vout). Pixels are arranged two-dimensionally with three pixels in each block arranged horizontally and three blocks arranged vertically.

The part enclosed by a dashed line is formed on an identical large-sized insulating substrate. FIG. 20A shows a top plan view of a part corresponding to a first pixel in the enclosed part. FIG. 20B shows a sectional view of a part indicated by a dashed line between A and B in FIG. 20A. S11, T11, C11, and SIG indicate a photoelectric converting element, a TFT, a capacitor, and a signal line, respectively. In this embodiment, the capacitor C11 is not especially separated from the photoelectric converting element S11, but the capacitor C11 is formed by enlarging an area of the electrodes for the photoelectric converting element S11. This can be achieved because of an identical layer structure for the photoelectric converting element and the capacitor, and it is a feature of this embodiment. A forming method of the layers is primarily the same as for the first embodiment, except that there is not an etching process for forming a contact hole since this embodiment does not have a contact hole. In addition, the top of each pixel is covered with a silicon nitride film SiN and a phosphor of cesium iodide CsI for passivation. When X rays are incident from an upper side, they are converted to light (arrows represented by dashed lines) by the phosphor CsI and the light impinges on the photoelectric element.

Figure 21:
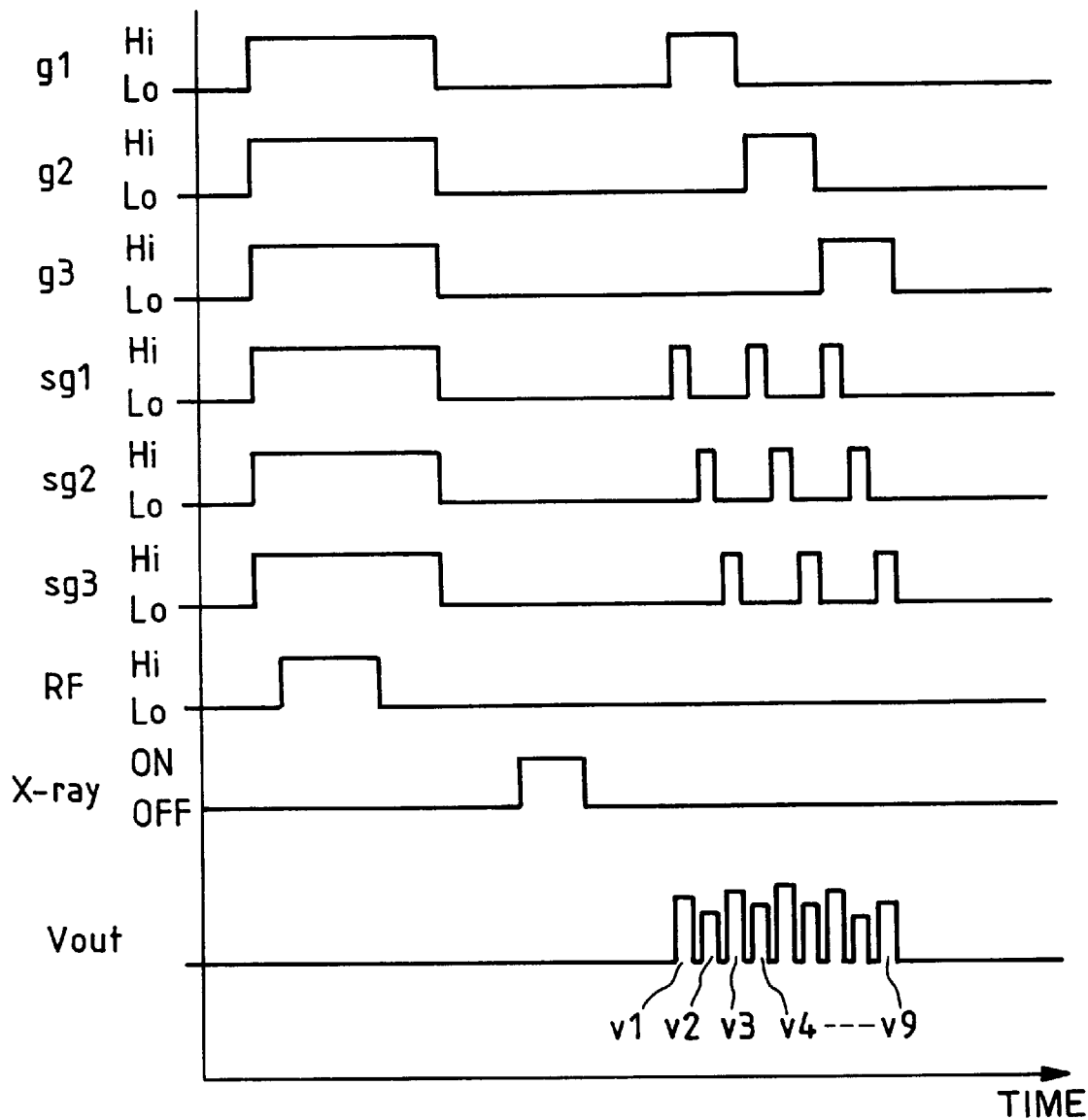

Next, referring to FIGS. 19 and 21, the operation of the photoelectric converter of this embodiment is described below. FIG. 21 is a timing diagram illustrating the operation of this embodiment.

First, an Hi control pulse is applied to control lines g1 to g3 and sg1 to sg3 by shift registers SR1 and SR2. Then, the transfer-TFTs T11 to T33 and switches M1 to M3 are turned on to conduct and GND potential is applied to the electrode D for the all photoelectric converting elements S11 to S33 (since an input terminal of an integrating detector Amp is designed to be the GND potential). At the same time, the refresh control circuit RF outputs an Hi control pulse and the switch SWg is turned on, then positive potential is applied to the electrode G for the all photoelectric converting elements S11 to S33 by the refresh power supply Vg. After that, the all photoelectric converting elements S11 to S33 are put into a refresh mode to be refreshed. Then, the refresh control circuit RF outputs an Lo control pulse and the switch SWs is turned on to apply negative potential to the electrode G for all the photoelectric converting elements S11 to S33 via the read power supply Vs. Then, all the photoelectric converting elements S11 to S33 enter a photoelectric conversion mode and the capacitors C11 to C33 are initialized. In this condition, a Lo control pulse is applied to control lines g1 to g3 and sg1 to sg3 by the shift registers SR1 and SR2. After that, the switches M1 to M3 of the transfer-TFTs T11 to T33 are turned off and the electrode D for all the photoelectric converting elements S11 to S33 is opened for direct current, but the potential is kept by the capacitors C11 to C33. At this time, however, an X ray is not incident, therefore, light does not impinge on the photoelectric converting elements S11 to S33 and no optical current flows. If an X ray is generated with pulsing, passes through a body, and then impinges on the phosphor CsI, it is converted to light and the light further impinges on the photoelectric converting elements S11 to S33. This light includes information on an internal structure of the body. Optical current which flows due to the light is stored as electric charges in the capacitors C11 to C33 and kept also after the X ray finished to be incident. Next, an Hi control pulse is applied to the control line g1 by the shift register SR1, v1 to v3 are sequentially output via the transfer-TFTs T11 to T13 and the switches M1 to M3 when the shift register SR2 applies a control pulse to the control lines sg1 to sg3. In the same manner, other optical signals are also sequentially output by a control of the shift registers SR1 and SR2. According to this, a two-dimensional information of the internal structure of the body is obtained as v1 to v9. To obtain a static image, only one operation in the above is needed, while the operation is repeated to obtain a dynamic image.

In this embodiment, the electrode G for the photoelectric converting elements is connected with a line, and the common line is controlled for potential of the refresh power supply Vg and the read power supply Vs via the switches SWg and SWs, therefore, all the photoelectric converting elements can be switched between the refresh mode and the photoelectric converting mode simultaneously. Accordingly, an optical output can be obtained with a single TFT per pixel without complicated controls.

Although nine pixels are two-dimensionally arranged in (3×3) to transfer and output three pixels at a time by dividing the pixels into three groups, the arrangement is not limited to it; for example, if (5×5) pixels horizontally and vertically per millimeter are two-dimensionally arranged as (2,000× 2,000) pixels, an X-ray detector of (40 cm×40 cm) can be obtained. Further if it is combined with an X-ray generator instead of an X-ray film to comprise an X-ray apparatus, the apparatus can be used for a chest X-ray examination or for a breast cancer examination. If it is so, its output can be displayed on a CRT display in an instant unlike using the X-ray film, and further the output can be digitally converted for image processing with a computer so that it can be converted to an output appropriately for each purpose. In addition, the output can be kept in a magneto-optic disk so that past images can be retrieved instantaneously. Sensitivity of the apparatus is better than that including the X-ray film and clearer images can be obtained with a feeble X ray which does not have so much effect on a body.

Figure 22:
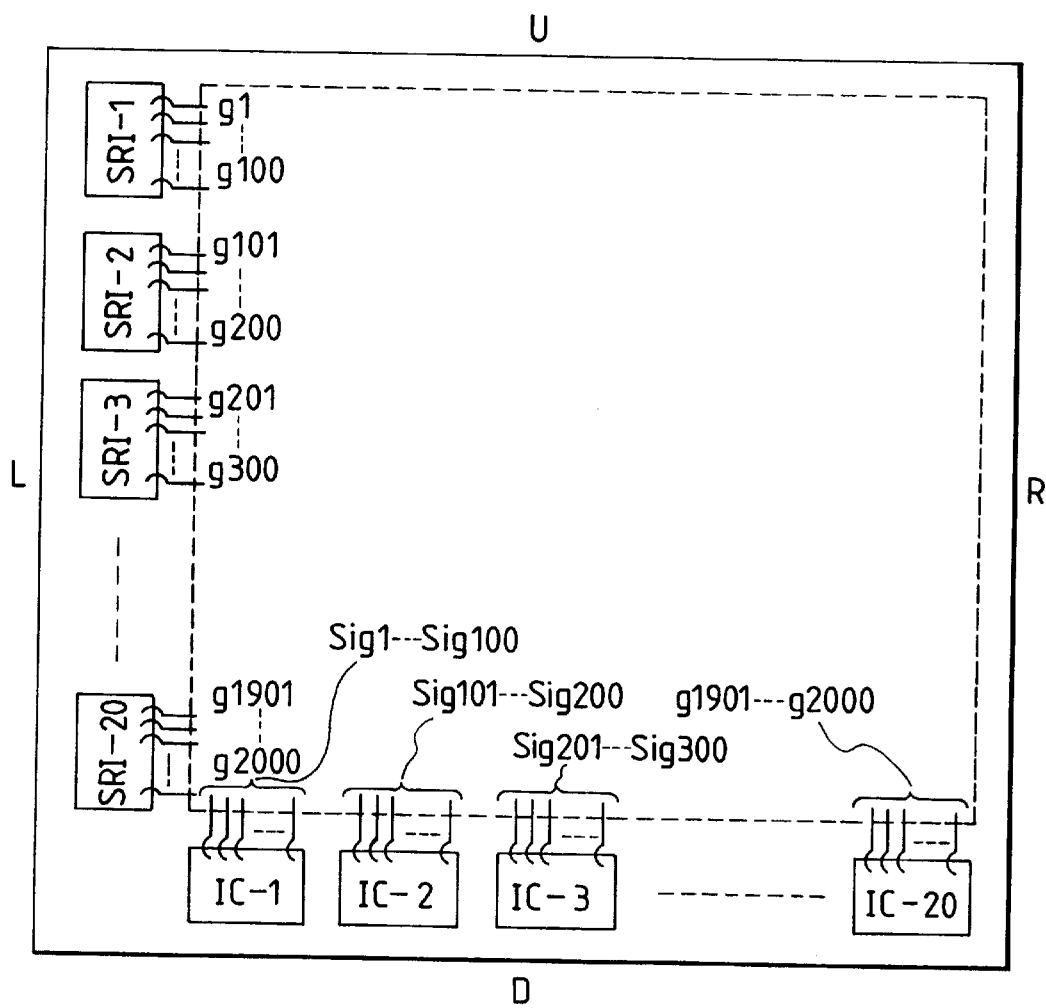
FIGS. 22 and 23 are typical arrangement diagrams for describing examples of mounting the photoelectric converter.
Figure 23:
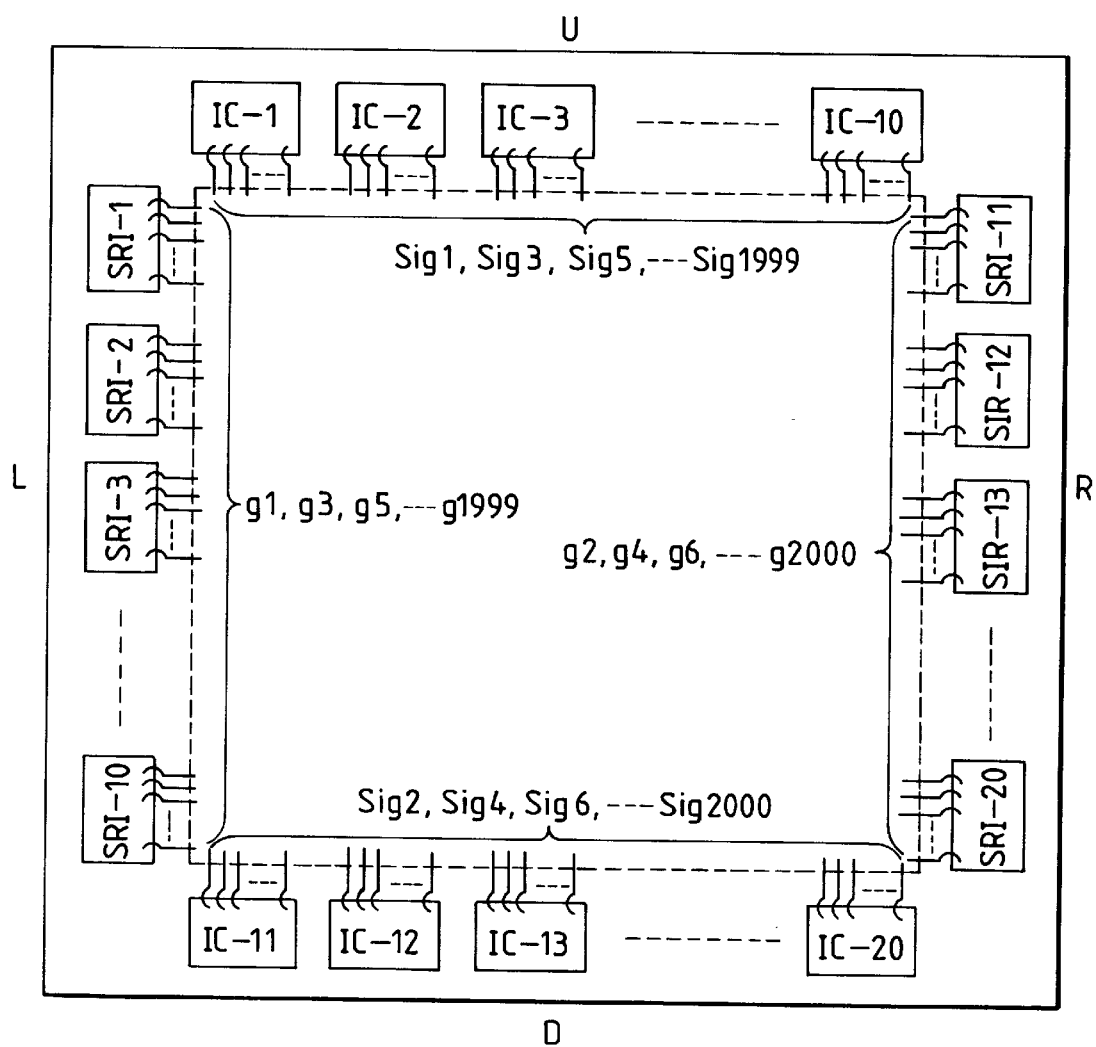

FIGS. 22 and 23 show concept diagrams illustrating implementation of a detector having (2,000×2,000) pixels. For a configuration of the (2,000×2,000) detector, it is required to increase the elements in the dashed line in FIG. 19 vertically and horizontally, in addition to an increase of the control lines g1 to g2,000 (2,000 lines) and of the signal lines SIG, sig1 to sig2,000 (2,000 lines). Further, the shift register SR1 and the detection integrated circuit IC must control or process the 2,000 lines on a large scale. If these operations are performed by a single chip element, the chip must be extremely enlarged, which is disadvantageous in an yielding ratio at manufacturing and prices. Accordingly, the shift register SR1 is formed, for example, with a single chip per 100 sections, so that 20 units (SR1-1 to SR1-20) can be used. The detection integrated circuit is also formed with a single chip per 100 processing circuits, so that 20 units (IC1 to IC20) can be used.

In FIG. 22, 20 chips are mounted each in the left side (L) (SR1-1 to SR1-20) and in the down side D, 100 control lines and signal lines per chip are connected to the chip with a wire-bonding method. A part enclosed by a dashed line in FIG. 22 corresponds to the part enclosed by the dashed line in FIG. 19. Connections to external portions are omitted. SWg, SWs, Vg, Vs, and RF are also omitted. There are 20 outputs (Vout) from the detection integrated circuits IC1 to IC20. These should be put together in a line via switches or be output directly for parallel processing.

Otherwise, as shown in FIG. 23, 10 chips can be mounted each in the left side (L) (SR1-1 to SR1-10), in the right side (R) (SR1-11 to SR1-20), in the upper side (U) (IC1 to IC10), and in the down side D (IC11 to IC20). In this configuration, the lines are distributed to the upper, down, left, and right sides (U, D, L, R) by 1,000 lines each, therefore, a wiring density of each side is lowered and the wire-bonding density of each side is also low, so that an yielding ratio is improved. As for distribution of the lines, g1, g3, g5, - - - , and g1,999 are distributed to the left side (L) and g2, g4, g6, - - - , g2,000 are distributed to the right side (R), in other words, the odd-numbered control lines are distributed to the left side (L) and even-numbered control lines are distributed to the right side (R). It further improves the yielding ratio since the lines are extracted at equal intervals to be wired without concentration of density. The lines can be distributed to the upper (U) and down (D) sides in the same manner. In addition, there is another embodiment which is not shown; g1 to g100, g201 to g300, - - - , and g1,801 to g1,900 are distributed to the left side (L) and g101 to g200, g301 to g400, - - - , g1,901 to g2,000 are distributed to the right side (R), i.e., the control lines are classified in units of contiguous control lines for each chip and then distributed to the left and right sides (L, R) alternately. This makes it possible to control the lines continuously in a chip, so that the circuits need not be complicated due to easy driving timing and lower cost circuits can be used. It is the same for the upper side (U) and the down side (D), and it makes it possible to perform continuous processing and to use lower cost circuits can be used.

In the examples shown in FIGS. 22 and 23, the circuit in the enclosed by the dashed line is formed on the substrate and then the chips can be mounted, or the circuit board and chips enclosed by the dashed line can be mounted on another large substrate. Otherwise, the chips are mounted on a flexible substrate and then it can be attached to the circuit board enclosed by the dashed line before its line connection.

It has been impossible to produce this photoelectric converter with a large area having an extremely large number of pixels in complicated processes using a conventional photosensor. The photoelectric converter of this invention, however, can be produced in a small number of and simple processes since the elements are simultaneously formed by a common films, therefore, it makes it possible to produce a large area and high performance photoelectric converter at low cost. Additionally, the capacitors and photoelectric elements can be composed in an identical element, which permits the elements to be reduced to half to improve the yielding ratio.

Figure 24:
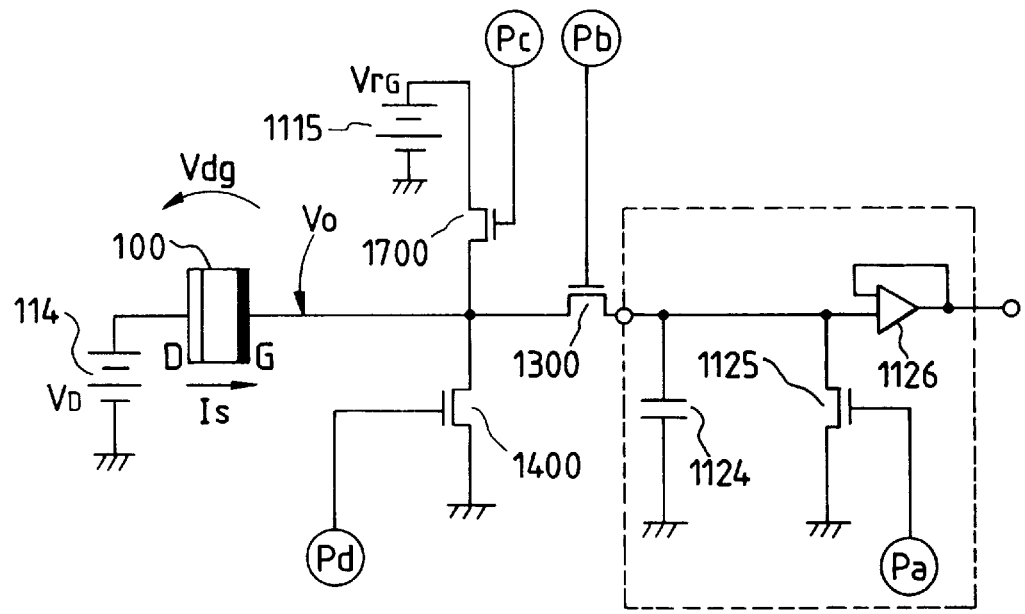

Next, inrush current and the refresh operation with TFTs are described again to help understanding of this invention. FIG. 24 is a single-bit equivalent circuit diagram of a photoelectric converter comprising a TFT 1,700 and a power supply 1,115 and FIG. 25 is a timing diagram showing its operation.

For simple explanation, description is made by using the single-bit equivalent circuit diagram of the photoelectric converter in FIG. 24 where positive potential is applied to an electrode G for photoelectric converting elements via the TFT 1,700. It is assumed that $V_D$ is applied to potential of the electrode D for the photoelectric converting elements by a power supply 1,114 and $V_{rG}$ is applied to potential of the electrode G at refresh operation by the power supply 1,115.

A photoelectric converting element 100 has the same configuration as for the photoelectric converting element 100 described in the first embodiment, and it is described below referring to FIG. 4A. As shown in FIG. 4A, if the potential ($V_0$) of the electrode G for the photoelectric converting element 100 is refreshed to a degree greater than the potential ($V_D$) of the electrode D ($V_0=V_{rG} \geq V_D$), the holes remaining in the i-layer 4 of the photoelectric converting element 100 and the holes trapped in interface defects on the interface between the i-layer 4 and the insulating layer 70 are completely ejected to the electrode D. To the contrary, electrons are injected from the electrode D to the i-layer 4 at this instant, and a part of them are trapped in interface defects on the interface between the i-layer 4 and the insulating layer 70. Hereinafter this current is referred to as negative inrush current. Then, when the potential of the electrode G for the photoelectric converting element 100 is initialized to GND potential or so after completion of the refresh operation, the electrons in the i-layer 4 and in the interface defects are completely ejected to the electrode D. Hereinafter this current is referred to as positive inrush current. Since an interface defect on the interface between the i-layer 4 and the insulating layer 70 generally has a deep energy level, it causes relatively higher energy for moving electrons and holes in the interface defects and for shifting electrons and holes from other locations to the interface defect locations, therefore causes lower apparent mobility. Accordingly, it takes several tens ps to several tens s. until the positive inrush current becomes zero, i.e., until all of the electrons trapped in the interface defects are ejected to the electrode D, and large inrush current flows also after a reset operation for the electrode G is completed. As a result, electric charges stored in a capacitance of the electrode G include charges generated by the inrush current which are noise elements, and it lowers a signal-to-noise ratio of the electric charges.

Figure 25:
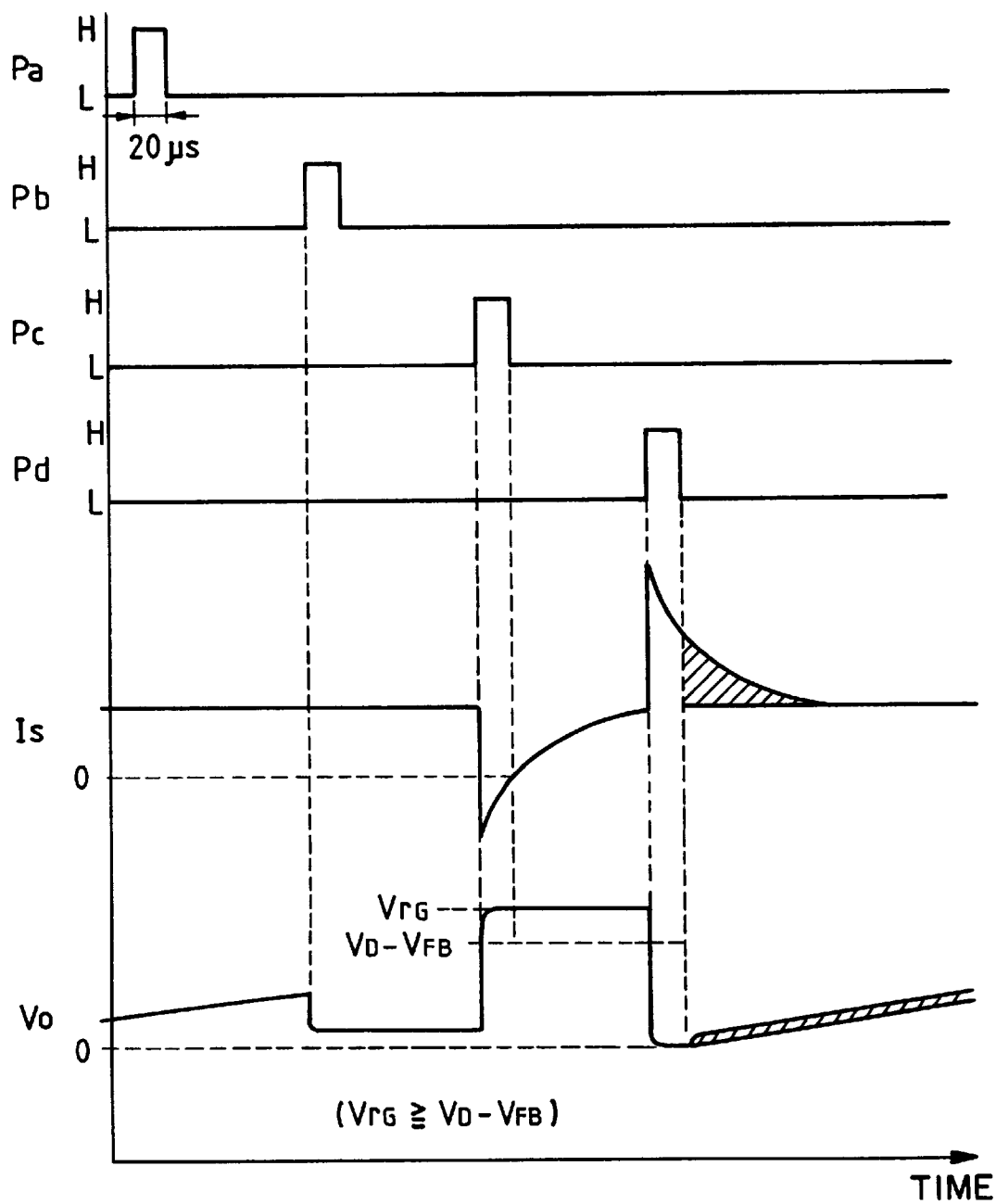

Referring to FIGS. 24 and 25, the above reasons are described further in detail.

Referring to FIG. 25, Pa, Pb, Pc, and Pd indicate timings for high level pulses generated to drive a switching element 1,125, a transfer-TFT 1,300, a refresh-TFT 1,700, and a reset-TFT 1,400 in FIG. 24, respectively; H indicates a high level where each driven element is turned on, generally using a level of approx. +5 to +12 V for crystallized silicon semiconductor switching element or of approx. +8 to +15 V for an a-Si TFT, and 0 V is often applied to L in general. $I_s$ and $V_o$ indicate current and potential of the electrode G flowing in each arrow direction, respectively, when a certain signal light is incident on the photoelectric converting element 100 as shown by the arrows in FIG. 24. FIG. 25 shows $I_s$ and $V_o$ at an operation with a 20 µs pulse width of Pa to Pd.

In FIG. 25, a fixed high potential is kept for $V_o$ from a pulse rise for refreshment on Pc to a pulse rise for reset on Pd. Accordingly, a positive inrush current is not generated during the period, and first positive inrush current occurs at a pulse rise on Pd due to ejection of electrons trapped in the interface defects mentioned above. Since it takes approx. 80 to 100 µs to attenuate this positive inrush current to substantially zero in the photoelectric converter produced by us, large positive inrush current occurs at a pulse fall on Pd when signal charges are started to be stored in the capacitance in the electrode G and charges and voltage values indicated by a shaded portion in FIG. 25 are stored as noise elements. As a result, the signal-to-noise ratio is lowered by the storage. Although the pulse time for reset on Pd can be extended to decrease the positive inrush current, there is a limit on the time and it also extends a time for reading signals entirely for the apparatus, which may result in lowering speed of the apparatus, i.e., lowering its performance.

Now, referring FIGS. 26A to 26C, description is made below for conditions on an applied voltage to refresh the photoelectric converting element 100.

Figure 26A:
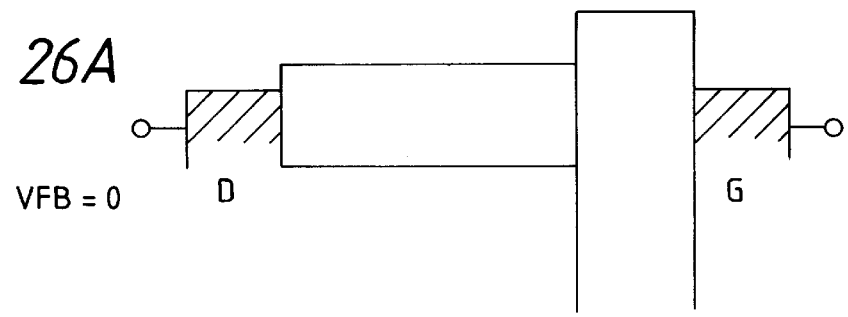
Figure 26B:
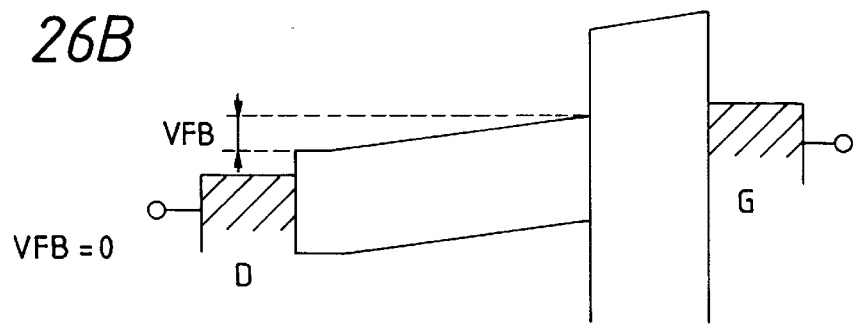
Figure 26C:
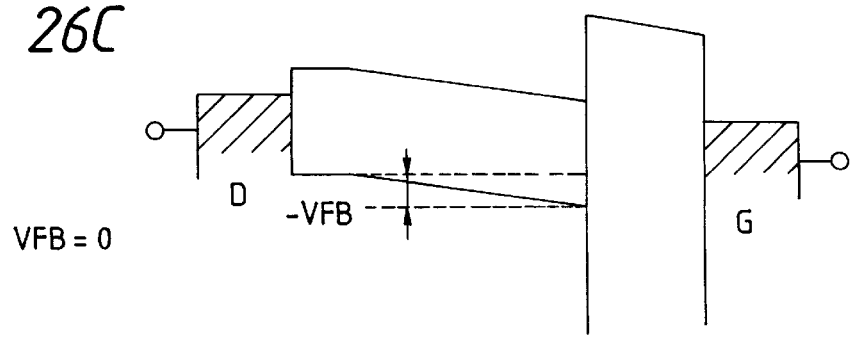

FIGS. 26A to 26C is an energy band diagrams of the photoelectric converting element 100; electrodes (electrodes D and G) at each end are opened. The photoelectric converting element 100 has generally called an MIS (metal insulator semiconductor) structure, and there appears a state in which the entire capacity is relatively low (a depression state) or in a state in which it is relatively high (an accumulation state) depending on conditions for a voltage applied to the electrodes at each end.

Although the electrodes at each end of the devices in FIGS. 26A to 26C are opened, FIG. 26B is an energy band diagram illustrating the above depression state and FIG. 26C is an energy band diagram illustrating the above accumulation state.

Generally, an MIS capacitor is often put in a state in FIG. 26A in which a band of the i-layer is flat (flat-band voltage $V_{FB}=0$ V) or in a state in FIG. 26B in which it is slightly in a depression state (3 $V \geq V_{FB} > 0$ V) immediately after it is manufactured. It is also possible to set an arbitrary positive or negative value to the $V_{FB}$ to some extent by applying a voltage across the MIS capacitor.

Now, the conditions on voltage values for causing positive inrush current (long decay time and a great current value) are summarized below from the above description.

When zero is set to the flat-band voltage $V_{FB}$ of the i-layer of the photoelectric converting element 100, positive inrush current flows if the potential ($V_{rG}$) of the electrode G at refreshment is higher than the potential ($V_D$) of the electrode D, i.e. $V_{rG} > V_D$.

When zero is not set to the flat-band voltage $V_{FB}$ of the i-layer of the photoelectric converting element 100, positive inrush current flows if the potential ($V_{rG}$) of the electrode G at refreshment is higher than or equivalent to a voltage value obtained by subtracting $V_{FB}$ from the potential ($V_D$) of the electrode D, i.e., $V_{rG} \geq V_D - V_{FB}$.

Figure 27A:
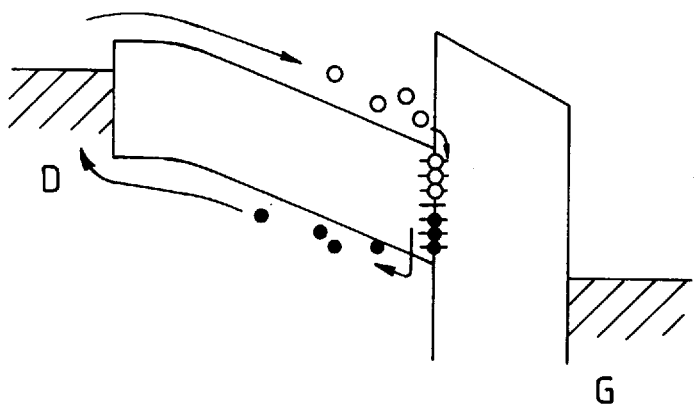
Figure 27B:
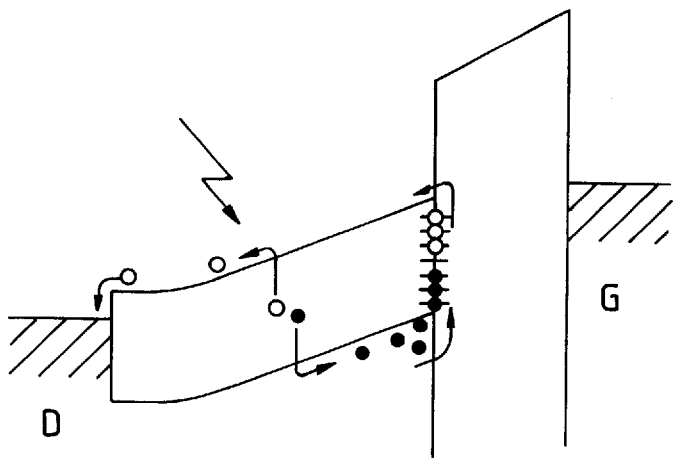
Figure 27C:
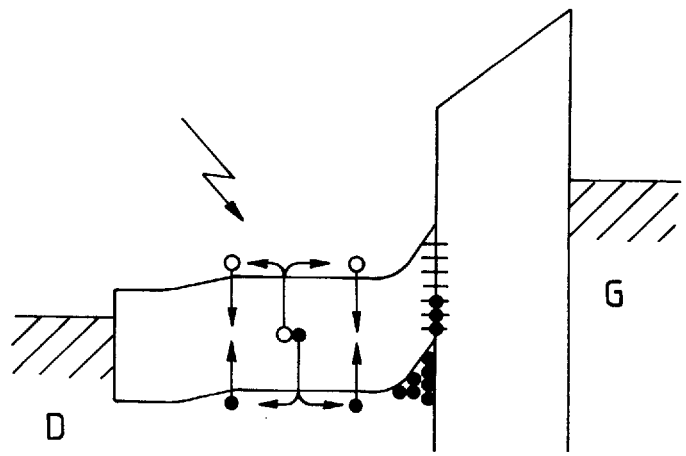

Referring to FIGS. 27A to 27C, the above mechanism is described below.

FIGS. 27A to 27C are energy band diagrams of the photoelectric converting element 100 for $V_{rG} \geq V_D - V_{FB}$ illustrating a state in a thickness direction of the layers from a lower electrode layer 2 to a transparent electrode layer 6 in FIG. 27A. In FIG. 27A in the refresh operation, the electrode D has potential negative to the electrode G, and therefore, holes represented by black dots in the i-layer 4 are introduced to the electrode D by an electric field. Simultaneously, electrons represented by circles are injected into the i-layer 4. Holes trapped in the interface defects on the interface between the i-layer 4 and the insulating layer 70 are introduced to the electrode D after a some elapsed time, and inversely a part of the electrons injected into the i-layer 4 are trapped in the interface defects on the interface between the i-layer 4 and the insulating layer 70 after a some elapsed time. At this instant, a part of holes and electrons are recombined in the n-layer 5 and the i-layer 4, then disappear. If this state continues for an enough long time, the holes in the i-layer are ejected from the i-layer. If the photoelectric converting operation in FIG. 27B is started in this state, the electrode D has potential positive to the electrode G, therefore, electrons in the i-layer 4 are introduced to the electrode D instantly. Then, the electrons trapped in the defects on the interface between the i-layer 4 and the insulating layer 70 are introduced to the electrode D after a some elapsed time. These electrons trapped in the interface defects a cause of the inrush current which is a subject of the above discussion. The holes are not introduced to the i-layer 4 since the n-layer 5 serves as an injection blocking layer. If light impinges on the i-layer 4 in this state, the light is absorbed and electron-hole pairs are generated. The electrons are introduced to the electrode D by the electric field, and the holes move in the i-layer 4 to reach the interface between the i-layer 4 and the insulating layer 70. The holes, however, cannot move to inside of the insulating layer 70, and remain in the i-layer 4. Then, a part of the holes are trapped in the interface defects. FIG. 27C shows a state after a certain period of time for the state in FIG. 27B illustrating the photoelectric converting operation.

Other embodiments of this invention will be explained particularly by using drawings.

[Tenth embodiment]

Figure 28:
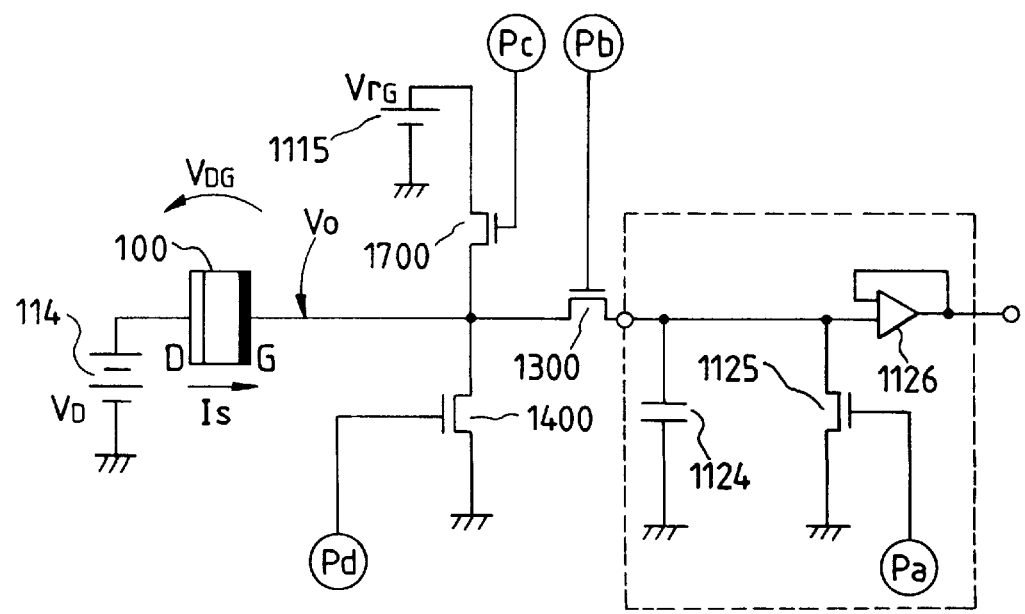
Figure 29:
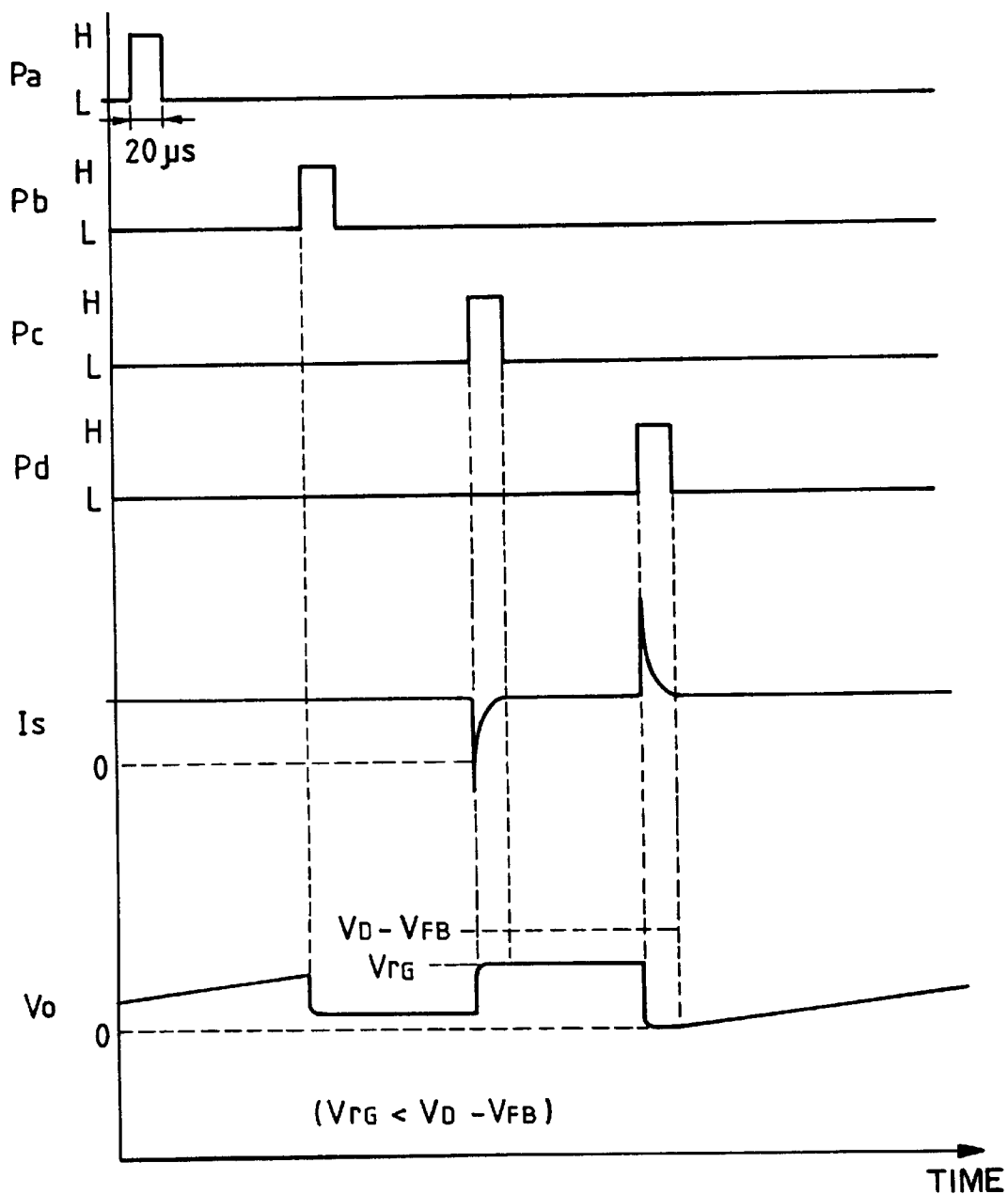

FIG. 28 is a schematic single-bit equivalent circuit diagram of a photoelectric converter in the tenth embodiment of this invention. FIG. 29 is a timing diagram for a practically driven photoelectric converter in FIG. 28.

As the same reference numerals in FIG. 28 designate the corresponding same parts as for FIG. 24, their explanation is omitted here. This embodiment is different from the schematic equivalent circuit in FIG. 24 in a size of a power supply connected to the TFT 1,700.

As a photoelectric converting section 100 has the same configuration as for the photoelectric converting section 100 in FIG. 4A, an injection blocking layer between the i-layer and a second electrode layer is an n-type semiconductor layer and carriers inhibited from being injected are holes. Therefore, assuming that a single carrier inhibited from being injected is q, q>0 in this condition.

In this embodiment, a signal detecting section includes detecting means within a rectangular range indicated by a dashed line in FIG. 28, a TFT 1,300, and a mean for applying a high-level pulse Pb.

FIG. 28 is different from FIG. 24 only in having lower potential $V_{rG}$ of a power supply 1,115 which applies positive potential to an electrode G in a refresh operation of the photoelectric converting section 100 than potential VD of a power supply 114 which applies positive potential to an electrode D. More specifically, as there is a flat-band voltage ($V_{FB}$) which is applied to the electrode G to flat an energy band of an i-layer in the photoelectric converting section 100, the photoelectric converter is practically driven in a state of $V_{rG} < V_D - V_{FB}$, while it is driven in the state of $V_{rG} \geq V_D - V_{FB}$ in FIG. 24.

Now, referring to FIG. 29, an operation of the photoelectric converter of this embodiment is described below.

FIG. 29 is different from FIG. 25 in behavior of potential $V_o$ of the electrode G caused by current $I_s$ and current $I_s$ of the photoelectric converting element 100.

In FIG. 29, when a refresh pulse of Pc rises and the voltage $V_{rG}$ ($V_{rG} < V_D - V_{FB}$) is applied to the electrode G of the photoelectric converting section 100, a part of the holes remaining in the i-layer are ejected to the electrode D. At this point, it can be assumed that almost all of the holes trapped in defects on an interface between the i-layer and an insulating layer are kept as they are. Additionally, although electrons whose amount is equivalent to the partial holes ejected to the electrode D or less are injected from the electrode D to the i-layer, it can be assumed that there will be substantially no electrons to be trapped in the defects on the interface between the i-layer and the insulating layer since potential in the electrode G side is lower in an electric field. Accordingly, there occurs only a small negative inrush current in the $I_s$ in FIG. 29 at a refresh pulse rise on Pc and its decay time is short. FIG. 29 shows that the voltage $V_o$ of the electrode G is almost equal to the $V_{rG}$ during a period from the refresh pulse rise to a G electrode reset pulse rise on Pd and its potential is lower than $V_D - V_{FB}$.

Next, when the G electrode reset pulse rises and the electrode G of the photoelectric converting section 100 is grounded to GND, all of some quantity of electrons remaining in the i-layer are ejected to the electrode D. It can be considered that a small amount of the electrons instantly flow out at this time since there are no electrons in the defects on the interface between the i-layer and the insulating layer. In addition, the holes in the defects on the interface will not move almost at all. Accordingly, only small positive inrush current occurs in the $I_s$ at the G electrode reset pulse rise on Pd and its decay time is short. If the photoelectric converter is operated at a speed of approx. 20 μs from the G electrode reset pulse rise on Pd to a G electrode reset pulse fall, the inrush current is lowered to substantially zero at the pulse fall on Pd when a photoelectric converting operation is started, as shown in FIG. 29. Therefore, almost all the electric charges started to be stored from the pulse fall on Pd are charges generated by signal light incident on the photoelectric converting section 100, and it is possible to obtain information with a high signal-to-noise ratio by reading its signal voltage. Signal detecting elements within a rectangular range indicated by a dashed line in FIG. 28 are not limited specifically and it is only required that they can detect current or charges directly or with integrated values. In addition, if signal charges are read out by means of a current meter or the like without being stored into a read capacitor 1,124, the read capacitor 1,124 and a potential initialization switching element 1,125 can be omitted, as mentioned in the above explanation.

A basic mechanism in this embodiment of this invention is more specifically described below by using drawings.

Figure 30A:
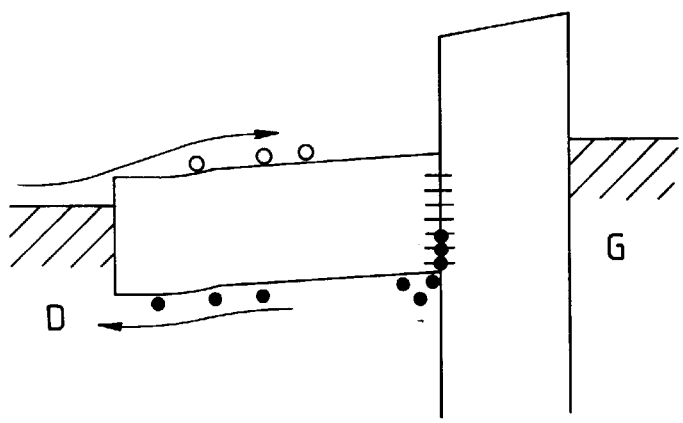
Figure 30B:
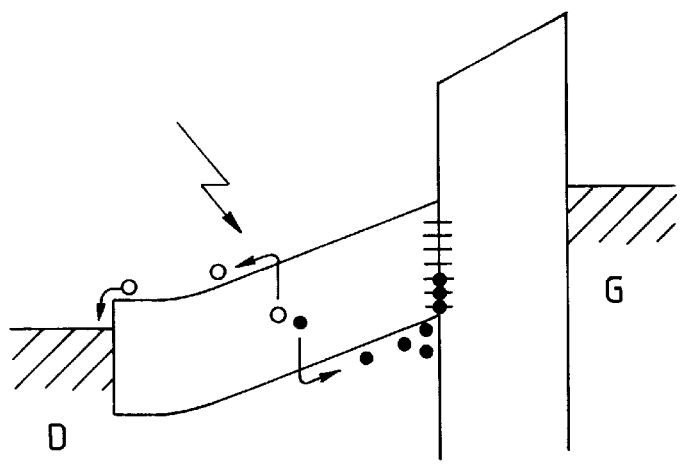
Figure 30C:
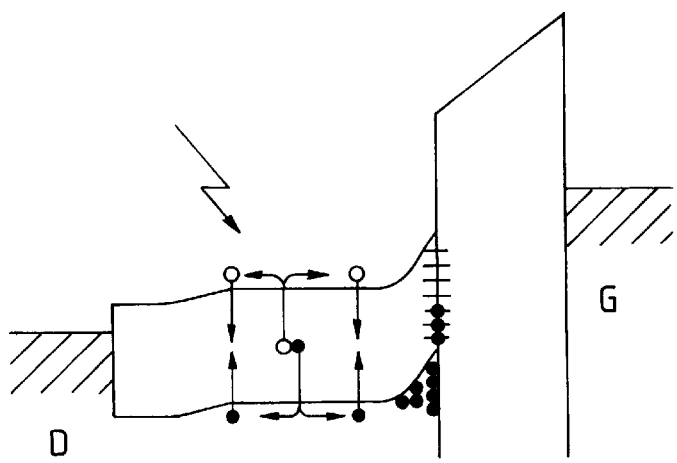

FIGS. 30A to 30C are energy band diagrams illustrating operations of the photoelectric converting section 100 for a state of $V_{rG} < V_D - V_{FB}$. They correspond with the energy bands in FIGS. 27A to 27C.

In FIG. 30A illustrating the refresh operation, the electrode D has potential positive to the electrode G, therefore, holes represented by black dots in the i-layer 4 are introduced to the electrode D by the electric field. Simultaneously, electrons represented by circles are injected into the i-layer 4. At this point, holes trapped in the defects on the interface between the i-layer 4 and the insulating layer 70 do not move substantially and electrons are not trapped in defects on the interface.

If the photoelectric converting operation in FIG. 30B is started in this state, larger potential negative to the electrode D is applied to the electrode G, therefore, electrons in the i-layer 4 are instantly introduced to the electrode D. However, there is almost no inrush current which is a problem in the photoelectric converter in FIG. 24 mentioned above since electrons trapped in interface defects do not exist substantially at all.

FIG. 30C shows a state after a certain period of time for the state in FIG. 30B illustrating the photoelectric converting operation.

According to this embodiment as mentioned above, it does not need a long period of time for ejection or injection since almost no electrons are present in the defects on the interface between the i-layer 4 and the insulating layer 70, which makes it possible to decrease considerably the inrush current which will be noise elements.

[11th embodiment]

Figure 31:
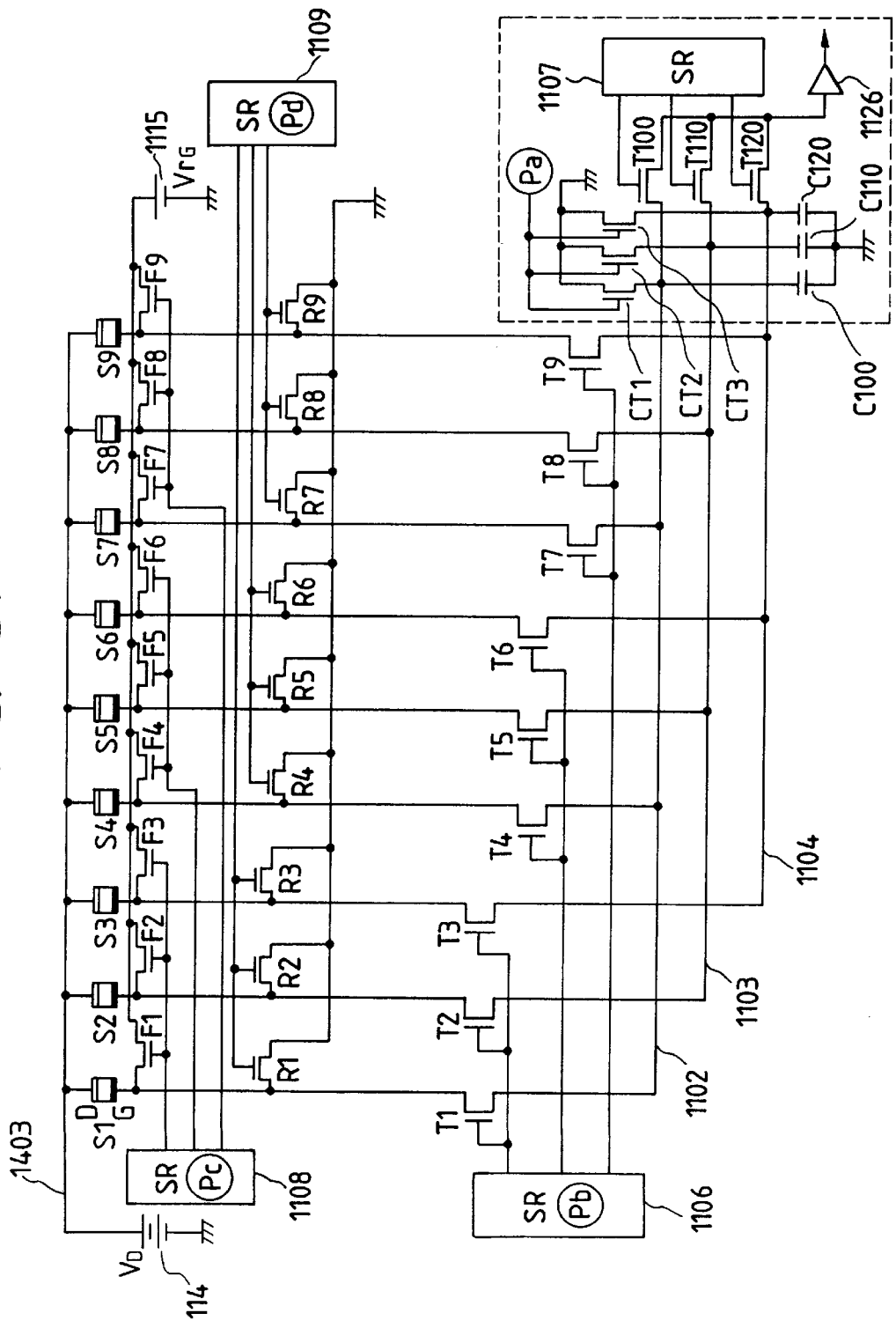

An 11th embodiment is described below by using FIGS. 31 and 32. FIG. 31 is a schematic equivalent circuit diagram illustrating a photoelectric converter of the 11th embodiment of this invention. The explanation is made by giving an example of a photoelectric converting element array including nine photoelectric converting elements being one-dimensionally arranged.

Figure 32:
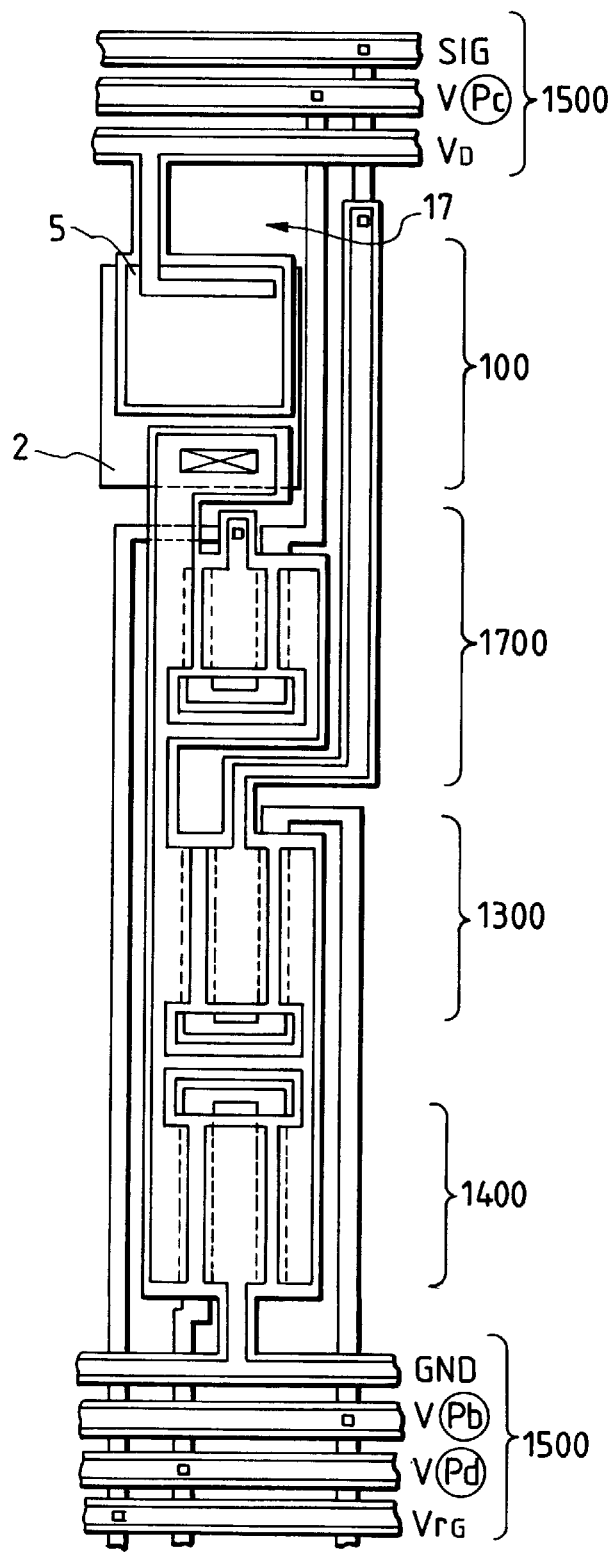

FIG. 32 is a typical plan view illustrating a photoelectric converting section 100 including a plurality of pixels in a longitudinal direction, a refresh-TFT section 1,700, a transfer-TFT section 1,300, a reset-TFT section 1,400, and a line section 1,500 for a single pixel.

In FIG. 32, the photoelectric converting section 100 includes a lower electrode 2 which also serves as a light shielding film against light from a substrate side. Light from the substrate side is reflected on a surface of an original copy (not shown) located perpendicularly upward against the drawing through a light window 17, and the reflected light impinges on the photoelectric converting section 100. Photocurrent caused by carriers generated at this point is stored in equivalent capacitive components of the photoelectric converting element 100 and other stray capacitance. The stored charges are transferred to the matrix signal line section 1,500 by the transfer-TFT 1,300 and read as a voltage by a signal processing section (not shown).

A second electrode layer is not specifically transparent. In this embodiment, an n-type injection blocking layer between an i-layer and the second electrode layer is used and carriers inhibited from being injected are holes. Therefore, assuming that q is a charge for a carrier inhibited from being injected, q>0 is satisfied in this condition, too.

Then, how to drive the photoelectric converter of the 11th embodiment is described below by using the circuit diagram.

In FIG. 31, photoelectric converting elements S1 to S9 constitute a photoelectric converting element array consisting of three blocks each of which is composed of three photoelectric converting elements. This configuration is also used for refresh-TFTs F1 to F9 each connected corresponding with the photoelectric converting elements S1 to S9, TFTs R1 to R9 for initializing potential of the electrode G for the photoelectric converting elements S1 to S9, and TFTs T1 to T9 for transferring signal charges.

An individual electrode having an identical order in each block of the photoelectric converting elements S1 to S9 is connected to one of common lines 1,102 to 1,104 via the transfer-TFTs T1 to T9. More specifically, the transfer-TFTs T1, T4, and T7 which belong to a first group of each block are coupled to the common line 1,102, the transfer-TFTs T2, T5, and T8 which belong to a second group of each block are to the common line 1,103, and then the transfer-TFTs T3, T6, and T9 which belong to a third group of each block are to the common line 1,104. The common lines 1,102 to 1,104 are coupled to an amplifier 1,126 via switching transistors T100 to T120, respectively.

Further in FIG. 31, the common lines 1,102 to 1,104 are grounded via common capacitors C100 to C120, respectively and also grounded via switching transistors CT1 to CT3. Each gate electrode for the switching transistors CT1 to CT3 is coupled via each common line to discharge remaining charges of the common lines 1,102 to 1,104 to GND for potential initialization by being turned on at the same timing as for the Pa pulse in FIG. 29. In this embodiment, a refresh means includes the TFTs F1 to F9, a shift register 1,108, a power supply 1,115, and a power supply 114, and a signal detecting section includes a detecting means enclosed by a dashed line in FIG. 31, the TFTs T1 to T9, and a shift register 1,106.

Next, the operation of the 11th embodiment is described in time series.

If signal light is incident on the photoelectric converting elements S1 to S9, charges are stored in equivalent capacitive components of the photoelectric converting section 100 and their stray capacitance depending on its intensity. Then, when a high level is output from a first parallel terminal of the shift register 1,106 and the transfer-TFTs T1 to T3 are turned on, the charges stored in the capacitive components and the stray capacitance are transferred to common capacitors C100 to C120. After that, a high level output from a shift register 1,107 is shifted and switching transistors T100 to T120 are sequentially turned on. This triggers sequential reading of light signals of the first block transferred to the common capacitors C100 to C120 via the amplifier 1,126.

After the transfer-TFTs T1 to T3 are turned off, a high level is output from a first parallel terminal of the shift register 1,108 and the refresh-TFTs F1 to F3 are turned on, which increases potential of the electrode G for the photoelectric converting elements S1 to S3. At this point, potential $V_{rG}$ of the power supply 1,115 is set in a condition represented by $V_{rG} < V_D - V_{FB}$, where $V_D$ is potential of the power supply 114 and $V_{FB}$ is a maximum flat-band voltage of all the photoelectric converting elements S1 to S9. Then, a part of holes in the photoelectric converting elements S1 to S3 are ejected to a common power supply line 1,403.

Next, a high level is output from a fist parallel terminal of a shift register 1,109 and the reset-TFTs R1 to R3 are turned on, which initializes potential of the electrode G for the photoelectric converting elements S1 to S3 to GND. Then, a Pa pulse triggers initialization of potential of the common capacitors C100 to C120. When the potential of the common capacitors C100 to C120 is completely initialized, the shift register 1,106 shifts data and a high level is output from a second parallel terminal. This turns on the transfer-TFTs T4 to T6, and it triggers a transfer of signal charges stored in equivalent capacitive components of the photoelectric converting elements S4 to S6 and the stray capacitance in the second block to the common capacitors C100 to C120. After that, in the same manner as for the first block, the switching transistors T100 to T120 are sequentially turned on by a shift of the shift register 1,107, and it starts sequential readout of light signals of the second block stored in the common capacitors C100 to C120.

Also for the third block, the charge transfer operation and the light signal read operation are performed in the same manner.

As mentioned above, signals for a line is completed to be read in a horizontal scanning direction on the original copy through a series of the operations from the first block to the third block, and then the read signals are output in an analog mode according to a reflectance degree of the original copy, i.e., according to a degree of an incident light quantity.

In the above explanation of the 10th and 11th embodiments, the configuration permits an inverse relationship between the holes and the electrons. For example, the injection blocking layer can be a p-layer. If it is so, the same operational result can be achieved as for the above embodiments by reversing the directions for applying the voltages and the electric fields and arranging other parts in the same manner in the 10th and 11th embodiments, where q<0 is satisfied for the electric charge q for the carrier inhibited from being injected by the injection blocking layer.

In addition, although a one-dimensional line sensor is explained in the 11th embodiment, it should be understood that a two-dimensional area sensor can be used by arranging a plurality of line sensors and that the above configuration permits a photoelectric converter for reading the same size of copies as for an information source such as an X-ray camera by using a block driving method described in the above embodiment.

As mentioned above, since an identical layer structure is used for the photoelectric converting elements, the TFTs, and the matrix signal line section in the 11th embodiment besides the features of the 10th embodiment, the layers can be formed in an identical process at a time, therefore, miniaturization and a high yielding ratio can be achieved, which makes it possible to produce a high signal-to-noise ratio photoelectric converter at low cost.

[12th embodiment]

Figure 33:
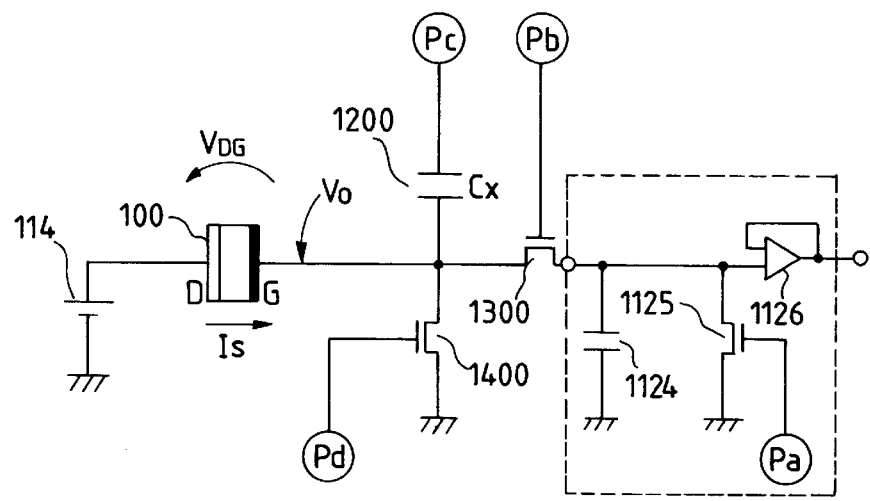
Figure 34:
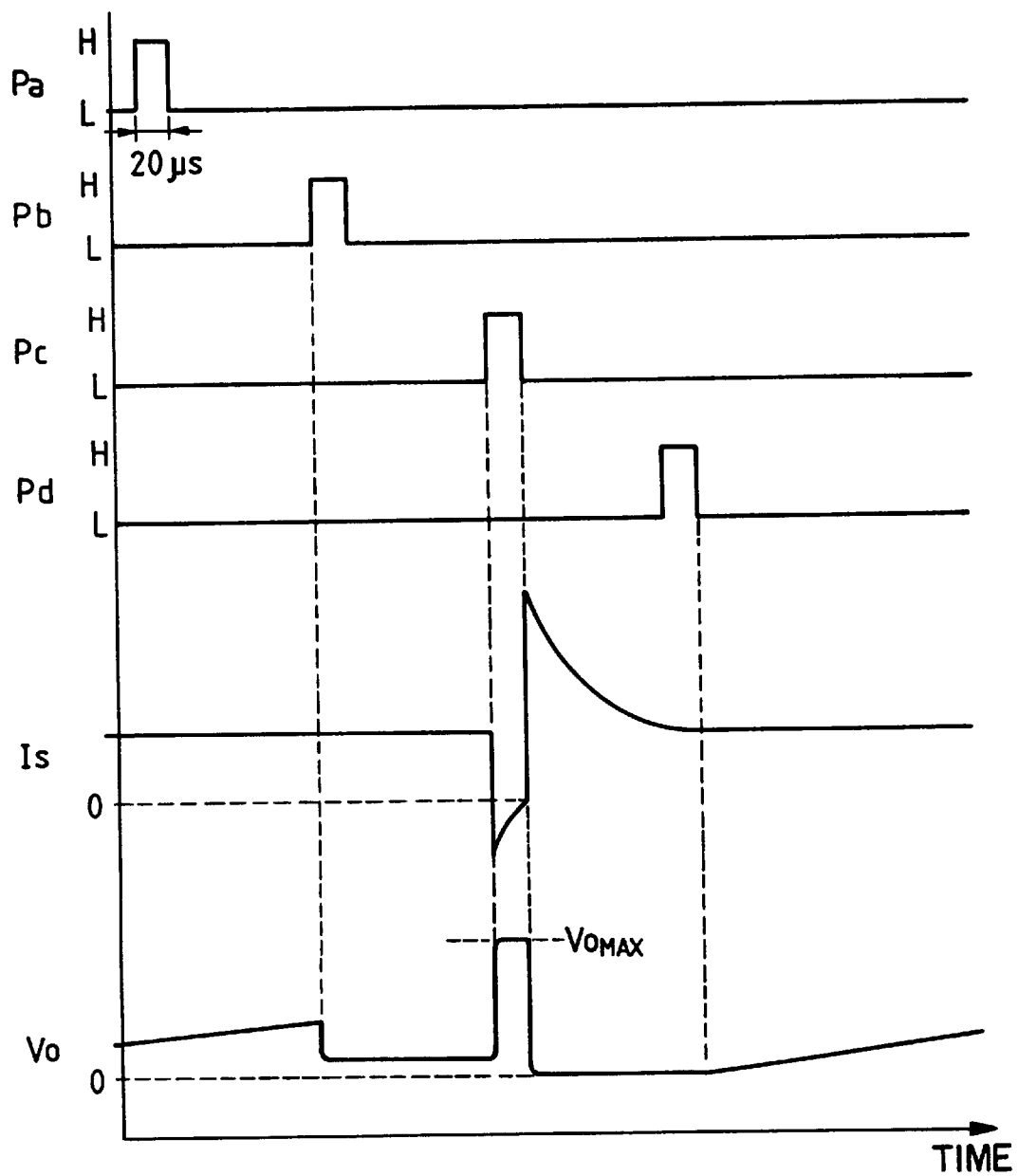

FIG. 33 is a single-bit schematic equivalent circuit diagram of a photoelectric converter of this embodiment, and FIG. 34 is a timing diagram illustrating an example of driving the photoelectric converter in FIG. 33.

The same reference numerals in FIG. 33 designate the corresponding same members as for FIG. 28. In FIG. 33, one electrode of a capacitor 1,200 is electrically connected to a photoelectric converting section 100 instead of a TFT 1,700 in FIG. 28, and the other electrode of the capacitor 1,200 is connected to a refresh pulse generating means Pc.

The capacitor 1,200 serves as a pulsing capacitive means which applies positive potential to an electrode G in a refresh operation of the photoelectric converting section 100.

A TFT 1,300 transfers signal charges in a detecting operation, and an initialize-TFT 1,400 initializes potential of the electrode G. A part enclosed by a dashed line is a signal detecting section, which generally comprises IC or other components and is shown as an example in FIG. 33. Reference numerals 1,124, 1,125, and 1,126 indicate a read capacitor, a switching element for initializing the read capacitor 1,124, and an operational amplifier, respectively. The signal detecting section is not limited to this example, but it is only required that it can detect current or charges directly or by integrated values. For example, if signal charges are not stored in the read capacitor 1,124, but are read out with a current meter, the read capacitor 1,124 and the switching element 1,125 for initializing potential can be omitted.

Now referring to FIG. 34, the operation of the photoelectric converter of this embodiment is described below with giving an example.

In the refresh operation of the photoelectric converting section, the potential of the electrode G is increased in this configuration only when a Pc high-level pulse is generated by supplying the refresh high-level pulse Pc to an electrode opposite to the electrode G of the capacitor 1,200 as shown in FIG. 34. Accordingly, holes remaining in the photoelectric converting section 100 are swept out to the electrode D and the photoelectric converting section 100 is refreshed. Afterward, the potential of the electrode G opposite to the capacitor 1,200 also falls instantly at the same time when the Pc refresh pulse falls, therefore, the sweep-out of the holes remaining in the photoelectric converting section 100 to the electrode D is completed to enter a photoelectric converting operation. Practically, since positive inrush current shown in FIG. 34 occurs in the photoelectric converting section 100 and then gradually attenuates, the photoelectric converting operation starts after the inrush current flows. Next, the TFT 1,400 is turned off by a Pd low potential (also referred to as "low level" hereinafter) pulse and the electrode G is opened for a direct current. Practically, however, the potential is kept by a capacitance of the capacitor 1,200 and equivalent capacitive components of the photoelectric converting section 100 or their stray capacitance. At this point, if a light signal of the photoelectric converting section 100 is incident, the corresponding current flows out of the electrode G to increase the potential of the electrode G. In other words, the incident light information is stored in a capacitance of the electrode G as electric charges. After a certain storing time, the transfer-TFT 1,300 is shifted from the off state to an on state by a Pb high-level pulse and the stored charges flow to the capacitor 1,124. The quantity of the charges is proportional to an integrated value of the current flowing out of the photoelectric converting section 100 in the photoelectric converting operation, in other words, it is detected by the detecting section through the operational amplifier 1,126 as a total quantity of the incident light. It is desirable that the potential of the capacitor 1,124 is initialized to GND potential by a Pa high-level pulse from the TFT 1,125 before this transfer operation. When the transfer-TFT 1,300 becomes off, the refresh-TFT 1,700 is set on by a Pc high-level pulse, and then the sequential operation is repeated after that. In this embodiment, the refresh means includes the capacitor 1,200, the high-level pulse Pc supplying means, and a power supply 114, and the signal detecting section includes the detecting means enclosed by the dashed line in FIGS. 30A to 30C, the TFT 1,300, and the high-level pulse Pb supplying means.

In this embodiment, positive inrush current is inhibited from occurring when signal charges are stored by supplying positive potential to the electrode G for the photoelectric converting elements via the capacitor 1,200 in the refresh operation.

As a method of reducing the positive inrush current, the time for the Pd initialization pulse can be extended. There, however, is a limit to the extended time, and the time extension also elongates the entire signal read time of the apparatus, which causes speed-down or lowering performance of the apparatus.

Accordingly, if the refresh operation is performed by the capacitor and timing is set appropriately in this embodiment, for example, if the photoelectric converter is operated at a speed of approx. 100 μs from the Pc pulse fall to the Pd G electrode potential initialization pulse fall, the inrush current stored as $V_o$ is lowered to substantially zero as shown in FIG. 34. Accordingly, almost all the electric charges started to be stored from the Pd pulse fall are charges generated by signal light incident on the photoelectric converting section 100, which makes it possible to obtain information with a high signal-to-noise ratio by reading its signal voltage. In addition, calculation is made to obtain potential $V_{o(refresh)}$ of the electrode G when the Pc high-level pulse ($V_{res}$) is supplied to it. Supposing that $C_O$ is a sum of stray capacitance coupled to the electrode G and equivalent capacitive components of the photoelectric converting section 100 and $C_x$ is a capacitance of the capacitor 1,200, $V_{o(refresh)}$ can be represented by the following expression:

$$V_{o(refresh)} = \{C_x/(C_o+C_x)\} \times V_{res}$$

Accordingly, $V_{o(refresh)}$ can be altered at will depending on a size of the capacitor $C_x$ to be inserted, which makes it possible to design more freely.

As apparent from the above description, signal charges can be stored in a condition that the positive inrush current is almost zero by applying the positive potential to the electrode G for the photoelectric converting section via the capacitor 1,200.

In this embodiment, a second electrode layer is not specifically transparent. Further, an n-type injection blocking layer is used between an i-layer and the second electrode layer and carriers inhibited from being injected are holes. Therefore, assuming that q is a charge for a carrier inhibited from being injected, q>0 is satisfied in this condition.

In the above explanation of this embodiment, the configuration permits an inverse relationship between the holes and the electrons. For example, the injection blocking layer can be a p-layer. If it is so, the same operational result can be achieved as for the above embodiment by reversing the directions for applying the voltages and the electric fields and arranging other parts in the same manner in this embodiment, where q<0 is satisfied for the electric charge q for the carrier inhibited from being injected by the injection blocking layer.

[13th embodiment]

Using FIGS. 35 to 37, the 13th embodiment of this invention is described below.

Figure 35:
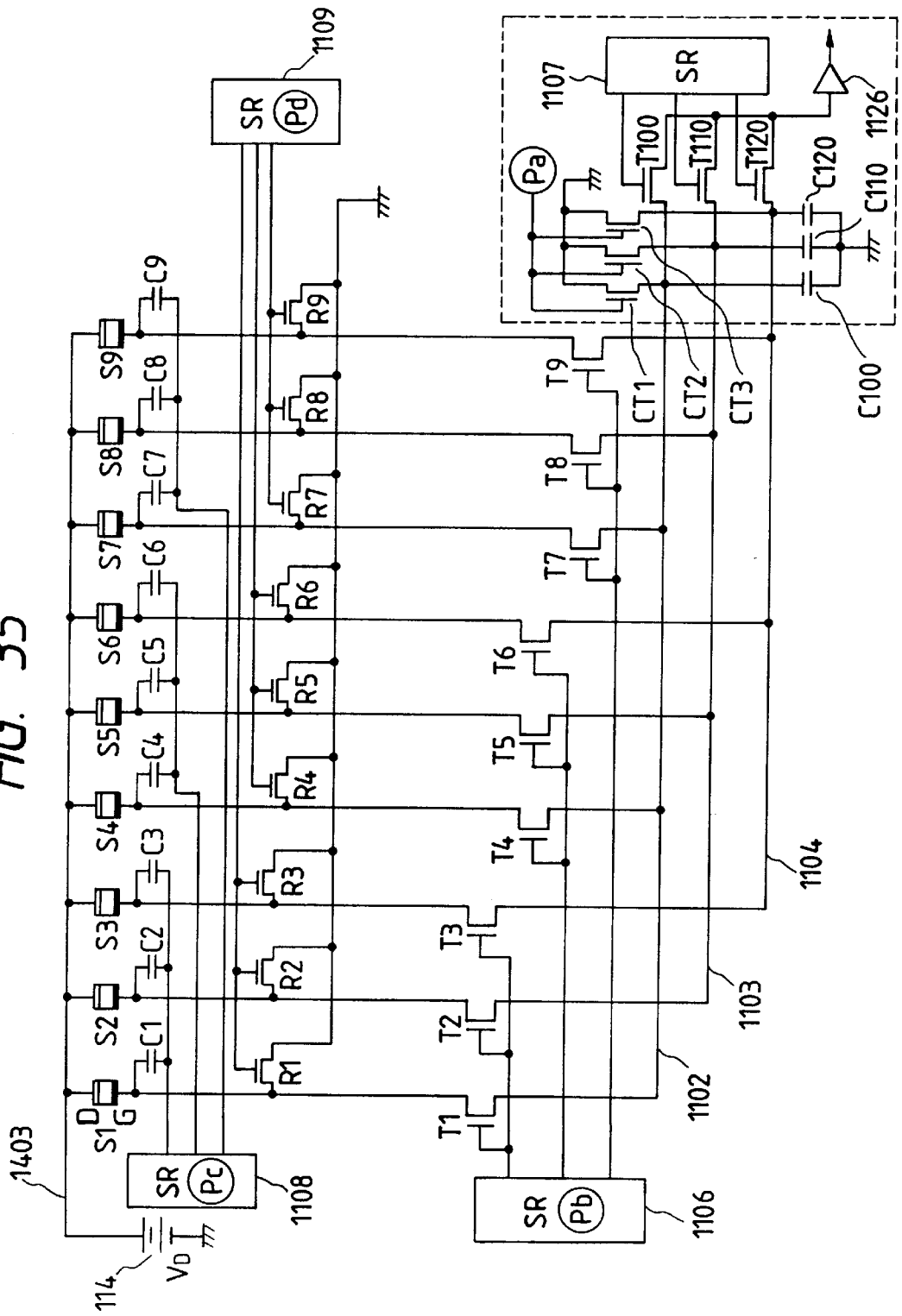

FIG. 35 is a schematic equivalent circuit diagram illustrating the photoelectric converter of the 13th embodiment of the present invention. The explanation is made by giving an example of a photoelectric converting element array including nine photoelectric converting elements being one-dimensionally arranged. FIG. 36 is a typical plan view illustrating a photoelectric converting section including a plurality of pixels in a longitudinal direction, a refresh capacitor section, a refresh-TFT section, a reset-TFT section, and a line section for a single pixel. FIG. 37 is a sectional view of a single pixel. FIG. 37 is typically drawn for understanding and the position of the line section does not match the position in FIG. 36 completely. Additionally, the reset-TFT section 1,400 is not shown. The same reference numerals in FIGS. 35 to 37 indicate the same corresponding parts as for FIG. 33.

Figure 36:
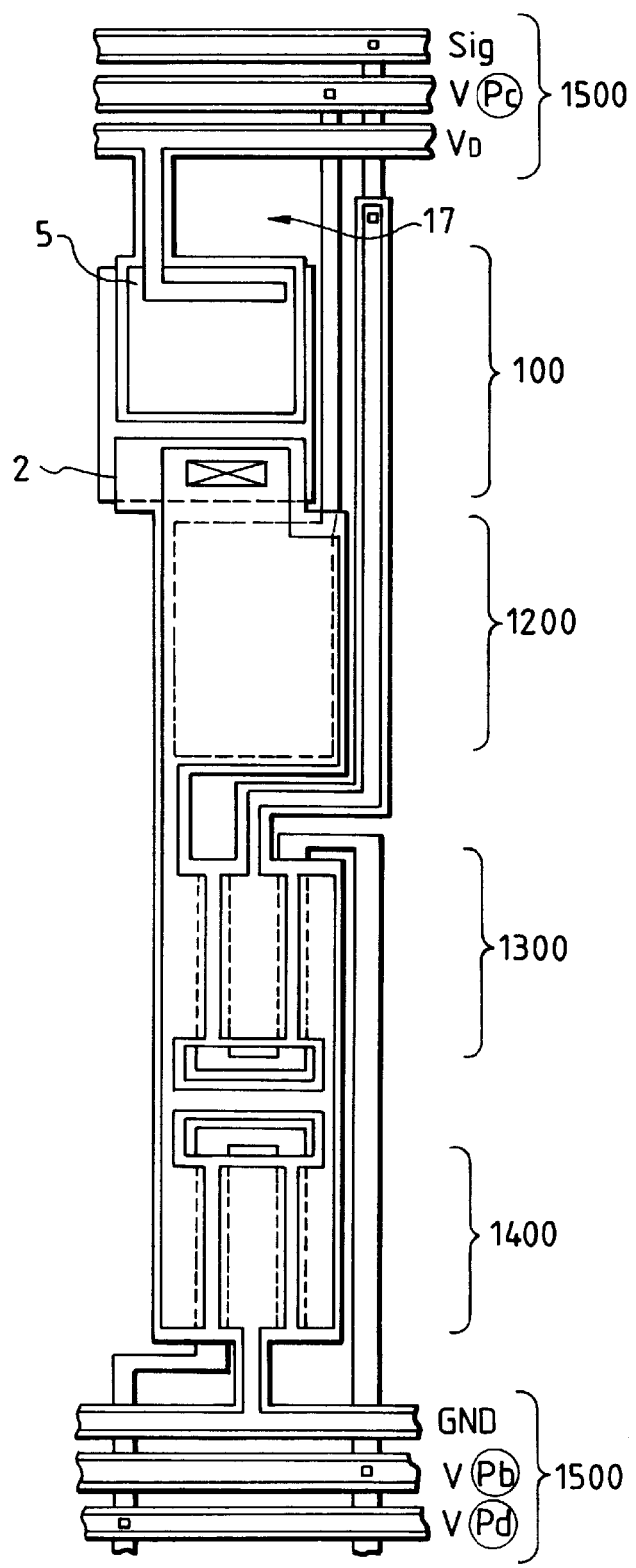

In FIG. 36, the photoelectric converting section 100 includes a lower electrode 2 which also serves as a light shielding film against light from a substrate side. Light from the substrate is reflected on a surface of an original copy (not shown) located perpendicularly upward against the drawing through a light window 17, and the reflected light impinges on the photoelectric converting section 100. Photocurrent caused by carriers generated at this point is stored in equivalent capacitive components of the photoelectric converting element 100 and other stray capacitance. The stored charges are transferred to a matrix line section 1,500 by the transfer-TFT 1,300 and read as a voltage by a signal processing section (not shown).

Using FIG. 37, a layer structure of the sections is roughly described below.

Figure 37:
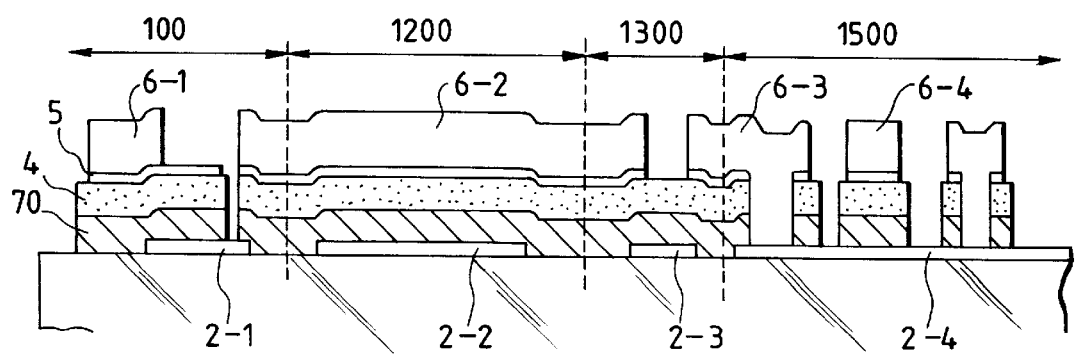

In FIG. 37, the photoelectric converting section 100, the refresh capacitor 1,200, the transfer-TFT 1,300, and the line section 1,500 have an identical layer structure consisting of five layers; a first electrode layer including 2-1, 2-2, 2-3, and 2-4, an insulating layer 70, an i-layer 4, an n-layer 5, and a second electrode layer including 6-1, 6-2, 6-3, and 6-4. The second electrode layer is not specifically transparent.

Since the photoelectric converting section 100 in this embodiment has also the same structure as for the first embodiment, an n-type injection blocking layer is used between the i-layer 4 and the second electrode layer 6-1 and carriers inhibited from being injected are holes. Therefore, assuming that q is a charge for a carrier inhibited from being injected, q>0 is satisfied in this condition, too.

Then, how to drive the photoelectric converter of this embodiment is described below by using FIG. 35.

In FIG. 35, photoelectric converting elements S1 to S9 constitute a photoelectric converting element array consisting of three blocks each of which is composed of three photoelectric converting elements. This configuration is also used for refresh capacitors C1 to C9 each correspondingly coupled to the photoelectric converting elements S1 to S9, TFTs R1 to R9 for initializing potential of the electrode G for the photoelectric converting elements S1 to S9, and TFTs T1 to T9 for transferring signal charges.

An individual electrode having an identical order in each block of the photoelectric converting elements S1 to S9 is connected to one of common lines 1,102 to 1,104 via the transfer-TFTs T1 to T9. More specifically, the transfer-TFTs T1, T4, and T7 which belong to a first group of each block are coupled to the common line 1,102, the transfer-TFTs T2, T5, and T8 which belong to a second group of each block are to the common line 1,103, and then the transfer-TFTs T3, T6, and T9 which belong to a third group of each block are to the common line 1,104. The common lines 1,102 to 1,104 are coupled to an amplifier 1,126 via switching transistors T100 to T120, respectively.

Further in FIG. 35, the common lines 1,102 to 1,104 are grounded via common capacitors C100 to C120, respectively and also grounded via switching transistors CT1 to CT3. Each gate electrode for the switching transistors CT1 to CT3 is coupled via each common line to discharge remaining charges of the common lines 1,102 to 1,104 to GND for potential initialization by being turned on at the same timing as for the Pa pulse in FIG. 34.

In this embodiment, a refresh means includes the capacitors C1 to C9, a shift register 1,108, and a power supply 114, and a signal detecting section includes a detecting means enclosed by a dashed line in FIG. 35, the TFTs T1 to T9, and a shift register 1,106.

Next, the operation of this embodiment is described in time series below.

If signal light is incident on the photoelectric converting elements S1 to S9, electric charges are stored from the power supply 114 into refresh capacitors C1 to C9, equivalent capacitive components of the photoelectric converting section 100, and their stray capacitance depending on its intensity. Then, when a high level is output from a first parallel terminal of the shift register 1,106 and the transfer- TFTs T1 to T3 are turned on, the charges stored in the refresh capacitors C1 to C3, the capacitive components, and the stray capacitance are transferred to common capacitors C100 to C120. After that, a high level output from a shift register 1,107 is shifted and switching transistors T100 to T120 are sequentially turned on. This starts sequential readout of light signals of the first block transferred to the common capacitors C100 to C120 via the amplifier 1,126.

After the transfer-TFTs T1 to T3 are turned off, a high level is output from a first parallel terminal of the shift register 1,108 and it increases potential across the refresh capacitors C1 to C3. Then, the holes in the photoelectric converting elements S1 to S3 are swept out to a common power supply line 1,403.

Next, a high level is output from a first parallel terminal of a shift register 1,109 and the reset-TFTs R1 to R3 are turned on, which initializes potential of the electrode G for the photoelectric converting elements S1 to S3 to GND. Then, a Pa pulse triggers initialization of potential of the common capacitors C100 to C120. When the potential of the common capacitors C100 to C120 is completely initialized, the shift register 1,106 shifts data and a high level is output from a second parallel terminal. This turns on the transfer-TFTs T4 to T6, and it starts a transfer of signal charges stored in the refresh capacitors C4 to C6, the stray capacitance, and the sensor equivalent capacitive components in the second block to the common capacitors C100 to C120. After that, in the same manner as for the first block, the switching transistors T100 to T120 are sequentially turned on by a shift of the shift register 1,107, and it starts sequential readout of light signals of the second block stored in the common capacitors C100 to C120.

Also for the third block, the charge transfer operation and the light signal read operation are performed in the same manner.

Like this, signals for a line is completed to be read in a horizontal scanning direction on the original copy through a series of the operations from the first block to the third block, and then the read signals are output in an analog mode according to a reflectance degree of the original copy.

As explained in this embodiment by using FIG. 37, the photoelectric converting elements, the refresh capacitors, the transfer-TFTs, the reset-TFTs, and the matrix signal line section have an identical layer structure consisting of five layers including the first electrode layer, the insulating layer, the i-layer, the n-layer, and the second electrode layer, but all the elements do not need to have the same layer structure necessarily. It is only required that at least the photoelectric converting elements have this (MIS) structure and that other elements each have a layer structure which allows it to serve as each element. If they have the identical layer structure, however, it is more effective to improve a yielding ratio and to lower the cost.

In addition, in the above explanation of this embodiment, the configuration permits an inverse relationship between the holes and the electrons. For example, the injection blocking layer can be a p-layer. If it is so, the same operational result as for the first embodiment can be achieved by reversing the directions for applying the voltages and the electric fields and arranging other parts in the same manner in this embodiment, where q<0 is satisfied for the electric charge q for the carrier inhibited from being injected by the injection blocking layer.

Although a one-dimensional line sensor is explained in this embodiment, it should be understood that a two-dimensional area sensor can be achieved by arranging a plurality of line sensors and that the above configuration permits a photoelectric converter for reading the same size of copies as for an information source such as an X-ray camera by using a block driving method described in the above embodiment.

As mentioned above, since an identical layer structure is used for the photoelectric converting elements, the TFTs, and the matrix signal line section in this embodiment, the layers can be formed in an identical process at a time, therefore, miniaturization and a high yielding ratio can be achieved, which makes it possible to produce a high signal-to-noise ratio photoelectric converter at low cost.

As apparent from the above description, the photoelectric converting elements are not limited to those shown by the embodiment. More specifically, it is only required that there are the first electrode layer, the insulating layer for blocking the movement of holes and electrons, the photoelectric converting semiconductor layer, and the second electrode layer, in addition to the injection blocking layer for blocking injection of holes into the photoelectric converting semiconductor layer between the second electrode layer and the photoelectric converting semiconductor layer. In addition, the photoelectric converting semiconductor layer only needs to have a photoelectric converting function of generating electron-hole pairs due to incident light. As for a layer structure, not only a single layer structure, but a multiple layer structure can be used and its characteristics can be altered repeatedly.

In the same manner, the TFTs each only need to have a gate electrode, a gate insulating layer, a semiconductor layer in which channels can be formed, an ohmic contact layer, and a main electrode. For example, the ohmic contact layer can be a p-layer. If it is so, a hole can be used as a carrier by reversing a control voltage of the gate electrode.

Additionally in the same manner, the capacitors each only need to have a lower electrode layer, a middle layer including an insulating layer, and an upper electrode layer, for example, they need not be especially separated from the photoelectric converting elements or the TFTs and it is possible to have a configuration in which they also serve as the electrode section for the photoelectric converting elements.

Further, the insulating substrate need not be always an insulator, and it can be a conductor or a semiconductor on which an insulator is laid.

In addition, since the photoelectric converting element itself has a function of accumulating charges, it is possible to obtain an integrated value of light information for a certain period without specific capacitors.

[14th embodiment]

The photoelectric converter illustrated in the schematic equivalent circuit diagram in FIG. 33 described in the 13th embodiment can be driven at a timing illustrated in a timing diagram in FIG. 38.

Now referring to FIG. 38, the operation of the photoelectric converter of this embodiment is described below.

In the refresh operation of photoelectric converting elements, the potential of the electrode G is increased in this configuration only when a Pc high-level pulse is generated by supplying the refresh high-level pulse Pc to an electrode opposite to the electrode G of the capacitor 1,200 as shown in FIG. 38. Accordingly, holes remaining in the photoelectric converting section 100 are swept out to the electrode D and the photoelectric converting section 100 is refreshed.

Afterward, the potential of the electrode G opposite to the capacitor 1,200 also falls instantly at the same time when the Pc refresh pulse falls, therefore, the sweep-out of the holes remaining in the photoelectric converting section 100 to the electrode D is completed to enter a photoelectric converting operation. Practically, since positive inrush current shown in FIG. 38 occurs in the photoelectric converting section 100 and then gradually attenuates, the photoelectric converting operation starts after the inrush current flows.

Next, the TFT 1,400 is turned off by a Pd low potential (also referred to as "low level" hereinafter) pulse and the electrode G is opened for a direct current. Practically, however, the potential is kept by a capacitance of the capacitor 1,200 and equivalent capacitive components of the photoelectric converting section 100 or their stray capacitance. At this point, if a light signal of the photoelectric converting section 100 is incident, the corresponding current flows out of the electrode G to increase the potential of the electrode G.

In other words, the incident light information is stored in a capacitance of the electrode G as electric charges. After a certain storing time, the transfer-TFT 1,300 is shifted from the off state to an on state by a Pb high-level pulse and the stored charges flow to the capacitor 1,124. The quantity of the charges is proportional to an integrated value of the current flowing out of the photoelectric converting section 100, in other words, it is detected by the detecting section through the operational amplifier 1,126 as a total quantity of the incident light. It is desirable that the potential of the capacitor 1,124 is initialized to GND potential by a Pa high-level pulse from the TFT 1,125 before this transfer operation.

When the transfer-TFT 1,300 becomes off, the refresh-TFT 1,700 is set on by a Pc high-level pulse, and then the sequential operation is repeated after that. In this embodiment, the refresh means includes the capacitor 1,200, the high-level pulse Pc supplying means, and a power supply 114, and the signal detecting section includes the detecting means enclosed by the dashed line in FIG. 33, the TFT 1,300, and the high-level pulse Pb supplying means.

In this embodiment, positive inrush current (which does not have a condition indicated by a solid line on Is in FIG. 38) is inhibited from occurring when signal charges are stored by supplying positive potential which is smaller than a fixed potential to the electrode G for the photoelectric converting elements via the capacitor 1,200 in the refresh operation (If the potential is greater than the fixed potential, the current shows a condition indicated by a dashed line).

As a method of reducing the positive inrush current, the time for the Pd initialization pulse can be extended. There, however, is a limit to the extended time, the time extension also elongates the entire signal read time of the apparatus, which causes speed-down or lowering performance of the apparatus.

Accordingly, if the refresh operation is performed by the capacitor and timing is set appropriately in this embodiment, for example, if the photoelectric converter is operated at a speed of approx. 100 µs from the Pc pulse fall to the Pd G electrode potential initialization pulse fall, the inrush current stored as $V_o$ is lowered to substantially zero as shown in FIG. 38. Accordingly, almost all the electric charges started to be stored from the Pd pulse fall are charges generated by signal light incident on the photoelectric converting section 100, which makes it possible to obtain information with a high signal-to-noise ratio by reading its signal voltage. In addition, calculation is made to obtain potential $V_{o(refresh)}$ of the electrode G when the Pc high-level pulse ($V_{res}$) is supplied to it. Supposing that $C_o$ is a sum of stray capacitance coupled to the electrode G and equivalent capacitive components of the photoelectric converting section 100 and $C_x$ is a capacitance of the capacitor 1,200, $V_{o(refresh)}$ can be represented by the following expression:

$$V_{o(refresh)} = \{C_x/(C_o+C_x)\} \times V_{res}$$

Accordingly, $V_{o(refresh)}$ can be altered at will depending on a size of the capacitor $C_x$ to be inserted, which makes it possible to design more freely.

As apparent from the above description, signal charges can be stored in a condition that the positive inrush current is almost zero by applying the positive potential to the electrode G for the photoelectric converting elements via the capacitor 1,200. Furthermore, it is also possible to reduce a decay time by adjusting the potential applied to the electrode G via the capacitor 1,200 to lower a value of the positive inrush current.

The potential of the electrode D and the electrode G for the photoelectric converting elements in the refresh operation is described in detail by using FIGS. 24 and 27A to 27C in the ninth embodiment, therefore, their explanation is omitted here.

In this embodiment, superior characteristics can be obtained by driving the photoelectric converter under the conditions below.

In the refresh operation of the photoelectric converting section 100, the potential $V_{rG}$ of the power supply 1,115 for applying positive potential to the electrode G is lower than the potential $V_D$ of the power supply 114 for applying positive potential to the electrode D. More specifically, since the photoelectric converting section 100 has a flat-band voltage ($V_{FB}$) to be applied to the electrode G to flat an energy band of the i-layer, practically the photoelectric converter is driven in a condition of $V_{rG} < V_D - V_{FB}$.

As its concrete operation is described in detail in the 10th embodiment by using FIGS. 29 and 30, the explanation is omitted here.

In this embodiment, there are very little electrons in defects on the interface between the i-layer 4 and the insulating layer 70, therefore, it does not take a long time for injection or ejection of electrons, which leads to a considerable reduction of inrush current to be noise elements as a result.

Supposing that $C_x$ is a capacitance of the capacitor 1,200, $C_o$ is a sum of stray capacitance coupled to the electrode G and equivalent capacitive components of the photoelectric converting section 100, and $V_{res}$ is a Pc high-level pulse, the G electrode potential at the refresh operation $V_{rG}$ can be represented by the following expression:

$$V_{rG} = V_{o(refresh)} = \{C_x/(C_o+C_x)\} \times V_{rex}$$

If the photoelectric converter is driven under a condition that a value of $\{C_x/(C_o+C_x)\} \times V_{rex}$ is smaller than $V_D - V_{FB}$, the above effects can be obtained and it is possible to reduce the accumulated inrush current further in comparison with $V_o$ which can be obtained under a condition of $V_{rG} = V_{o(refresh)} \geq (V_D - V_{FB})$ shown in FIG. 38.

In this embodiment, the second electrode layer is not specifically transparent. Further, an n-type injection blocking layer is used between the i-layer and the second electrode layer in the photoelectric converting section 100 and carriers inhibited from being injected are holes. Therefore, assuming that q is an electric charge for a carrier inhibited from being injected, q>0 is satisfied in this condition.

In the above explanation of this embodiment, the configuration permits an inverse relationship between the holes and the electrons. For example, the injection blocking layer can be a p-layer. If it is so, the same operational result can be achieved as for the above embodiment by reversing the directions for applying the voltages and the electric fields and arranging other parts in the same manner in this embodiment, where q<0 is satisfied for the electric charge q for the carrier inhibited from being injected by the injection blocking layer.

[15th embodiment]

By using the photoelectric converter described in the 13th embodiment, an example of another driving method is described below.

Now the operation of this embodiment will be explained in time series.

If signal light is incident on the photoelectric converting elements S1 to S9, electric charges are stored in refresh capacitors C1 to C9, equivalent capacitive components of the photoelectric converting section 100, and their stray capacitance from the power supply 114 depending on its intensity. Then, when a high level is output from a first parallel terminal of the shift register 1,106 and the transfer-TFTs T1 to T3 are turned on, the charges stored in the refresh capacitors C1 to C3, the capacitive components, and the stray capacitance are transferred to common capacitors C100 to C120. After that, a high level output from a shift register 1,107 is shifted and switching transistors T100 to T120 are sequentially turned on. This starts sequential readout of light signals of the first block transferred to the common capacitors C100 to C120 via the amplifier 1,126.

After the transfer-TFTs T1 to T3 are turned off, a high level is output from a first parallel terminal of the shift register 1,108 and it increases potential across the refresh capacitors C1 to C3. For the potential of the electrode D and the electrode G for the photoelectric converting elements S1 to S3 at this point, the conditions described in the first embodiment are applied. In other words, supposing that $V_{D1}$ to $V_{D3}$, $V_{rG1}$ to $V_{rG3}$, and $V_{FB1}$ to $V_{FB3}$ are the potential of the electrode D, the potential of the electrode G, and the flat-band voltage for the photoelectric converting elements at the refresh operation, respectively, the following expressions are satisfied:

$$V_{rG1} < V_{D1} - V_{FB1}, V_{rG2} < V_{D2} - V_{FB2}, V_{rG3} < V_{D3} - V_{FB3}$$

Then, the holes in the photoelectric converting elements S1 to S3 are swept out to a common power supply line 1,403.

Next, a high level is output from a first parallel terminal of shift register 1,109 and the reset-TFTs R1 to R3 are turned on, which initializes the potential of the electrode G for the photoelectric converting elements S1 to S3 to GND. Then, a Pa pulse triggers initialization of the potential of the common capacitors C10 to C120. When the potential of the common capacitors C10 to C120 is completely initialized, the shift register 1,106 shifts data and a high level is output from a second parallel terminal. This turns on the transfer-TFTs T4 to T6, and it starts a transfer of signal charges stored in the refresh capacitors C4 to C6, the stray capacitance, and the sensor equivalent capacitive components in the second block to the common capacitors C100 to C120. After that, in the same manner as for the first block, the switching transistors T100 to T120 are sequentially turned on by a shift of the shift register 1,107, and it starts sequential read out of light signals of the second block stored in the common capacitors C100 to C120. Conditions of the potential of the both electrodes for the photoelectric converting elements S4 to S6 at the refresh operation are the same as for the photoelectric converting elements S1 to S3.

Also for the third block, the charge transfer operation and the light signal read operation are performed in the same manner.

Like this, signals for a line is completed to be read in a horizontal scanning direction on the original copy through a series of the operations from the first block to the third block, and then the read signals are output in an analog mode according to a reflectance degree of the original copy.

As explained in this embodiment by using FIG. 37, the photoelectric converting elements, the refresh capacitors, the transfer-TFTs, the reset-TFTs, and the matrix signal line section have an identical layer structure consisting of five layers including the first electrode layer, the insulating layer, the i-layer, the n-layer, and the second electrode layer, but all the elements do not need to have the same layer structure necessarily. It is only required that at least the photoelectric converting elements have this (MIS) structure and that other elements each have a layer structure which allows it to serve as each element. If they have the identical layer structure, however, it is more effective to improve an yielding ratio and to lower the cost.

In addition, in the above explanation of this embodiment, the configuration permits an inverse relationship between the holes and the electrons. For example, the injection blocking layer can be a p-layer. If it is so, the same operational result as for the first embodiment can be achieved by reversing the directions for applying the voltages and the electric fields and arranging other parts in the same manner in this embodiment, where q<0 is satisfied for the electric charge q for the carrier inhibited from being injected by the injection blocking layer.

Although a one-dimensional line sensor is explained in this embodiment, it should be understood that a two-dimensional area sensor can be used by arranging a plurality of line sensors and that the above configuration permits a photoelectric converter for reading the same size of copies as for an information source such as an X-ray camera by using a block driving method described in the above embodiment.

As mentioned above, since an identical layer structure is used for the photoelectric converting elements, the TFTs, and the matrix signal line section in this embodiment, the layers can be formed in an identical process at a time, therefore, miniaturization and a high yielding ratio can be achieved, which makes it possible to produce a high signal-to-noise ratio photoelectric converter at low cost.

As apparent from the above description, the photoelectric converting elements are not limited to those shown by the embodiment. More specifically, it is only required that there are the first electrode layer, the insulating layer for blocking the movement of holes and electrons, the photoelectric converting semiconductor layer, and the second electrode layer, in addition to the injection blocking layer for blocking injection of holes into the photoelectric converting semiconductor layer between the second electrode layer and the photoelectric converting semiconductor layer. In addition, the photoelectric converting semiconductor layer only needs to have a photoelectric converting function of generating electron-hole pairs due to incident light. As for a layer structure, not only a single layer structure, but a multiple layer structure can be used and its characteristics can be altered repeatedly.

In the same manner, the TFTs each only need to have a gate electrode, a gate insulating layer, a semiconductor layer in which channels can be formed, an ohmic contact layer, and a main electrode. For example, the ohmic contact layer can be a p-layer. If it is so, a hole can be used as a carrier by reversing a control voltage of the gate electrode.

Additionally in the same manner, the capacitors each only need to have a lower electrode layer, a middle layer including an insulating layer, and an upper electrode layer, for example, they need not be especially separated from the photoelectric converting elements or the TFTs and it is possible to have a configuration in which they also serve as the electrode section for the photoelectric converting elements.

Further, the insulating substrate need not be always an insulator, and it can be a conductor or a semiconductor on which an insulator is laid.

In addition, since the photoelectric converting element itself has a function of accumulating charges, it is possible to obtain an integrated value of light information for a certain period without specific capacitors.

[16th embodiment]

Figure 39:
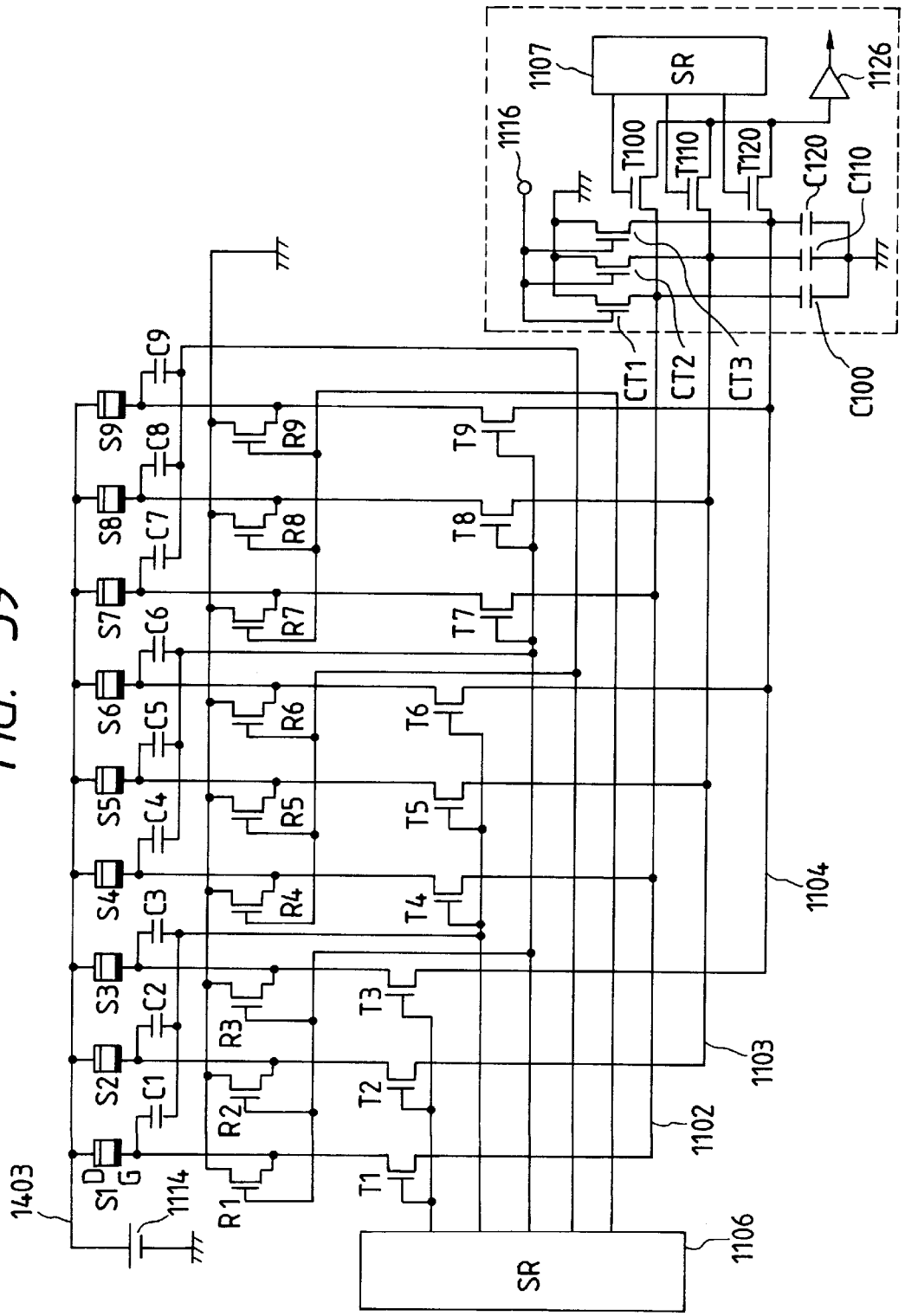
Figure 40:
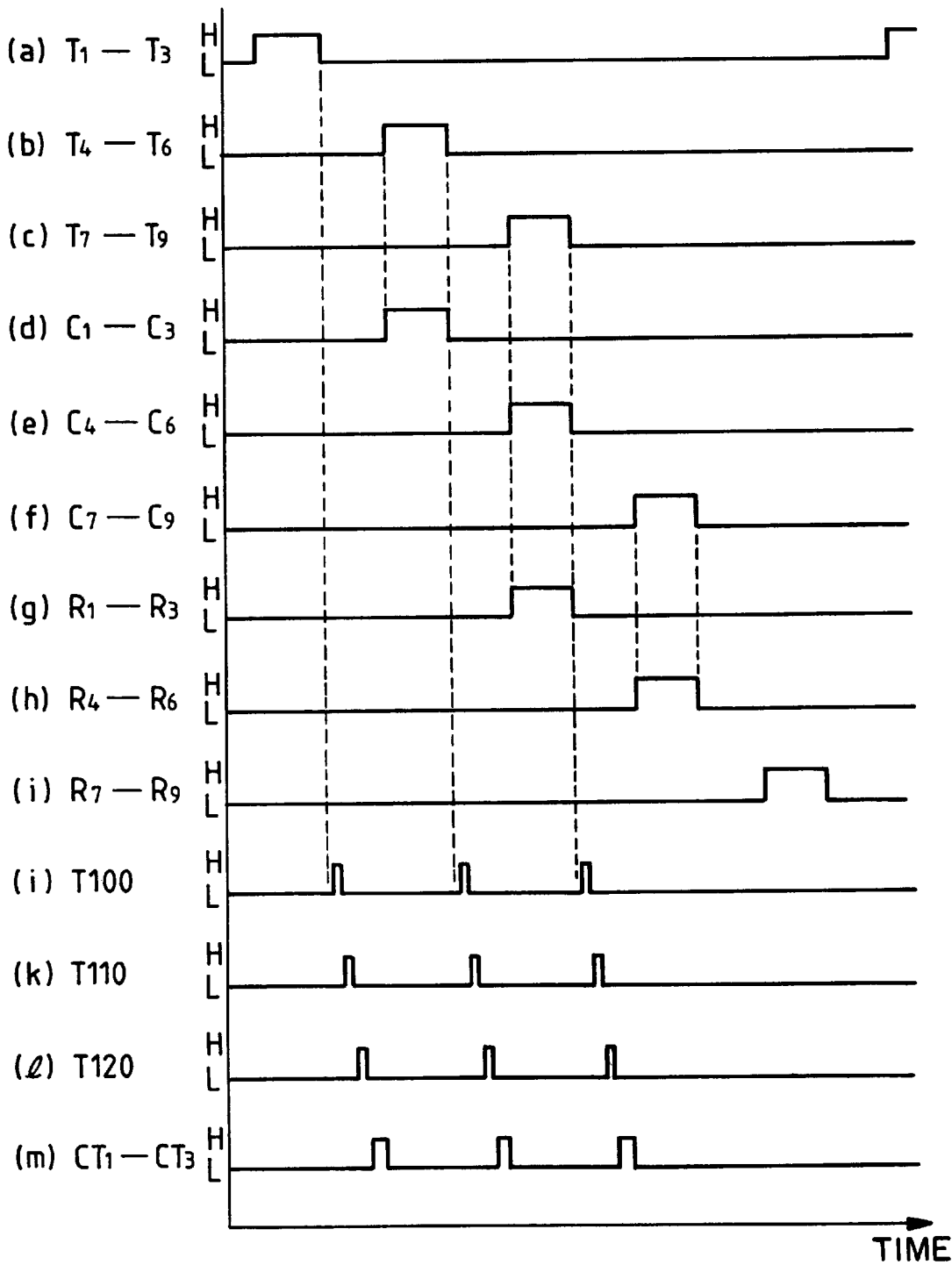

FIG. 39 is a schematic equivalent circuit diagram of a photoelectric converter illustrating the 16th embodiment of the present invention. The explanation is made by giving an example of a photoelectric converting element array including nine photoelectric converting elements being one-dimensionally arranged. FIG. 40 is a timing diagram illustrating an operation of the equivalent circuit in FIG. 39.

As for a configuration of a photoelectric converting section, the configuration shown in FIGS. 36 and 37 can be applied.

Next, how to drive the photoelectric converter of this embodiment is explained by using FIGS. 39 and 40. In FIG. 39, photoelectric converting elements S1 to S9, refresh capacitors C1 to C9 coupled to each photoelectric converting elements S1 to S9, and TFTs R1 to R9 for initializing potential of an electrode G for the photoelectric converting elements S1 to S9 (also referred to as "G electrode reset-TFTs" hereinafter), and signal charge transfer-TFTs T1 to T9 each constitute an array consisting of three blocks each of which is composed of three elements.

An individual electrode having an identical order in each block of the photoelectric converting elements S1 to S9 is connected to one of common lines 1,102 to 1,104 via the transfer-TFTs T1 to T9. More specifically, the transfer-TFTs T1, T4, and T7 which belong to a first group of each block are coupled to the common line 1,102, the transfer-TFTs T2, T5, and T8 which belong to a second group of each block are to the common line 1,103, and then the transfer-TFTs T3, T6, and T9 which belong to a third group of each block are to the common line 1,104. The common lines 1,102 to 1,104 are coupled to an amplifier 1,126 via switching transistors T100 to T120, respectively.

Further in FIG. 39, the common lines 1,102 to 1,104 are grounded via common capacitors C100 to C120, respectively and also grounded via switching transistors CT1 to CT3.

Each gate electrode for the switching transistors CT1 to CT3 is coupled to a terminal 1,116 via each common line. Therefore, by setting the terminal 1,116 to a high level to turn on the switching transistors CT1 to CT3, remaining charges of the common lines 1,102 to 1,104 are discharged to GND for charge initialization. Further in FIG. 39, respective electrodes opposite to the electrode G for the refresh capacitors C1 to C3 in the first block are coupled via a common line to a common gate electrode for the transfer-TFTs T4 to T6 in the second block, and respective electrodes opposite to the electrode G for the refresh capacitors C4 to C6 in the second block via a common line to a common gate electrode for the transfer-TFTs T7 to T9 in the third block and to a common gate electrode for the reset-TFTs R1 to R3 in the first block. In the same manner, respective electrodes opposite to the electrode G for the refresh capacitors C7 to C9 in the third block are coupled via a common line to a common gate electrode for the reset-TFTs R4 to R6 in the second block. In this embodiment, the refresh means can include capacitors C1 to C9, a shift register 1,106, and the power supply 1,114, and a signal detecting section can include a detecting means enclosed by a dashed line in FIG. 39, the TFTs T1 to T9, and a shift register 1,106.

Next, the operation of this embodiment is described in time series below.

If signal light is incident on the photoelectric converting elements S1 to S9, electric charges are stored in refresh capacitors C1 to C9 and their stray capacitance depending on its intensity. Then, when a high level is output from a first parallel terminal of the shift register 1,106 [(a) in FIG. 40] and the transfer-TFTs T1 to T3 are turned on, the charges stored in the refresh capacitors C1 to C3 and the stray capacitance are transferred to common capacitors C100 to C120. After the transfer-TFTs T1 to T3 are turned on, a high level output from a shift register 1,107 is shifted and switching transistors T100 to T120 are sequentially turned on [(j) to (l) in FIG. 40]. This starts sequential readout of light signals of the first block transferred to the common capacitors C100 to C120 via the amplifier 1,126. Then, a terminal 1,116 is set to a high level [(m) in FIG. 40] and switching transistors CT1 to CT3 are turned on to initialize the potential of the common capacitors C100 to C120. When the potential of the common capacitors C100 to C120 is completely initialized, a high level is output from a second parallel terminal of the shift register 1,106 [(d) in FIG. 40] and it increases potential across the refresh capacitors C1 to C3. And then, holes in the photoelectric converting elements S1 to S3 are swept out to a common power supply line 1,403. Simultaneously with this, the transfer-TFTs T4 to T6 in the second block are turned on [(b) in FIG. 40] to transfer the signal charges stored in the refresh capacitors C4 to C6 and the stray in the second block to common capacitors C100 to C120. In the same manner as for the first block, the switching transistors T100 to T120 are sequentially turned on by a shift of the shift register 1,107 [(j) to (l) in FIG. 40] and light signals of the second block stored in the common capacitors C100 to C120 are sequentially read out, then the potential of the common capacitors C100 to C120 is initialized by the switching transistors CT1 to CT3 [(m) in FIG. 40].

Next, after potential of the common electrode for the refresh capacitors C1 to C3 in the first block becomes a low level, a high level is output from a third parallel terminal of the shift register 1,106 [(g) in FIG. 40] and the G electrode reset-TFTs R1 to R3 are turned on to initialize the potential of the electrode G for the photoelectric converting elements S1 to S3 to GND. At the same time, potential across the refresh capacitors C4 to C6 in the second block goes up [(e) in FIG. 40]. Further at this point, the transfer-TFTs T7 to T9 in the third block are also turned on [(c) in FIG. 40] and it starts a transfer of the signal charges stored in the refresh capacitors C7 to C9 in the third block and the stray capacitance to common capacitors C100 to C120. Then, in the same manner as for the first and second blocks, the switching transistors T100 to T120 are sequentially turned on by a shift of the shift register 107 [(j) to (l) in FIG. 40] to read out light signals in the third block stored in the common capacitors C100 to C120 sequentially. After that, the potential of the common capacitors C100 to C120 is initialized by the switching transistors CT1 to CT3 [(m) in FIG. 40].

In the same manner, afterward, the G electrode reset-TFTs R4 to R6 in the second block are turned on by an output of a high level from a fourth parallel terminal of the shift register 1,106 [(h) in FIG. 40]. At the same time, potential across the refresh capacitors C7 to C9 in the third block goes up [(f) in FIG. 40]. After that, a high level is output from a fifth parallel terminal of the shift register 1,106, which turns on the G electrode reset-TFT R7 to R9 in the third block [(i) in FIG. 40].

Like this, signals for a line is completed to be read in a horizontal scanning direction on the original copy through a series of the operations from the first block to the third block, and then the read signals are output in an analog mode according to a reflectance degree of the original copy.

The above explanation is given for the operation of the photoelectric converter including nine photoelectric converting elements divided to three blocks for a sensor array for a single line. For reading other lines, the charge transfer operation and the light signal read operation are performed repeatedly in the same manner. As explained in this embodiment by using FIG. 37, the photoelectric converting elements, the refresh capacitors, the TFTs, the matrix signal line section have an identical layer structure consisting of five layers including the first electrode layer, the insulating layer, the semiconductor layer, the n-layer, and the second electrode layer, but all the elements need not to have the same layer structure necessarily. It is only required that at least the photoelectric converting elements have this (MIS) structure and that other elements each have a layer structure which allows it to serve as each element. If they have the identical layer structure, however, it is more effective to improve an yielding ratio and to lower the cost.

In addition, in the above explanation of this embodiment, the configuration permits an inverse relationship between the holes and the electrons. For example, the injection blocking layer can be a p-layer. If it is so, the same operational result as for the above embodiment can be achieved by reversing the directions for applying the voltages and the electric fields and arranging other parts in the same manner in this embodiment.

Although a one-dimensional line sensor is explained in this embodiment, it should be understood that a two-dimensional area sensor can be achieved by arranging a plurality of line sensors and that the above configuration permits a photoelectric converter for reading the same size of copies as for an information source such as an X-ray camera by using a block driving method described in the above embodiment.

As mentioned above, since an identical layer structure is used for the photoelectric converting elements, the capacitors, the TFTs, and the matrix line section in this embodiment, the layers can be formed in an identical process at a time, therefore, miniaturization and a high yielding ratio can be achieved, which makes it possible to produce a high signal-to-noise ratio photoelectric converter at low cost. In addition, a conventionally used refresh power supply can be reduced, which is effective to produce a high signal-to-noise ratio and low cost photoelectric converter. Furthermore, a plurality of photoelectric converting elements are divided into blocks and two or more operations in other blocks (for example, a signal transfer operation, a sensor refresh operation, and a potential reset operation) can be driven simultaneously by an identical driving line, which makes it possible to achieve a further higher yielding ratio and lower cost photoelectric converter due to speedup of the operation and miniaturization of the apparatus.

[17th embodiment]

Figure 41:
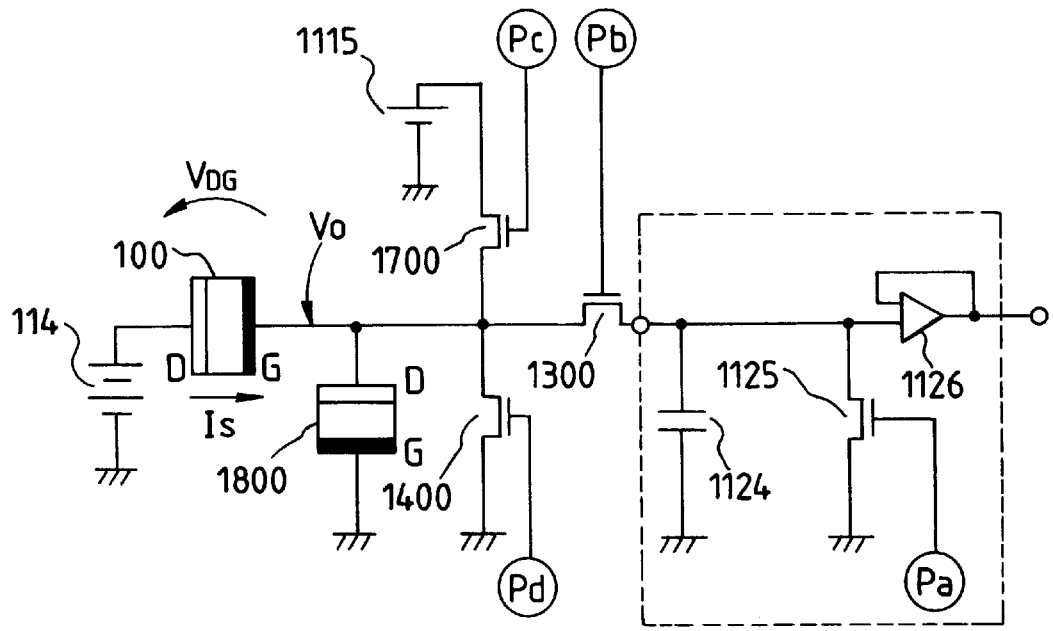

FIG. 41 is a single-bit schematic equivalent circuit diagram of a photoelectric converter of the 17th embodiment of the present invention.

Referring to FIG. 41, reference numeral 100 indicates a photoelectric converting section. A layer structure of the photoelectric converting section is the same as that described in FIG. 4A, accordingly, D is an electrode in a transparent electrode 6 side and G is an electrode in a lower electrode 1 side. Reference numerals 114, 1,115, and 1,700 indicate a power supply for applying a positive potential ($V_D$) to the electrode D, a power supply for applying positive potential ($V_{rG}$) to the electrode G in a refresh operation of the photoelectric converting section 100, and a refresh-TFT, respectively. It is desirable that the power supply 1,115 is set to a voltage lower than that of the power supply 114. Reference numeral 1,800 is a signal charge storage capacitor having the same layer structure as for the photoelectric converting section 100. The electrode G of the storage capacitor is grounded to GND and the electrode D is grounded to the electrode G of the photoelectric converting section 100. Further, a TFT 1,300 transfers signal charges in a detecting operation and a G electrode initialize-TFT 1,400 initializes potential of the electrode G (also referred to as "G electrode reset-TFT" hereinafter). A part enclosed by a dashed line is a detecting means, which generally comprises IC or other components and is shown as an example in FIG. 41. Reference numerals 1,124, 1,125, and 1,126 indicate a read capacitor, a switching element for initializing the read capacitor, and an operational amplifier, respectively. The detecting means is not limited to this example, but it is only required that it can detect current or charges directly or by integrated values. For example, if signal charges are not stored in the read capacitor 1,124, but are read out with a current meter, the read capacitor 1,124 and the switching element 1,125 for initializing potential can be omitted.

Now, using FIG. 41, the operation of the photoelectric converter of this embodiment is described below.

In the refresh operation of the photoelectric converting section, the TFT 1,700 is shifted from an off state to an on state by a Pc high potential (also referred to as "high level" hereinafter) pulse and the power supply 1,115 applies positive potential to the electrode G. Positive potential is applied to the electrode D by the power supply 114, therefore, positive potential is applied to potential $V_{DG}$ of the electrode D opposite to the electrode G. Then, a part of holes in the photoelectric converting section 100 are swept out to the electrode D for refreshment. Next, the TFT 1,400 is shifted from an off state to an on state by a Pd high-level pulse and GND potential is applied to the electrode G. At this point, larger positive potential is applied to $V_{DG}$, and the photoelectric converting section 100 starts a photoelectric converting operation after inrush current flows. Then, the TFT 1,400 is turned off by a Pd low potential (also referred to as "low level" hereinafter) pulse and the electrode G is grounded via the charge storage capacitor 1,800. If signal light is incident on the photoelectric converting section 100, corresponding current flows out of the electrode G and the potential of the electrode G is increased. In other words, incident light information is stored in a capacitance of the electrode G as electric charges. After a certain storage time, the transfer-TFT 1,300 is shifted from an off state to an on state by a Pb high-level pulse and the stored charges flow to the capacitor 1,124. The quantity of the charges is proportional to an integrated value of the current flowing out of the photoelectric converting section 100 in the photoelectric converting operation, in other words, it is detected by the detecting means through the operational amplifier 1,126 as a total quantity of the incident light. It is desirable that the potential of the capacitor 1,124 is initialized to GND potential by a Pa high-level pulse from the TFT 1,125 before this transfer operation. When the transfer-TFT 1,300 is turned off, the refresh-TFT 1,700 is turned on by a Pc high-level pulse, and then the sequential operation is repeated afterward.

Accordingly, a photoelectric conversion can be performed with a high signal-to-noise ratio and superior characteristics.

[18th embodiment]

Figure 42:
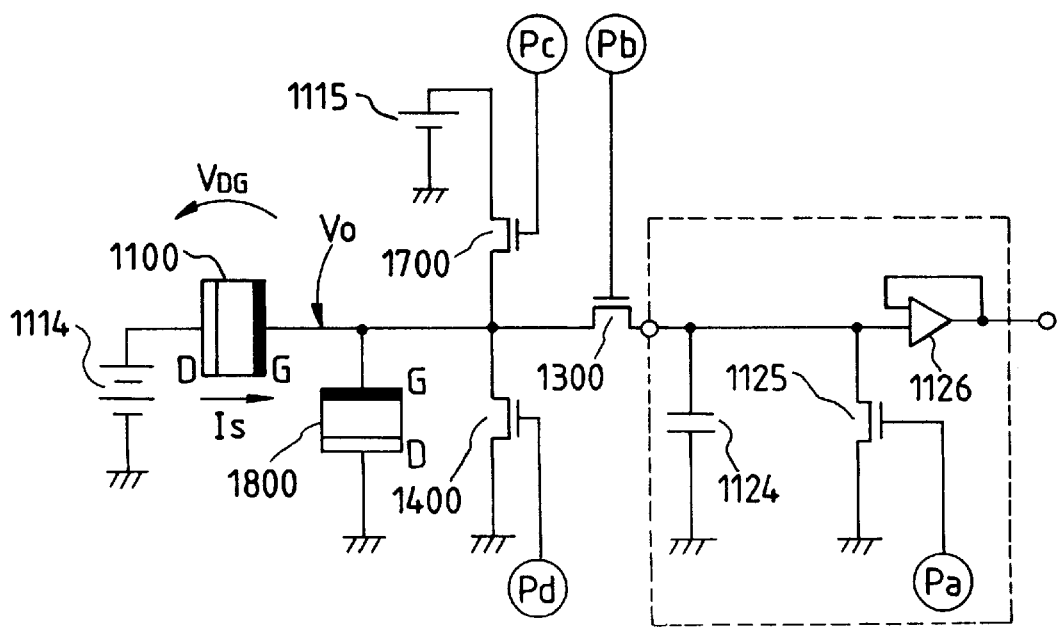
Figure 43:
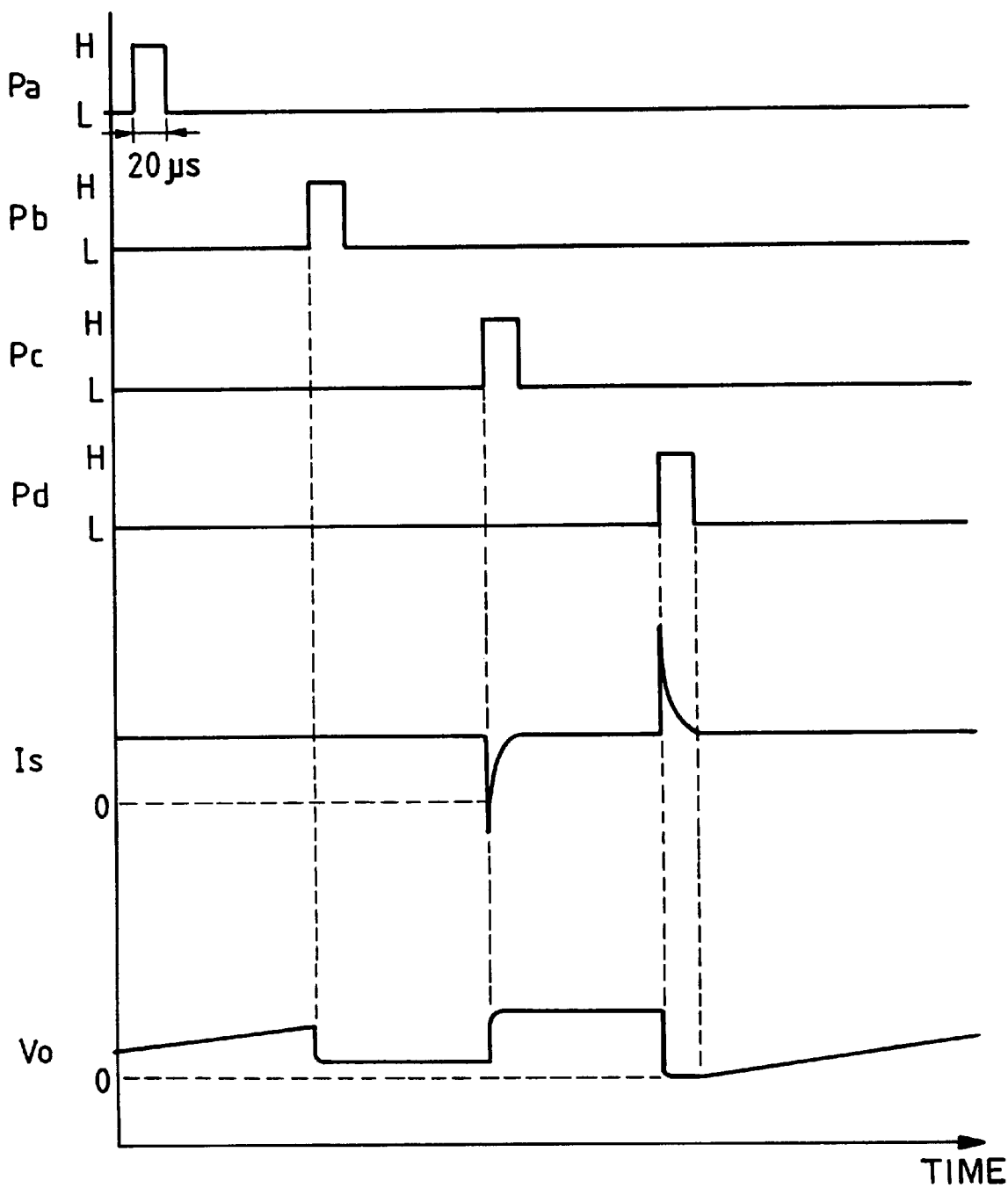

FIG. 42 is a single-bit schematic equivalent circuit diagram of a photoelectric converter of this embodiment of the present invention. FIG. 43 is a timing diagram illustrating an example of practically driving the photoelectric converter in FIG. 42.

A configuration in FIG. 42 corresponds to the configuration in FIG. 41, and the same reference numerals designate the same corresponding parts. Explanation of the same parts as for FIG. 41 is simplified or omitted.

In this embodiment, a refresh means can include a TFT 1,700, a means for applying a high-level pulse Pc, a power supply 1,115, and a power supply 1,114.

Further, a signal detecting section can include a detecting means enclosed by a dashed line in FIG. 42, a TFT 1,300, a means for applying a high-level pulse Pb, and a storage capacitor 1,800.

FIG. 42 is different from FIG. 41 in a point that a terminal of the storage capacitor 1,800 connected to an electrode G of a photoelectric converting section 100 is not an electrode D, but an electrode G.

Next, referring to FIG. 43, the operation is described. FIG. 43 focuses on current $I_s$ of the photoelectric converting section 100 and behavior of potential $V_o$ of the electrode G caused by the current $I_s$.

In FIG. 43, when a Pc refresh pulse rises and a voltage is applied to the electrode G of the photoelectric converting section 100, a part of the holes remaining in the i-layer are swept out to the electrode D.

Next, a Pd G electrode reset pulse rises and the electrode G of the photoelectric converting section 100 is grounded to GND, all of some electrons remaining in the i-layer flow out to the electrode D. Then, the Pd G electrode reset pulse falls. Signal charges begin to be stored from the Pd pulse fall, wherein a charge storage electrode for the storage capacitor 1,800 is the electrode G and an electrode to be grounded is the electrode D, therefore, an energy band of the i-layer 4 in the storage capacitor 1,800 is almost flat showing so-called a flat-band condition. Generally, zero or a small positive voltage is applied to a side of an insulating layer to make a flat-band condition of an MIS-type capacitor as so-called a flat-band voltage. Accordingly, if the flat-band voltage is zero, the capacitor 1,800 is not put in a depression state from a start of the charge storage to its termination as mentioned above. If the flat-band voltage is a small positive voltage, the storage capacitor 1,800 can be used not in the depression state, but in an accumulation state from the start of the charge storage to its termination by inserting a power supply having a voltage equivalent to or greater than the positive flat-band voltage between a G electrode reset-TFT 1,400 and the GND in FIG. 42. In other words, there occurs no leak current which flows via a storage capacitor 1,800 in the photoelectric converter described by using FIG. 41. Accordingly, almost all the electric charges stored in the storage capacitors and other stray capacitance are charges generated by signal light incident on the photoelectric converting section 100, and it is possible to obtain information with a high signal-to-noise ratio by reading its signal voltage. A signal detecting element within a rectangular range indicated by a dashed line in FIG. 42 is not limited specifically and it is only required that it can detect current or charges directly or with integrated values. In addition, if signal charges are read out by means of a current meter or the like without being stored into a readout capacitor 1,124, the readout capacitor 1,124 and a potential initialization switching element 1,125 can be omitted, as mentioned in the explanation of the photoelectric converter in FIG. 41.

In this embodiment, as described above, it is possible to use the signal storage capacitor always in the accumulation state by storing signal charges in the electrode G in the insulating layer 70 for the signal storage capacitor, therefore, there occurs apparently almost no leak current caused by a leakage of signal charges through the signal charge storage capacitor, which makes it possible to provide a further higher signal-to-noise ratio photoelectric converter.

[19th embodiment]

The 19th embodiment of the present invention is described below by using FIGS. 44 to 46.

Figure 44:
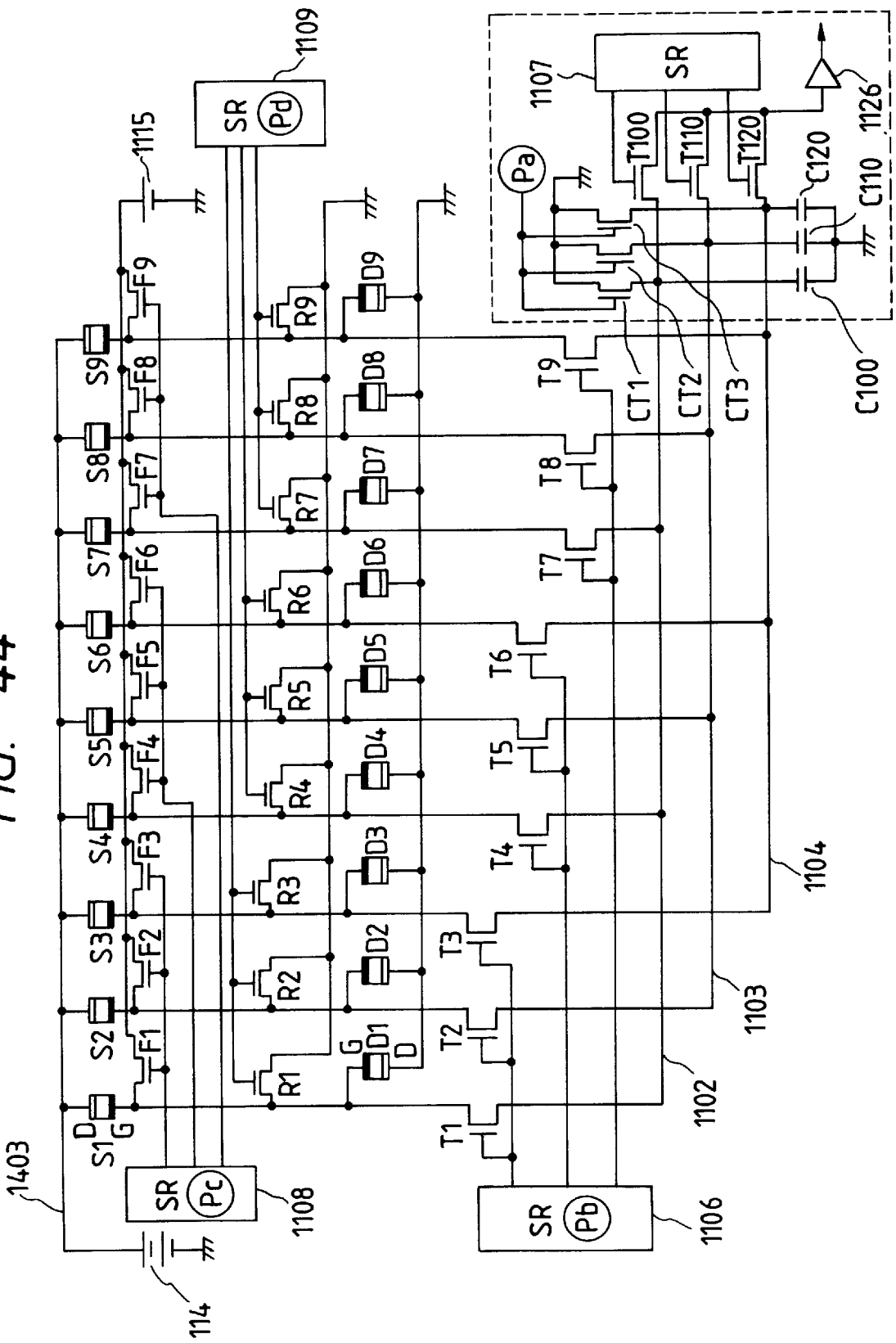

FIG. 44 is a schematic equivalent circuit diagram illustrating a photoelectric converter of this embodiment. The explanation is made by giving an example of a photoelectric converting element array including nine photoelectric converting elements being one-dimensionally arranged. FIG. 45 is a plan view illustrating a photoelectric converting section including a plurality of pixels in a longitudinal direction, a storage capacitor section, a refresh-TFT section, a transfer-TFT section, a reset-TFT section, and a line section for a single pixel. FIG. 46 is a sectional view of a single pixel. FIG. 46 is typically drawn for understanding and a position of the line section does not match the position in FIG. 4A completely. Further, a reset-TFT section 1,400 is not shown in FIG. 46. The same reference numerals in FIGS. 44 to 46 designate the same parts as for FIG. 42.

Figure 45:
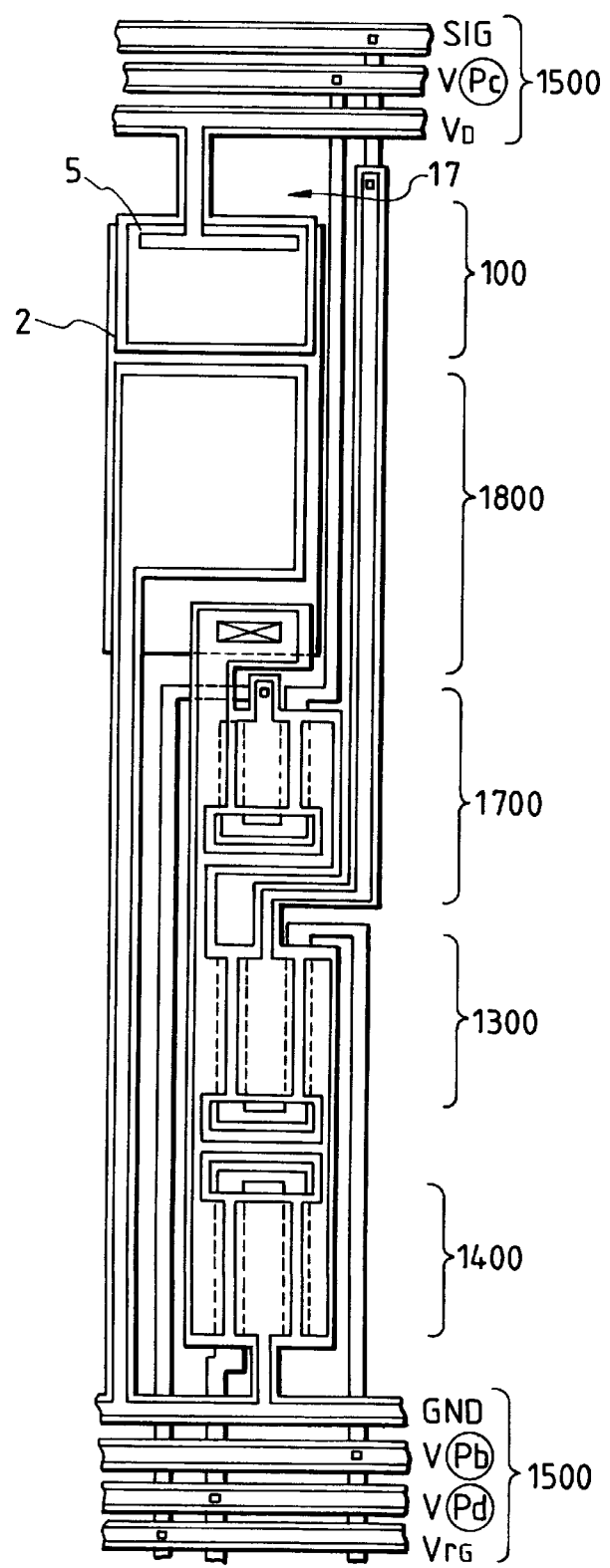

In FIG. 45, the photoelectric converting section 100 includes a lower electrode 2 which also serves as a light shielding film against light from a substrate side. Light from the substrate side is reflected on a surface of an original copy (not shown) located perpendicularly upward against the drawing through a light window 17, and the reflected light impinges on the photoelectric converting section 100. Light current caused by carriers generated at this point is stored in equivalent capacitive components of a storage capacitor 1,800 and the photoelectric converting element 100 and other stray capacitance. The stored charges are transferred to the matrix line section 1,500 for signal lines by the transfer-TFT 1,300 and read as a voltage by a signal processing section (not shown).

Figure 46:
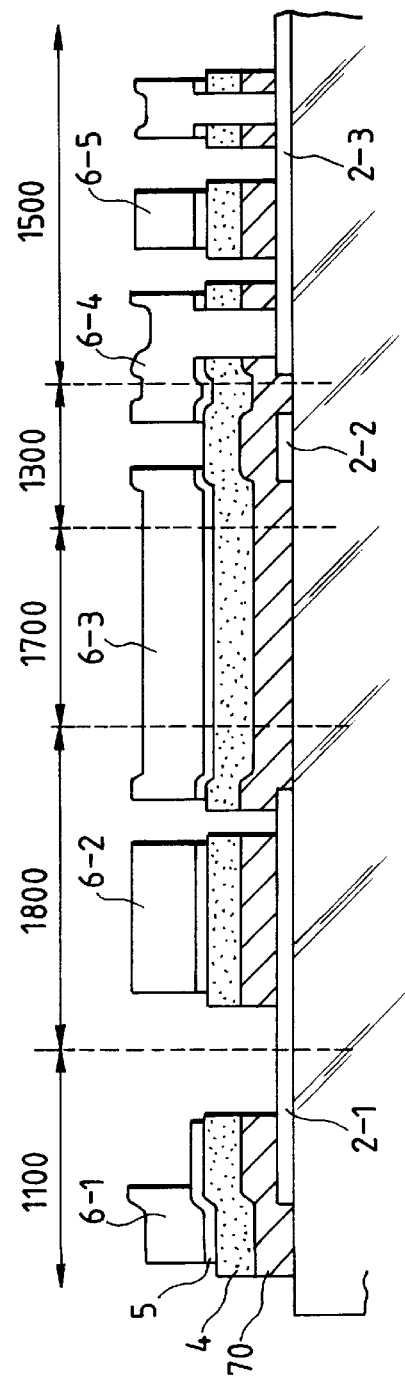

Referring to FIG. 46, the layer structure of the components is roughly explained.

In FIG. 46, reference numerals 100, 1,800, 1,700, 1,300, and 1,500 indicate the photoelectric converting section, the storage capacitor, a refresh-TFT, the transfer-TFT, and the line section, respectively. These components have an identical layer structure consisting of five layers, a first electrode layer including 2-1, 2-2, and 2-3, an insulating layer 70, an i-layer 4, an n-layer 5, and a second electrode layer including 6-1, 6-2, 6-3, 6-4, and 6-5. The second electrode layer is not specifically transparent.

Next, how to drive the photoelectric converter of the 19th embodiment is described below by using the circuit diagram.

In FIG. 44, photoelectric converting elements S1 to S9 constitute a photoelectric converting element array consisting of three blocks each of which is composed of three photoelectric converting elements. This configuration is also used for storage capacitors D1 to D9 each connected to corresponding photoelectric converting elements S1 to S9, refresh-TFTs F1 to F9, TFTs F1 to F9 for initializing potential of the electrode G for the photoelectric converting elements S1 to S9, and TFTs T1 to T9 for transferring signal charges. An individual electrode having an identical order in each block of the photoelectric converting elements S1 to S9 is connected to one of common lines 1,102 to 1,104 via the transfer-TFTs T1 to T9. More specifically, the transfer-TFTs T1, T4, and T7 which belong to a first group of each block are coupled to the common line 1,102, the transfer-TFTs T2, T5, and T8 which belong to a second group of each block are to the common line 1,103, and then the transfer-TFTs T3, T6, and T9 which belong to a third group of each block are to the common line 1,104. The common lines 1,102 to 1,104 are coupled to an amplifier 1,126 via switching transistors T100 to T120, respectively.

Further in FIG. 44, the common lines 1,102 to 1,104 are grounded via common capacitors C100 to C120, respectively, and also grounded via switching transistors CT1 to CT3. Each gate electrode for the switching transistors CT1 to CT3 is coupled via each common line to discharge remaining charges of the common lines 1,102 to 1,104 to GND for potential initialization by being turned on at the same timing as for the Pa pulse in FIG. 43.

In this embodiment, photoelectric converting means include TFTs R1 to R9, a shift register 1,109, and a power supply 114, and refresh means include TFTs F1 to F9, a shift register 1,108, a power supply 1,115, and a power supply 1,114. Further, a signal detecting section includes a detecting means enclosed by a dashed line in FIG. 44, the TFTs T1 to T9, a shift register 1,106, a storage capacitors D1 to D9.

Next, the operation of the 19th embodiment is described in time series.

If signal light is incident on the photoelectric converting elements S1 to S9 first, electric charges are stored in the storage capacitors D1 to D9, equivalent capacitive components of the photoelectric converting section 100, and their stray capacitance depending on its intensity. At this point, as mentioned for the 18th embodiment, electrons and holes in each i-layer of the storage capacitors D1 to D9 do not flow out to the electrode G since the electrode G in the insulating layer side is a charge storage electrode, therefore, apparent leak current does not occur in the storage capacitors D1 to D9. Then, when a high level is output from a parallel terminal of the shift register 1,106 and the transfer-TFTs T1 to T3 are turned on, the charges stored in the storage capacitors D1 to D3, the capacitive components, and the stray capacitance are transferred to the common capacitors C100 to C120. Subsequently, a high level output from a shift register 1,107 is shifted and switching transistors T100 to T120 are sequentially turned on. This starts sequential readout of light signals of the first block transferred to the common capacitors C100 to C120 via the amplifier 1,126.

After the transfer-TFTs T1 to T3 are turned off, a high level is output from a first parallel terminal of the shift register 1,108 to turn on the refresh-TFTs F1 to F3 and it increases potential of the electrode G for the photoelectric converting elements S1 to S3. Then, a part of holes in the photoelectric converting elements S1 to S3 are swept out to the common power supply line 1,403.

Next, a high level is output from a first parallel terminal of a shift register 1,109 and the reset-TFTs R1 to R3 are turned on, which initializes potential of the electrode G for the photoelectric converting elements S1 to S3 to GND. Then, a Pa pulse triggers initialization of potential of the common capacitors C100 to C120. When the potential of the common capacitors C100 to C120 is completely initialized, the shift register 1,106 shifts data and a high level is output from a second parallel terminal. This turns on the transfer-TFTs T4 to T6, and it starts a transfer of signal charges stored in the storage capacitors D4 to D6, the equivalent capacitive components of the photoelectric converting elements S4 to S6, and their stray capacitance in the second block to the common capacitors C100 to C120. After that, in the same manner as for the first block, the switching transistors T100 to T120 are sequentially turned on by a shift of the shift register 1,107, and it starts sequential readout of light signals of the second block stored in the common capacitors C100 to C120. Also for the third block, the charge transfer operation and the light signal read operation are performed in the same manner.

Like this, signals for a line is completed to be read in a horizontal scanning direction on the original copy through a series of the operations from the first block to the third block, and then the read signals are output in an analog mode according to a reflectance degree of the original copy.

As explained in this embodiment by using FIG. 46, the photoelectric converting elements, the storage capacitors, the refresh-TFTs, the transfer-TFTs, the reset-TFTs, and the matrix signal line section have an identical layer structure consisting of five layers including the first electrode layer, the insulating layer, the i-layer, the n-layer, and the second electrode layer, but all the elements do not need to have the same layer structure necessarily. It is only required that at least the photoelectric converting elements and the storage capacitors have this (MIS) structure and that other elements each have a layer structure which allows it to serve as each element. If they have the identical layer structure, however, it is more effective to improve an yielding ratio and to lower the cost.

In addition, in the above explanation of the 18th or 19th embodiment, the configuration permits an inverse relationship between the holes and the electrons. For example, the injection blocking layer can be a p-layer. If it is so, the same operational result as for the above embodiment can be achieved by reversing the directions for applying the voltages and the electric fields and arranging other parts in the same manner in the 18th or 19th embodiment.

Although a one-dimensional line sensor is explained in the 19th embodiment, it should be understood that a two-dimensional area sensor can be achieved by arranging a plurality of line sensors and that the above configuration permits a photoelectric converter for reading the same size of copies as for an information source such as an X-ray camera by using a block driving method described in the above embodiment.

As mentioned above, since an identical layer structure is used for the photoelectric converting elements, the storage capacitors, the TFTs and the matrix signal line section, the layers can be formed in an identical process at a time in the 19th embodiment in addition to the effect of the 18th embodiment, therefore, miniaturization and a high yielding ratio can be achieved, which makes it possible to produce a high signal-to-noise ratio photoelectric converter at low cost.

[20th embodiment]

The 20th embodiment is described below by using FIGS. 47 to 49.

Figure 47:
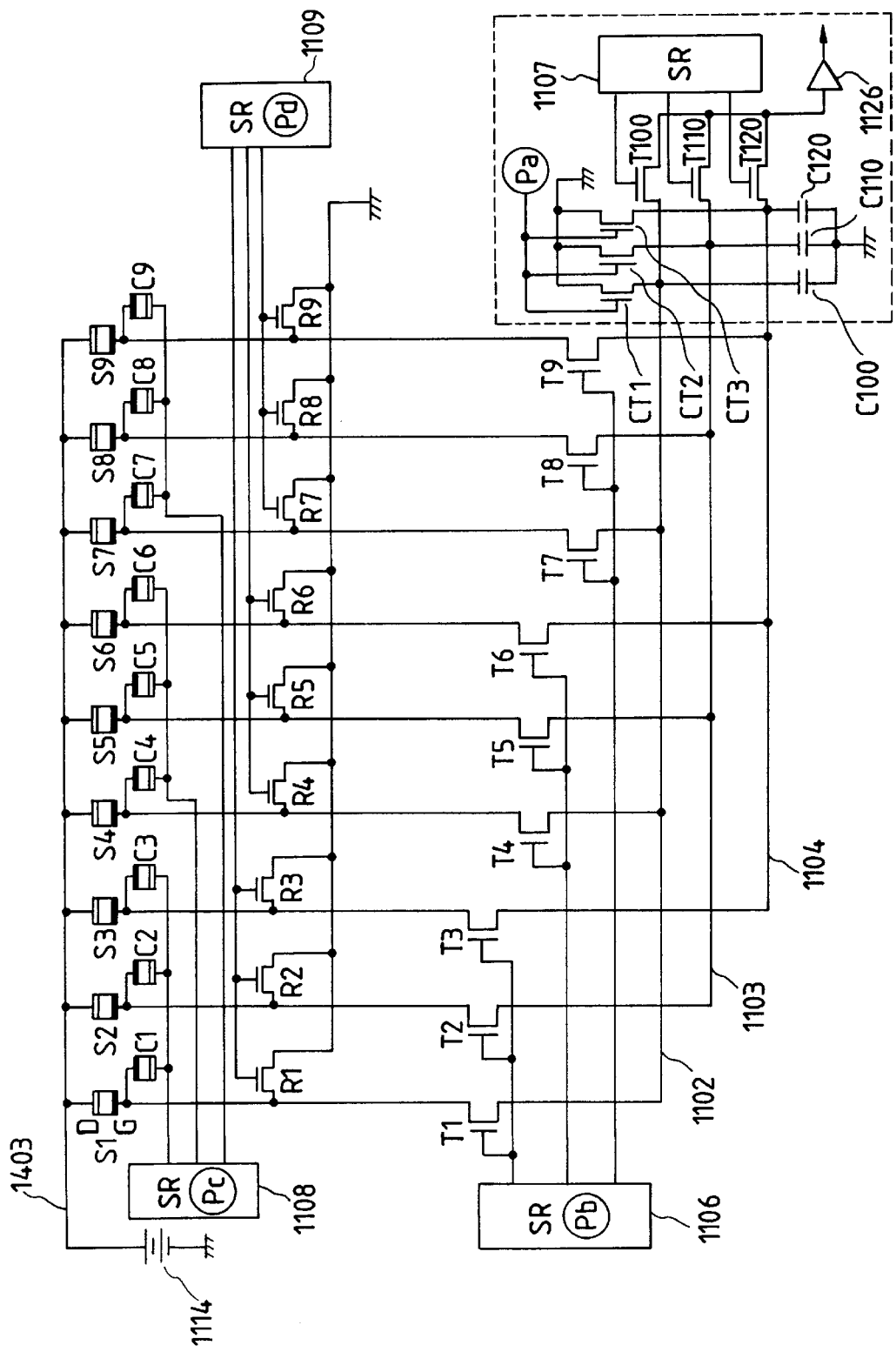

FIG. 47 is a schematic equivalent circuit diagram illustrating the photoelectric converter of the 20th embodiment of the present invention. In the same manner as for the 19th embodiment, the explanation is made by giving an example of a photoelectric converting element array including nine photoelectric converting elements being one-dimensionally arranged.

Figure 48:
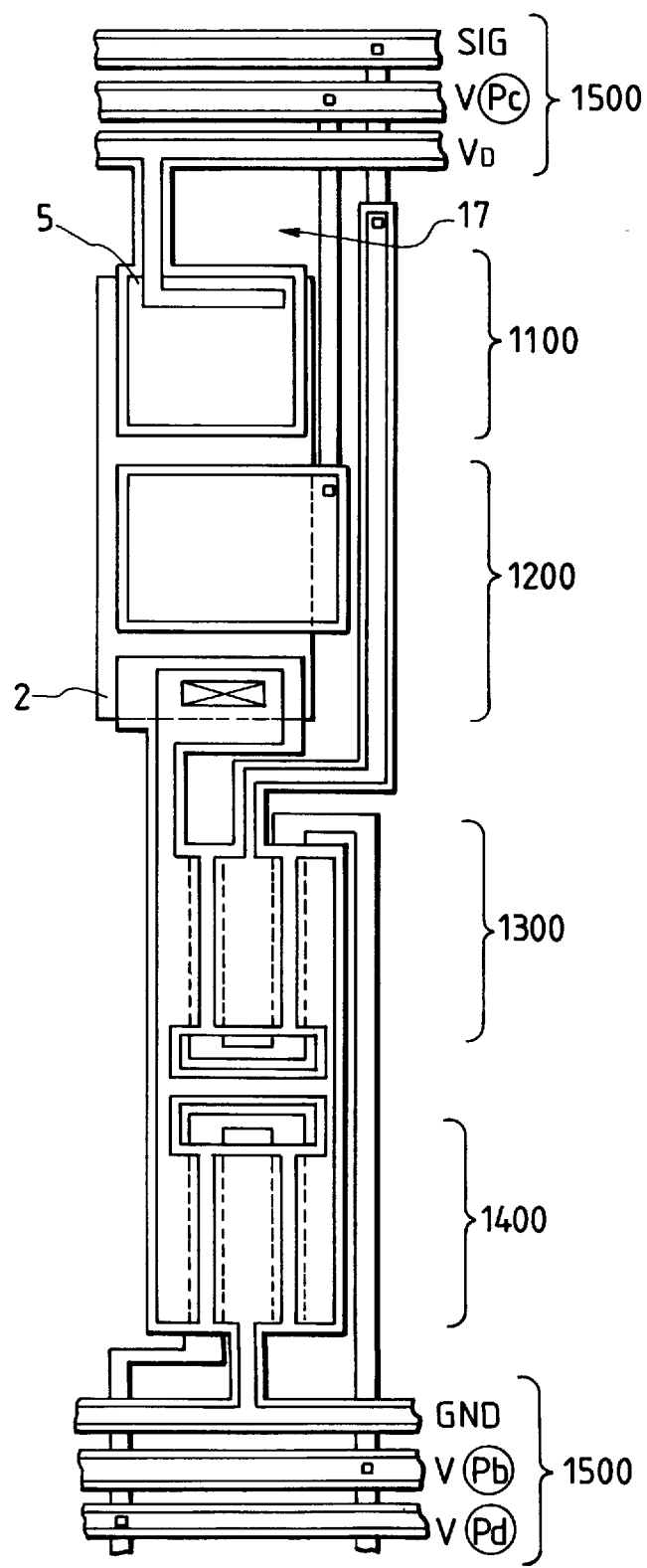

FIG. 48 is a plan view illustrating a photoelectric converting element section including a plurality of pixels in a longitudinal direction, a storage capacitor/refresh capacitor section, a transfer-TFT section, a reset-TFT section, and a line section for a single pixel.

Figure 49:
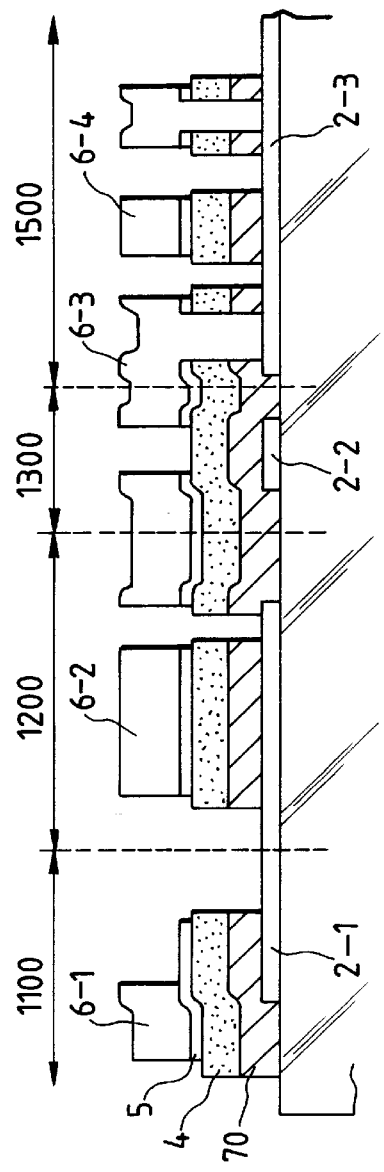

FIG. 49 is a sectional view of a single pixel. FIG. 49 is typically drawn for understanding and the position of the line section does not match the position in FIG. 49 completely. In addition, the reset-TFT section 1,400 is not shown in FIG. 49. The same reference numerals in FIGS. 47 to 49 designate the same parts as for FIGS. 42 and 44 to 46.

In FIG. 48, the photoelectric converting section 100 includes a lower electrode 2 which also serves as a light shielding film against light from a substrate side. Light from the substrate is reflected on a surface of an original copy (not shown) located perpendicularly upward against the drawing through a light window 17, and the reflected light impinges on the photoelectric converting section 100. By means of carriers generated at this point, photocurrent is stored in a storage/refresh capacitor 1,200, equivalent capacitive components of the photoelectric converting section 100, and other stray capacitance. The stored charges are transferred to a matrix line section 1,500 by a transfer-TFT 1,300 and read as a voltage by a signal processing section (not shown).

Using FIG. 49, a layer structure is roughly described below.

In FIG. 49, the photoelectric converting section 100, the storage/refresh capacitor 1,200, the transfer-TFT 1,300, and the line section 1,500 have an identical layer structure consisting of five layers, a first electrode layer including 2-1, 2-2, and 2-3, an insulating layer 70, an i-layer 4, an n-layer 5, and a second electrode layer including 6-1, 6-2, 6-3, and 6-4. In the same manner as for the 19th embodiment, the second electrode layer is not specifically transparent.

Now, how to drive the photoelectric converter of this embodiment is described below by using the circuit diagram.

In FIG. 47, photoelectric converting elements S1 to S9 constitute a photoelectric converting element array consisting of three blocks each of which is composed of three photoelectric converting elements. This configuration is also used for storage/refresh capacitors C1 to C9 each correspondingly coupled to the photoelectric converting elements S1 to S9, TFTs R1 to R9 for initializing potential of the electrode G for the photoelectric converting elements S1 to S9, and TFTs T1 to T9 for transferring signal charges.

An individual electrode having an identical order in each block of the photoelectric converting elements S1 to S9 is connected to one of common lines 1,102 to 1,104 via the transfer-TFTs T1 to T9. More specifically, the transfer-TFTs T1, T4, and T7 which belong to a first group of each block are coupled to the common line 1,102, the transfer-TFTs T2, T5, and T8 which belong to a second group of each block are to the common line 1,103, and then the transfer-TFTs T3, T6, and T9 which belong to a third group of each block are to the common line 1,104. The common lines 1,102 to 1,104 are connected to an amplifier 1,126 via switching transistors T100 to T120, respectively.

Further in FIG. 47, the common lines 1,102 to 1,104 are grounded via common capacitors C100 to C120, respectively, and also grounded via switching transistors CT1 to CT3. Each gate electrode for the switching transistors CT1 to CT3 is coupled via each common line to discharge remaining charges of the common lines 1,102 to 1,104 to GND for potential initialization by being turned on at the same timing as for the Pa pulse in FIG. 43.

In this embodiment, photoelectric converting means include TFTs R1 to R9, a shift register 1,109, and a power supply 114 and refresh means include the capacitors C1 to C9, a shift register 1,108, and a power supply 114. Further, a signal detecting section include detecting means enclosed by a dashed line in FIG. 47, the TFTs T1 to T9, a shift register 1,106, and the capacitors C1 to C9. In other words, the capacitors C1 to C9 accumulate signal charges and also constitute a part of the refresh means.

Next, the operation of this embodiment is described in time series below.

First, if signal light is incident on the photoelectric converting elements S1 to S9, electric charges are stored in storage/refresh capacitors C1 to C9, equivalent capacitive components of the photoelectric converting section 100, and their stray capacitance depending on its intensity. At this point, as mentioned for the 18th embodiment, electrons and holes in each i-layer of the storage/refresh capacitors C1 to C9 do not flow out to the electrode G since the electrode G in the insulating layer side is a charge storage electrode, therefore, apparent leak current does not occur in the storage/refresh capacitors C1 to C9. Then, when a high level is output from a parallel terminal of the shift register 1,106 and the transfer-TFTs T1 to T3 are turned on, the charges stored in the storage/refresh capacitors C1 to C3, the capacitive components, and the stray capacitance are transferred to the common capacitors C100 to C120. Subsequently, a high level output from a shift register 1,107 is shifted and switching transistors T100 to T120 are sequentially turned on. This starts sequential readout of light signals of the first block transferred to the common capacitors C100 to C120 via the amplifier 1,126.

After the transfer-TFTs T1 to T3 are turned off, a high level is output from a first parallel terminal of the shift register 1,108 and it increases potential across the storage/refresh capacitors C1 to C3 or potential of the electrode G for the photoelectric converting elements S1 to S3. Then, holes in the photoelectric converting elements S1 to S3 are swept out to a common power supply line 1,403.

Next, turning on the reset-TFTs R1 to R3 for which a high level is output from a first parallel terminal of a shift register 1,109 initializes potential of the electrode G for the photoelectric converting elements S1 to S3 to GND. Then, a Pa pulse triggers initialization of potential of the common capacitors C100 to C120. When the potential of the common capacitors C100 to C120 is completely initialized, the shift register 1,106 shifts data and a high level is output from a second parallel terminal. This turns on the transfer-TFTs T4 to T6, and it starts a transfer of signal charges stored in the storage/refresh capacitors C4 to C6, the equivalent capacitive components of the photoelectric converting elements S4 to S6, and the stray capacitance in the second block to the common capacitors C100 to C120. Then, in the same manner as for the first block, the switching transistors T100 to T120 are sequentially turned on by a shift of the shift register 1,107, and it starts sequential readout of light signals of the second block stored in the common capacitors C100 to C120.

Also for the third block, the charge transfer operation and the light signal read operation are performed in the same manner.

Like this, signals for a line is completed to be read in a horizontal scanning direction on the original copy through a series of the operations from the first block to the third block, and then the read signals are output in an analog mode according to a reflectance degree of the original copy.

In this embodiment, the photoelectric converting elements, the storage/refresh capacitors, the transfer-TFTs, the reset-TFTs, and the matrix signal line section have an identical layer structure consisting of five layers including the first electrode layer, the insulating layer, the i-layer, the n-layer and the second electrode layer, but all the elements do not need to have the same layer structure necessarily. It is only required that at least the photoelectric converting elements and the storage/refresh capacitors have this (MIS) structure and that other elements each have a layer structure which allows it to serve as each element. If they have the identical layer structure, however, it is more effective to improve an yielding ratio and to lower the cost.

Although a one-dimensional line sensor is explained in this embodiment, it should be understood that a two-dimensional area sensor can be achieved by arranging a plurality of line sensors and that the above configuration permits a photoelectric converter for reading the same size of copies as for an information source such as an X-ray camera by using a block driving method described in the above embodiment, in the same manner as for the 19th embodiment.

In this embodiment, it is possible that the storage capacitors have a refresh function in addition to the effects of the 18 and 19 embodiments as mentioned above, therefore, due to miniaturization and a high yielding ratio, a lower cost photoelectric converter can be achieved.

[21th embodiment]

Figure 50:
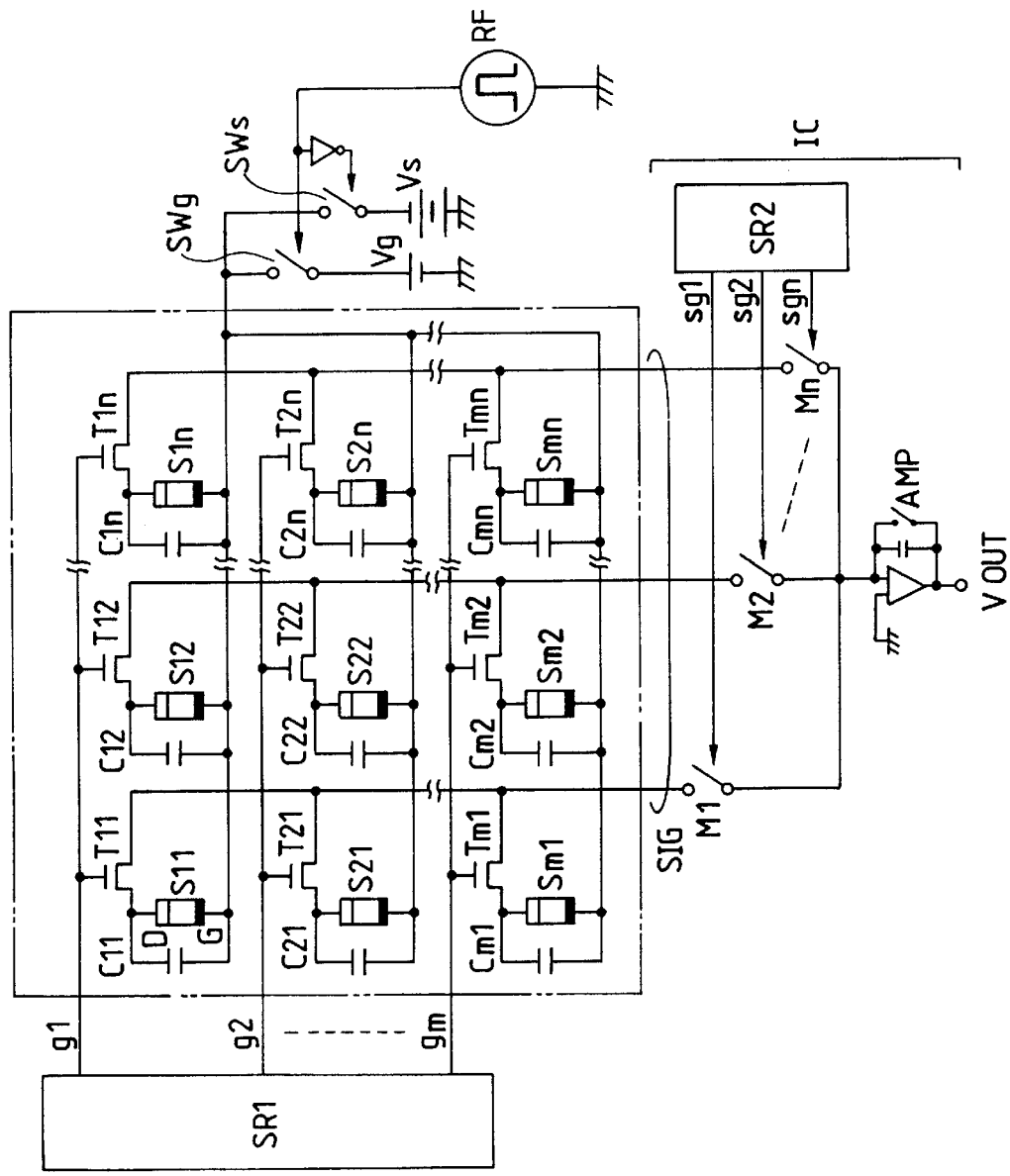

FIG. 50 is a schematic circuit diagram of a photoelectric converter according to this embodiment of the present invention.

In FIG. 50, there are included photoelectric converting elements S11 to Smn arranged in a matrix shape, and numeral G indicates electrodes at the lower sides of the photoelectric converting elements S11 to Smn and numeral D indicates electrodes at the upper side thereof. Also, numerals C11 to Cmn indicate storage capacitors and numerals T11 to Tnm indicate transfer-TFTs. A read power supply Vs and a refresh power supply Vg are connected with the electrodes G of all photoelectric converting elements S11 to Smn through a switch Sws and a switch Swg, respectively. The switch Sws is connected to a refresh control circuit RF through an invertor and the switch Swg is directly connected to the refresh control circuit RF. Both switches Sws and Swg are controlled so that the Swg is turned on during a refresh time and the Sws is turned on at the other time. One pixel is constituted of one photoelectric converting element, a capacitor to which the photoelectric converting element is connected in parallel and a TFT. The signal output of the pixel is connected to an integrated circuit IC for detection by a signal line SIG. The photoelectric converter of this embodiment includes pixels of m x n numbers which are divided into m blocks so that the signal outputs of n pixels are transferred simultaneously every block to the integrated circuit IC for detection through the signal line SIG. The transferred signal outputs are converted by the integrated circuit IC for detection in due order and output (Vout). The respective pixels are constituted two-dimentionally by arranging n pixels in a lateral direction every block and m blocks in a longitudinal direction in order.

In addition, the photoelectric converter shown in FIG. 50 operates in the same manner as that shown in FIG. 19 but different in polarity of Vg and magnitude of Vs.

Next, the photoelectric converter according to this embodiment will be described.

Sift registers SR1 and SR2 first applies a Hi (High voltage) to control lines g1 to gm and sg1 to sgn. Thus, the transfer-TFTs T11 to Tmn and switches M1 to M3 are turned on to be in a conductive state, and then, the electrodes D of all photoelectric converting elements S11 to Smn become GND potential (because an input terminal of an integral detector Amp. is designed to be GND potential). At the same time, the refresh control circuit RF outputs the Hi to turn on the switch Swg so that the electrodes G of all the photoelectric converting elements S11 to Smn are turned by the refresh power supply Vg to negative potential whose magnitude of the absolute value is small. As a result, all the photoelectric converting elements S11 to Smn are turned to a refresh mode to be refreshed. The refresh control circuit RF next outputs a Lo (Low voltage signal) to turn on the switch SWs so that the electrodes G of all the photoelectric converting elements S11 to Smn are turned by the read power supply Vs to negative potential whose magnitude of the absolute value is large. As a result, all the photoelectric converting elements S11 to Smn are turned to a photoelectric conversion mode to initialize the capacitors C11 to Cmn simultaneously.

As described above, in the refresh mode of this embodiment, the potential of the electrodes G is set to the negative potential in comparison with the potential of the electrodes D and the potential of the electrodes G does not reach a flat-band voltage $V_{FB}$. Accordingly, as described in the foregoing embodiments, electrons can not reach the interface between the insulating layer and the photoelectric converting semiconductor layer and this makes it possible to inhibit the electrons from coming in and out of the interface defects. For this reason, inrush currents can be reduced and a photoelectric converter of high signal-to-noise ratio can be realized.

In this embodiment, while each electrode D of the photoelectric converting elements is connected to the TFT and each electrode G of the photoelectric converting elements is connected commonly, the electrode G may be connected to the TFT and the electrode D may be connected commonly. In this case, the same operations can be performed by reversing the polarities of Vg and Vs.

Also in this embodiment, while the number of pixels has been defined as m×n, in actuality, it can be selected properly in accordance with system structure. For example, when pixels are arranged on one substrate of 20 cm×20 cm size, assuming that n is 2,000 and m is 2,000, the pixels of m×n numbers, i.e., the photoelectric converting elements of 4,000,000 numbers are arranged with a density of 100 μm pitches on the substrate.

In FIG. 50, while the sift register SR1 and the integrated circuit IC for detection are respectively represented by only one component, in actuality, they can be constituted in proper numbers in accordance with numbers of m and n.

Figure 51:
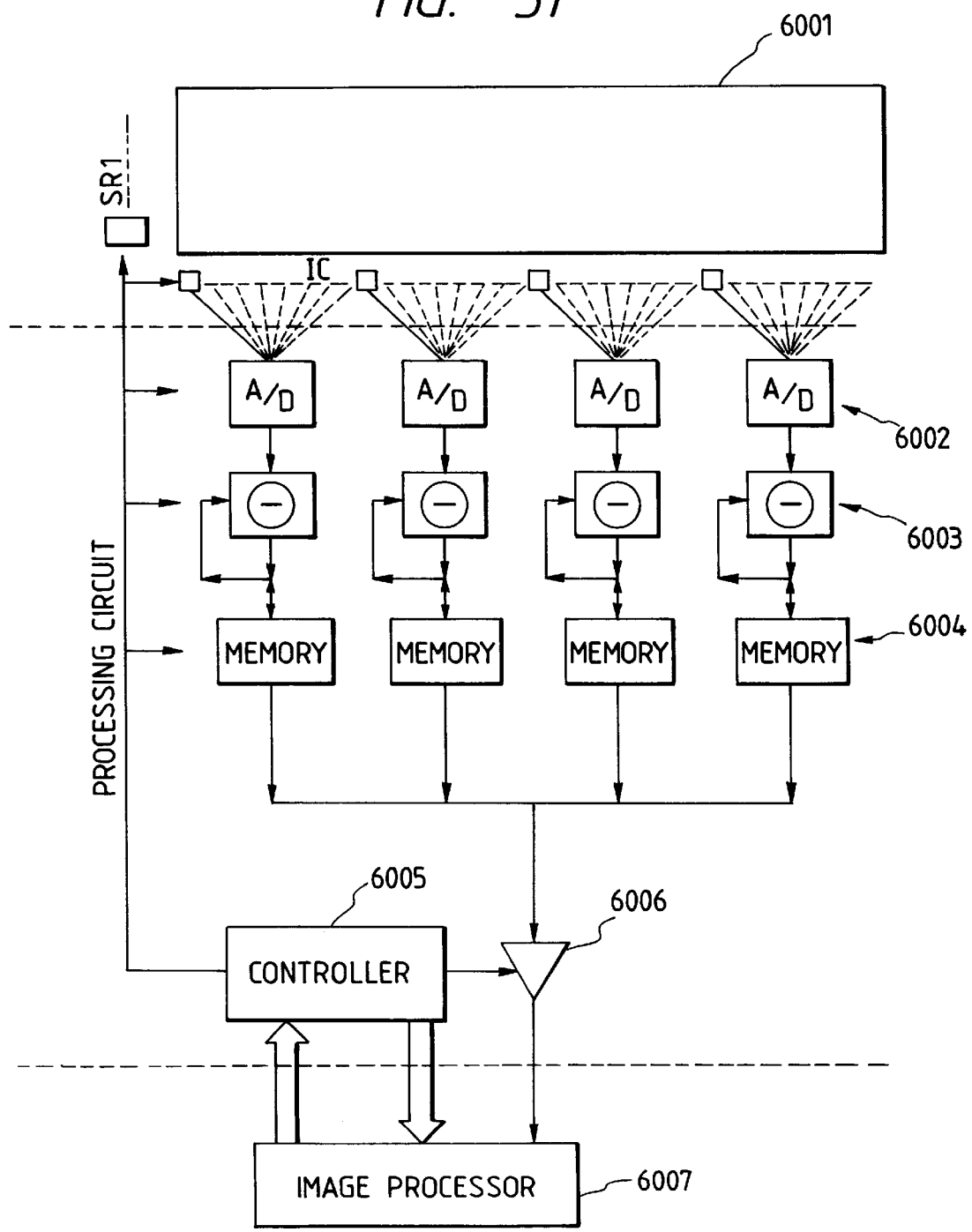
FIGS. 51 and 53 are system configuration diagrams for describing examples of a system including the photoelectric converter of the present invention.

FIG. 51 is a schematic block diagram illustrating the whole system. In this drawing, a plurality of shift registers SR1 are arranged in parallel and the integrated circuit IC for detection is constituted in plural numbers and driven. The output from each integrated circuit IC for detection is input to a corresponding A/D converter 6002 in a processing circuit 6008 to be digitalized. The output from the A/D converter 6002 is memorized in a corresponding memory 6004 through a subtracter 6003. The information stored in the memory is controlled by a controller 6005 and then transferred to an image processor 6007 as a signal processing means through a buffer 6006 so that an image-processing of the information is performed therein.

Figure 52A:
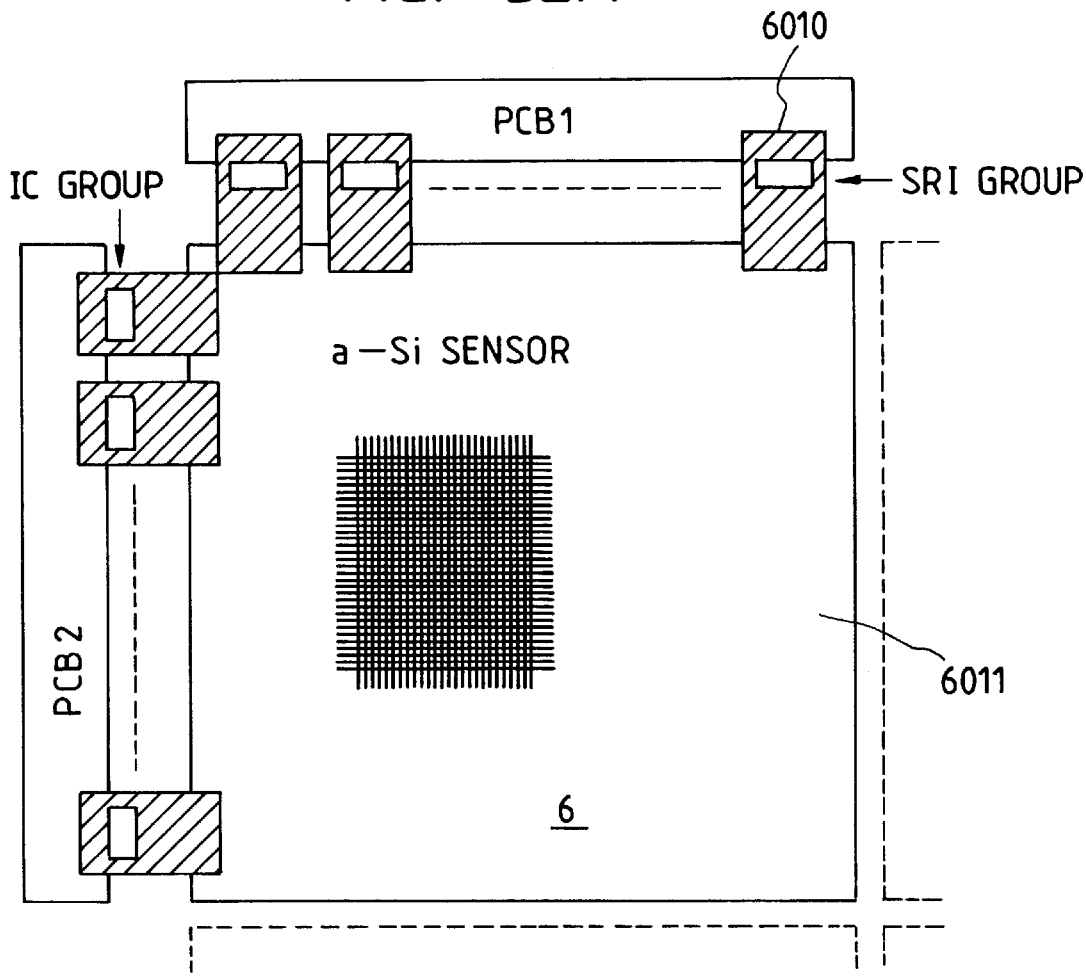
FIG. 52A is a typical configuration diagram for describing an example when the invention is applied to an X-ray detecting device.
Figure 52B:
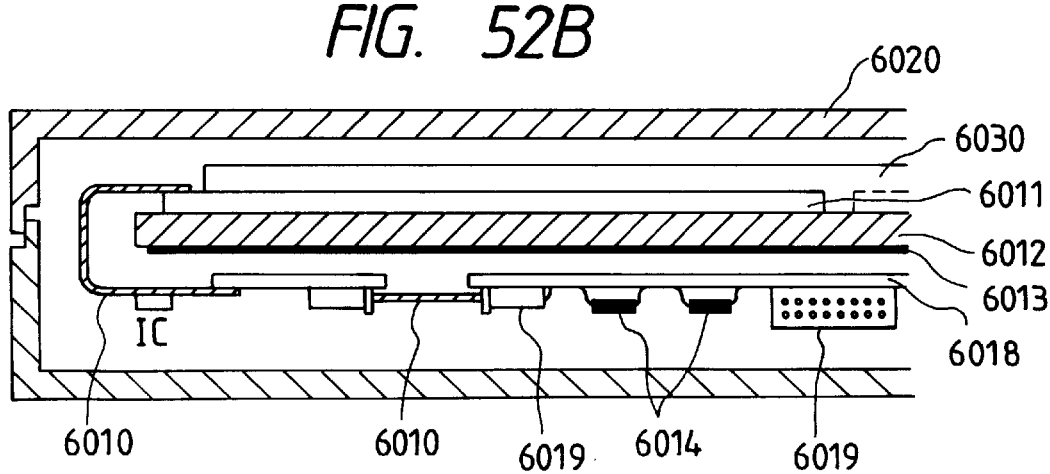
FIG. 52B is its typical sectional view.

FIGS. 52A and 52B show an X-ray detecting photoelectric converter which adapts the present invention; FIG. 52A is a schematically structural diagram and FIG. 52B is a schematically sectional view.

The photoelectric converting element and the TFT are constituted in plural numbers inside an a-Si sensor substrate 6011 and connected with flexible circuit substrates 6010 on which shift registers SR1 and integrated circuits IC for detection are mounted. The opposite side of the flexible circuit substrates 6010 are connected with a PCB1 or a PCB2. A plurality of the a-Si sensor substrates 6011 are adhered onto a base 6012 so as to constitute a large-sized photoelectric converter. A lead plate 6013 is mounted under the base 6012 so as to protect memories 6014 in a processing circuit 6018 from X rays. A phosphor 6030 such as CsI or the like is coated on or adhered to the a-Si sensor substrate 6011. On the basis of the same principle as the X-ray detecting method described above in FIGS. 19 and 20, the X rays can be detected. In this embodiment, as shown in FIG. 52B, the whole is packed in a case 6020 made of carbon fiber.

Figure 53:
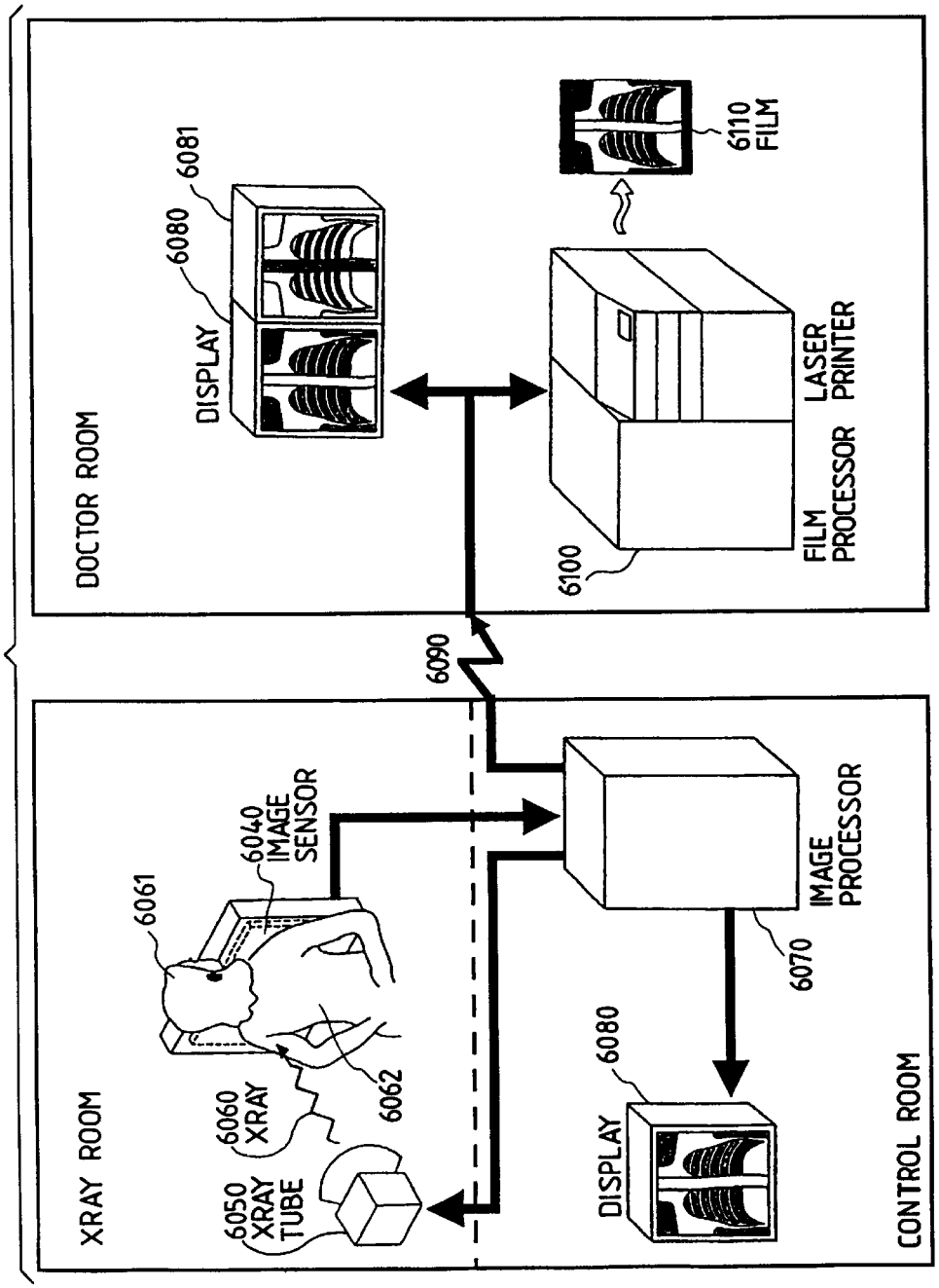

FIG. 53 shows an applied example in which the photoelectric converter of the present invention is applied to an X-ray diagnosis system.

X rays 6060 emitted from an X-ray tube 6050 are transmitted through the chest 6062 of a patient or an examinee 6061 to be incident to a photoelectric converter 6040 on which a phosphor has been mounted. The incident X rays includes the internal information of the patient. Here, the phosphor emits light in response to the incident X rays and the emitted light is photoelectrically converted to obtain the electric information. The electric information is then converted to be digitalized and an image on the electric information is processed by an image processor 6070 to be able to observe on a display 6080 in a control room. This information can be transferred to a remote place, such as a doctor room located in other place or the like, by way of a transmission means such as a telephone line 6090 and displayed on a display 6081 or stored in a storage means such as an optical disk, and this makes it possible to be diagnosed by a doctor in a remote place. Also, this information can be recorded on a film 6110 by a film processor 6100.

[Effect]

As described above, the present invention can provide a photoelectric converter having a high signal-to-noise ratio and stable characteristics and a system having the above photoelectric converter.

Also, the present invention can provide a photoelectric converter having a high yield and high productivity.

In addition, the present invention can provide a photoelectric converter which can be composed in the same process as for the TFT, will not complicate fabrication processes, and can be fabricated at a low cost, its driving method and a system including the above photoelectric converter.

According to the present invention, the photoelectric converting section (photoelectric element) in the photoelectric converter can detect the incident amount of light only in one place of the injection blocking layer, so that the processes can be easily optimized, the yield can be improved and the manufacturing cost can be also reduced. Accordingly, a photoelectric converter of a high signal-to-noise ratio and low cost can be provided. Also, according to the present invention, any tunnel effect or Schottky barrier is not used in the interfaces between the first electrode layer, the insulating layer and the photoelectric converting semiconductor layer, so that the electrode material can be selected freely as well as the thickness of the insulating layer or other control. Furthermore, the photoelectric element matches well with the switching and capacitive elements such as thin-film field effect transistors (TFT), both being formed at the same time as the photoelectric element, and can be formed simultaneously as the common films with the TFTs due to the same film structure. The film structure important to the photoelectric element and the TFTs can be also formed in an identical vacuum at the same time. Accordingly, an excellent photoelectric converter of a further high signal-to-noise ratio and low cost can be provided.

The present invention can also provide a photoelectric converter having complex functions with a simplified structure since the photoelectric element itself has a property to store optical information as carriers, with simultaneously flowing the current at a real-time. Further, the capacitor of the above photoelectric converter includes an insulating layer in its middle layer and can be formed with a preferable properties, and this makes it possible to provide a photoelectric converter of high functions so that the integral values of the optical information obtained in the photoelectric element can be output with a simplified structure.

Furthermore, according to the present invention, the refresh operation of the photoelectric element can be performed through the capacity of the capacitor or the like and this makes it possible to generate an inrush current at the instant the applied voltage was dropped down. In comparison with the case the refresh operation is performed by using the TFT, this reduces the stored inrush currents extremely, therefore, an excellent photoelectric converter of a further high signal-to-noise ratio and low cost can be provided.

Furthermore, in the refresh operation of the photoelectric element, for example, if the semiconductor injection blocking layer of the photoelectric element has an n-type structure, i.e., if an electric charge q of carriers inhibited from their injections is positive, electrons can be inhibited from coming in and out of the interface defects generated between the insulating layer and the photoelectric converting semiconductor layer by a condition represented by $\{(V_{rg} \cdot q) < (V_D \cdot q - V_{FB} \cdot q)\}$, where the potential of the electrode D is set higher than the potential of the electrode G. On the contrary, if the semiconductor injection blocking layer of the photoelectric element has a p-type structure, i.e., if the electric charge q of carriers inhibited from their injections is negative, electrons can be inhibited from coming in and out of the interface defects generated between the insulating layer and the photoelectric converting semiconductor layer by the condition represented by $\{(V_{rg} \cdot q) < (V_D \cdot q - V_{FB} \cdot q)\}$, where the potential of the electrode D is set lower than the potential of the electrode G. Accordingly, an excellent photoelectric converter of a further high signal-to-noise ratio and low cost which can reduce the inrush currents can be provided.

Furthermore, a capacitive element for signal-charge storage is formed by the identical laminating structure with the photoelectric element and the electric charge is stored at the electrode of insulating side of the capacitive element, so that the capacitive element for signal-charge storage can be used in the accumulation state at any time and the apparent leak currents generated by leaking the signal charge through the capacitive element for signal-charge storage can be reduced, thereby providing a photoelectric converter of a high signal-to-noise ratio and low cost.

Furthermore, according to the present invention, a plurality of photoelectric elements are divided into blocks so that the refresh operation in a block and the signal transfer operation in other block can be driven by an identical driving line at the same time. As a result, the read operation can be performed at a high speed and the converter can be decreased in size. Accordingly, a photoelectric converter of a high yield and low cost can be provided.

By utilizing the above photoelectric converter of excellent properties, a facsimile machine or a roentgen (X-ray) scope of a low cost, wide area, high functions and high characteristics can be also provided. The present invention, however, is not limited to the structures and the embodiments described above, it will be understood that any modification and combination can be realized properly within the scope of the present invention.

What is claimed is:

1. A system having a photoelectric converter comprising:
a plurality of photoelectric converting elements formed on a substrate, each of the photoelectric converting elements including a first electrode layer and a second electrode layer, an insulating layer formed between the first and second electrode layers for inhibiting a first type of carriers from passing through the layer, a semiconductor layer, and an injection blocking layer for inhibiting said first type of carriers from being injected into the semiconductor layer;
a switch section for applying an electric field to each layer of said photoelectric converting section in a direction so that said first type of carriers are introduced from said semiconductor layer to said second electrode layer in a refresh mode or in a direction so that said first type of carriers generated by light incident on said semiconductor layer remain in said semiconductor layer and said second type of carriers are introduced to said second electrode layer in a photoelectric conversion mode; and
a signal processing means for processing signals output from the photoelectric converting sections.

2. A system according to claim 1, further comprising a record means for recording signals output from said signal processing means.

3. A system according to claim 1, further comprising a display means for displaying signals output from said signal processing means.

4. A system according to claim 1, further comprising a transmission means for transmitting signals output from said signal processing means.

5. A system according to claim 1, wherein said photoelectric converter has a phosphor.

6. A system according to claim 1, further comprising a light source for emitting light to generate optical information input to said photoelectric converter.

7. A system according to claim 6, wherein said light source emits X-rays.

8. A method of driving a photoelectric converting section formed on a substrate, the photoelectric converting section including a first electrode layer; an insulating layer for inhibiting both types of carriers, a first type of carriers and a second type of carriers whose positive or negative characteristics are opposite to those of the first type of carriers, from passing through the layer; a semiconductor layer including the first and second types of carriers; an injection blocking layer for inhibiting the first type of said carriers from being injected into the semiconductor layer; and a second electrode layer arranged adjacent to said injection blocking layer,
the driving method having a refresh and a photoelectric conversion mode, wherein an electric field is applied so that the first type of said carriers are brought from said semiconductor layer into said second electrode layer in the refresh mode, and
while an electric field is applied so that the first type of said carriers generated by light incident in said semiconductor layer remain in said semiconductor layer and the second type of said carriers are introduced into said second electrode in the photoelectric conversion mode, and, under an influence of an electric field having the same direction as in the photoelectric conversion mode, the first and second types of said carriers stored in said semiconductor layer are detected.

9. A method according to claim 7, further comprising a capacitive storing element wherein integral values depending upon said carriers are stored and read out.

10. A method according to claim 7, further comprising a plurality of said photoelectric converting sections wherein the plurality of said photoelectric converting sections are electrically connected in each block and, when one of blocks is in the photoelectric conversion mode, at least one of the other blocks is turned to the refresh mode.

11. A method according to claim 7, wherein an electric field is applied to said photoelectric converting elements in said refresh mode in accordance with a condition represented by $(V_{rG} \cdot q < V_D \cdot q - V_{FB} \cdot q)$, where the product $(V_{rG} \cdot q)$ of a voltage $(V_{rG})$ of said first electrode layer in said photoelectric converting section and an electric charge (q) of said first type of carriers becomes smaller than the product $(V_D \cdot q - V_{FB} \cdot q)$ of a voltage $(V_D - V_{FB})$, the voltage subtracting a threshold voltage $(V_{FB})$ from a voltage $(V_D)$ of said second electrode layer, and the electric charge (q) of said first type of carriers.

12. A method according to claim 8, wherein said capacitive element has two electrode layers, an insulating layer held between the electrode layers and a semiconductor layer to be operated in the accumulation state.

13. A photoelectric converter having a photoelectric converting section provided on a substrate having a surface which is at least insulative, and first and second integrated circuit element groups provided outside of said photoelectric converting section, wherein
said photoelectric converting section has plural combinations of a photoelectric converting element and a thin film transistor arranged correspondingly to said photoelectric converting element, one electrode of said photoelectric converting element is connected to a line capable of being set at a predetermined voltage, the other electrode of said photoelectric converting element is connected to source and drain electrodes of said thin film transistor, a gate electrode of said thin film transistor is connected to said first integrated circuit element group arranged outside of said photoelectric converting section through a driving line provided commonly to said plural combinations of a photoelectric converting element and a thin film transistor and said first and second integrated circuit element groups for supplying to said gate electrode a signal for driving said thin film transistor, and source and drain electrodes different from the above mentioned source and drain electrodes of said thin film transistor are connected to the second integrated circuit element group through an output line common to a group of said plural combinations of a photoelectric converting element and a thin film transistor and arranged in a direction crossing said driving line;
said photoelectric converting element has first and second electrode layers on said substrate, and has, between said first and second electrode layers, an insulating layer for blocking passage of a hole and an electron therethrough, a semiconductor layer, and a carrier blocking layer for blocking passage of one of the hole and the electron; and
said thin film transistor has, on said substrate, a gate electrode, and source and drain electrodes arranged in spaced relation, and has between said gate electrode and said source and drain electrodes, an insulating layer to be a gate insulating film, a semiconductor layer and an ohmic contact layer, said ohmic contact layer is arranged correspondingly to said source and drain electrodes, and said ohmic contact layer and said source and drain electrodes are provided at one side surface of said semiconductor layer.

14. A photoelectric converter according to claim 13, wherein said first electrode layer of said photoelectric converting element, said gate electrode of said thin film transistor, said second electrode layer of said photoelectric converting element, said source and drain electrodes of said thin film transistor, said insulating layer on said photoelectric converting element, said gate insulating film of said thin film transistor, said semiconductor layer of said photoelectric converting element, said semiconductor layer of said thin film transistor, said carrier blocking layer of said photoelectric converting element, and said ohmic contact layer of said thin film transistor are respectively, produced from the same material, and have respectively the same thickness.

15. A photoelectric converter according claim 13, wherein said first and second integrated circuit element groups are respectively arranged at a periphery of said photoelectric converting section.

16. A photoelectric converter according to claim 13, wherein said photoelectric converting section is quadrilateral, and said first and second integrated circuit element groups are arranged separately along sides of the quadrilateral.

17. A photoelectric converter having a photoelectric converting section provided on a substrate having a surface which is at least insulative, wherein said photoelectric converting section has in matrix arrangement plural combinations of a photoelectric converting element and a thin film transistor arranged correspondingly to said photoelectric converting element, one electrode of said photoelectric converting element is connected to a line capable of being set at a predetermined voltage, the other electrode of said photoelectric converting element is connected to source and drain electrodes of said thin film transistor, source and drain electrodes different from the above-mentioned source and drain electrodes of said thin film transistor are connected to an output line common to a group of said plural combinations of a photoelectric converting element and a thin film transistor for outputting a signal derived by a photoelectric conversion of said photoelectric conversion elements of the group, and a gate electrode of said thin film transistor is connected to a driving line common to a group of said plural combinations of a photoelectric converting element and a thin film transistor for supplying said gate electrode with a signal for driving said thin film transistors of this group in a direction crossing the output line for outputting the signal, and said photoelectric converter further comprises a passivation film provided on a group of said photoelectric conversion elements and thin film transistors, and a fluorescent body provided on said passivation film.

18. A photoelectric converter according to claim 17, wherein said photoelectric converting element has first and second electrode layers on said substrate, an insulating layer between said first and second electrode layers for inhibiting a passage of a hole and an electron therethrough, a semiconductor layer, and a blocking layer for blocking a passage therethrough of one of the hole and the electron, in this order.

19. A photoelectric converter according to claim 18, wherein said thin film transistor has, on said substrate, a gate electrode, separately arranged source and drain electrodes, an insulating layer to be a gate insulating film between said gate electrode and said source and drain electrodes, a semiconductor layer and an ohmic contact layer, wherein said ohmic contact layer is provided correspondingly to the source and drain electrodes, and said ohmic contact layer and said source and drain electrodes are provided at one side surface of said semiconductor layer.

20. A method for driving a photoelectric converting section which comprises a first electrode layer; an insulating layer for preventing carriers of both of two types from passing through said insulating layer, the two types of carriers being a first type of carrier and a second type of carrier whose positive or negative polarity is opposite that of the first type of carrier; a semiconductor layer; an injection blocking layer for preventing said first type of carrier from being injected into said semiconductor layer; and a second electrode layer disposed in contact with said injection blocking layer, said method comprising:

a refreshment mode for applying an electric field for guiding said first type of carrier from said semiconductor layer toward said second electrode layer; and a photoelectric converting mode for applying an electric field for leaving said first type of carrier generated by incident light in said semiconductor layer and for introducing said second type of carrier from said semiconductor layer into said second electrode layer, wherein, according to the electric field in the direction in said photoelectric converting mode, a charge corresponding to a carrier stored in said semiconductor layer in the photoelectric converting mode is detected.

21. A method according to claim 20, further comprising a storage capacitor element, and wherein a process for storing the carrier in said storage capacitor element for reading is provided.

22. A method according to claim 20, wherein a plurality of photoelectric converting sections are provided, and are connected within a respective block that includes a respective group of the photoelectric converting sections, and, when a selected block is in the photoelectric converting mode, at least one other block is in the refreshment mode.

23. A method according to claim 20, wherein the electric field applied in the refreshment mode is set to meet a condition that a product (VrG×q) of a vlltage (VrG) of the first electrode layer of said photoelectric converting section and a charge (q) of the first type of carrier is not greater than a product ((VD-VFB)×q) of a voltage (VD-VFB) obtained by subtracting a threshold voltage (VFB) from a voltage (VD) of said second electrode layer and the charge (q) of the first type of carrier.

24. A method according to claim 21, wherein said storage capacitor element comprises two electrode layers and an insulating layer sandwiched between said electrode layers.

25. A method according to claim 21, wherein the charge corresponding to the stored carrier has a quantity of a charge flowing at the application of the electric field in the same direction as in the refreshment mode.

26. A method according to claim 21, wherein a charge quantity corresponding to the stored carrier is a charge quantity flowing in the photoelectric converting mode.

27. A method according to claim 21, further comprising a step of subtracting from the charge corresponding to the stored carrier a charge corresponding to the stored carrier in a case of non-incident light at the photoelectric converting mode.

28. A photoelectric converter according to claim 13, further comprising a fluorescent substance on said photoelectric converting element.

29. A photoelectric converter according to claim 13, wherein said photoelectric converting element and said thin film transistor have thereon a passivation film, on which a fluorescent substance is provided.

* * * * *

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

ON THE TITLE PAGE [30]:

Foreign Application Priority Data, "Dec. 16, 1993"
should read --Dec. 16, 1994--.

ON THE TITLE PAGE [56] References Cited:

U.S. PATENT DOCUMENTS, "4,575,638 3/1986 Okmura" should
read --4,575,638 3/1986 Okumura-- and insert
-- 5,184,018 2/1993 Conrades et al. 250/370.09--.

ON THE TITLE PAGE [*]:

CPA, insert:

--[*] Notice: This patent issued on a continued prosecution application
filed under 37 CFR 1.53(d). and is subject to twenty year
patent term provisions of 35 U.S.C. 154 (a) (2).--

COLUMN 1:
Line 6, "continuation-in-part" should read --continuation--;
Line 23, "a development" should read --development--;
Line 27, "so-called a" should be deleted and "con act-type" should read
--contact type --; and
Line 34, ""TfT"), therefore," should read -- "TfT"). Therefore--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 2:
Line 3, "C, in" should read --C; in--;
Line 14, "'"layer," should read --layer;-- and "an d" should read --read--;
Line 33, "called a" should read --called--;
Line 34, "noise, therefore," should read --noise; therefore,--;
Line 55, "used," should read --used;--; and
Line 67, "used," should read --used;--.

COLUMN 3:
Line 31, "inhibit" should read --prevent--; and
Line 55, "leads" should read --lead--.

COLUMN 6:
Line 15, "Åor" should read --Å or--;
Line 16, "passing" should read --pass--;
Line 46, "G, therefore," should read --G; therefore,--;
Line 51, "a extremely" should read --an extremely--;
Line 56, "G, therefore," should read --G; therefore,--;
Line 65, "moves" should read --move--; and
Line 67, "4, therefore," should read --4; therefore,--.

COLUMN 7:
Line 58, "above mentioned" should read --abovementioned--.

COLUMN 8:
Line 36, "4, Also" should read --4. Also--; and
Line 49, "detect" should read --detected--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 9:
Line 10, "element," should read --element;--;
Line 37, "embodiment," should read --embodiment;--; and
Line 45, "114, in" should read --144; in--.

COLUMN 10:
Line 38, "Multipolar," should read --multipolar;--.

COLUMN 11:
Line 12, "player." should read --p-layer.--; and
Line 6, "TfT," should read --TfT;--.

COLUMN 12:
Line 37, "structure," should read --structure;--; and
Line 39, "a excellent" should read --excellent--.

COLUMN 13:
Line 2, "identical," should read --identical;--;
Line 9, "fig. 11B" (2d occurrence) should read --fig. 10B--;
Line 47, "electrode G," should read --electrode G;--;
Line 53, "time enough," should read --enough time--;
Line 57, "electrode G," should read --electrode G;--; and
Line 67, "moves" should read --move--.

COLUMN 14:
Line 1, "i-layer 4," should read --i-layer 4;--.

COLUMN 16:
Line 31, "direction," should read --direction;--; and
Line 63, "mode," should read --mode;--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 17:
Line 22, "Co" should read --$C_o$--.

COLUMN 18:
Line 2, "for a" should read --for--;
Line 5, "elements each" should read --elements from each --;
Line 19, "vacuum," should read --vacuum;-- and
Line 54, "direction," should read --direction;--.

COLUMN 19:
Line 17, "mode," should read --mode;-- and
Line 43, "capacitance Cs" should read --capacitance $C_s$--.

COLUMN 20:
Line 30, "for a" should read --for--;
Line 33, "elements each" should read --elements from each --;and
Line 52, "much" should be deleted.

COLUMN 22:
Line 14, "line is" should read --line is --;
Line 17, "for a" should read --for--;
Line 20, "elements each" should read --elements from each--;
Line 27, "50 μof a" should read --50 μ of a--;
Line 28, "adhesive" should read --adhesively--; and
Line 41, "much" should be deleted.

COLUMN 23:
Line 23, "g5, therefore," should read --g5; therefore,--; and
Line 46, "this, for" should read --this; for--.

COLUMN 24:
Line 6, "an yielding" should read --a yielding--.

UNITED STATES PATENT AND TRADEMARK OFFICE
CERTIFICATE OF CORRECTION

PATENT NO.   : 6,075,256
DATED        : June 13, 2000
INVENTOR(S)  : Noriyuki Kaifu It is certified that error appears in the above-identified patent and that said Letters Patent is hereby corrected as shown below:

COLUMN 25:
Line 48, "SWs, therefore," should read --SWs; therefore,--.

COLUMN 26:
Line 14, """ in an" should read --in a--;
Line 36, "each," should read --each;--;
Line 38, "an yielding" should read --a yielding--;
Line 41, "( R)," should read -- ( R) ;--;
Line 48, "shown;" should read --shown :--; and
Line 60, "can be used" should be deleted.

COLUMN 27:
Line 6, "and" should be deleted;
Line 7, "films," should read --films;--; and
Line 54, "tens ps" should read --tens ns--.

COLUMN 28:
Line 18, "by us," should read --by Ns,--;
Line 30, "referring" should read --referring to --;
Line 33, "is.an" should read depict"; and
Line 36, "has" should read --is--.

COLUMN 29:
Line 14, "a some" should read --an--;
Line 17, "a some" should read --an--;
Line 20, "an enough long" should read --a long enough--;
Line 27, "a" should be deleted;
Line 28, "some" should read --an--; and
Line 29, "a cause" should read --are a cause--.

COLUMN 30:
Line 1, "VD of a" should read --$V_D$ of a--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 31:
Line 2, "G," should read --G;--; and
Line 12, "G," should read --G;--.

COLUMN 32:
Line 55, "fist" should read --first--.

COLUMN 33:
Line 9, "is completed" should read --are completed--; and
Line 37, "time," should read --time;--.

COLUMN 34:
Line 17, "falls," should read --falls;--; and
Line 40, "operation," should read --operation;--.

COLUMN 37:
Line 36, "is complete" should read --are completed--.

COLUMN 38:
Line 8, "time," should read --time;--;
Line 36, "layer, for" should read --layer. For--; and
Line 66, "falls," should read --falls;--.

COLUMN 39:
Line 22, "100, in" should read --100; in--.

COLUMN 40:
Line 16, "embodiment," should read --embodiment;--;
Line 33, "little" should read --few--; and
Line 35, " "70," should read --70;--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 42:
Line 37, "time," should read --time;-- and
Line 65, "layer, for" should read --layer; for--.

COLUMN 43:
Line 38, "are" should read --are coupled--; and
Line 40, "are" should read --are coupled--.

COLUMN 45:
Line 1, "line is" should read --line are--;
Line 23, "an" should read --a--;
Line 44, "time," should read --time;--; and
Line 65, "4A," should read --4A;--.

COLUMN 46:
Line 34, "114," should read --114;--; and
Line 57, "operation," should read --operation;--.

COLUMN 47:
Line 37, "D, therefore," should read --D; therefore,--.

COLUMN 48:
Line 4, "capacitor," should read --capacitor;--; and
Line 64, "charges. An" should read --charges. ¶ An--.

COLUMN 49:
Line 3, "are" should read --are coupled--;
Line 5, "are" should read --electrode;--; and
Line 34, "electrode," should read --electrode;--.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 50:
Line 4, "C120. Also" should read --C120. ¶ Also--;
Line 7, "line is" should read --line are;
Line 24, "an" should read --a--; and
Line 47, "embodiment," should read --embodiment;--.

COLUMN 51:
Line 45, "are" should read --are coupled--;
Line 47, "are" should read --are coupled--; and
Line 63, "include" should read --includes--.

COLUMN 52:
Line 11, "electrode," should read --electrode;--; and
Line 53, "line is" should read --line are--.

COLUMN 53:
Line 3, "an" should read --a--;
Line 15, "18 and 19" should read --18th and 19th-- and "above,"
should read --above;--;
Line 18, "[21th" should read --[21st--; and
Line 56, "Sift" should read --Shift--and "applies" should read --apply--.

COLUMN 54:
Line 16, "can not" should read --cannot--; and
Line 38, "sift" should read --shift--.

COLUMN 55:
Line 15, "includes" should read --include--; and
Line 23, "other" should read --another--.

COLUMN 56:
Line 2, "with" should read --while--;
Line 5, "with a" should read --with--;
Line 16, "extremely," should read --extremely;--;

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 56:
Line 54, "other" should read --another--;
Line 63, "provided. The" should read --provided. ¶ The--; and
Line 65, "above, it" should read --above. It--.

COLUMN 57:
Line 12, "section" should read --elements--;
Line 22, "sections," should read --elements.--;
Line 38, "section" should read --element--;
Line 39, "section" should read --element--;
Line 63, "the first and second types" should read --the first type--; and
Line 65, "claim 7," should read --claim 8,--.

COLUMN 58:
Line 1, "claim 7," should read --claim 8,--;
Line 4, "of blocks" should read --of the blocks--;
Line 6, "claim 7," should read --claim 8,--;
Line 17, "claim 8," should read --claim 9,--;
Line 33, "to source" should read --to one of the source--;
Line 43, "source" should read --the other of the source--; and
Line 44, "above mentioned" should read --one of the--.

COLUMN 59:
Line 12, "respectively," should read --respectively--;
Line 15, "according" should read --according to--;
Line 33, "to source" should read --to one of the source--;
Line 34, "transistor, source" should read --transistor, the other of the source--;
Line 35, "different from the above-mentioned source and" should be deleted; and
Line 59, "drain electrodes" should be deleted.

UNITED STATES PATENT AND TRADEMARK OFFICE
CERTIFICATE OF CORRECTION

PATENT NO. : 6,075,256
DATED : June 13, 2000
INVENTOR(S) : Noriyuki Kaifu

It is certified that error appears in the above-identified patent and that said Letters Patent is hereby corrected as shown below:

COLUMN 60:
Line 17, "leaving" should read --remaining--; and
Line 37, "vlltage" should read --voltage--.

Signed and Sealed this

Nineteenth Day of June, 2001

*Attest:*

*Attesting Officer*

NICHOLAS P. GODICI
*Acting Director of the United States Patent and Trademark Office*